(12) United States Patent
Osabe et al.

(10) Patent No.: US 7,045,854 B2
(45) Date of Patent: May 16, 2006

(54) NON-VOLATILE SEMICONDUCTOR MEMORY

(75) Inventors: Taro Osabe, Kokubunji (JP); Tomoyuki Ishii, Kodaira (JP); Takashi Kobayashi, Tokorozawa (JP)

(73) Assignee: Hitachi, Ltd., Tokyo (JP)

( * ) Notice: Subject to any disclaimer, the term of this patent is extended or adjusted under 35 U.S.C. 154(b) by 14 days.

(21) Appl. No.: 10/689,101

(22) Filed: Oct. 21, 2003

(65) Prior Publication Data

US 2004/0084706 A1 May 6, 2004

(30) Foreign Application Priority Data

Oct. 30, 2002 (JP) ............... 2002-315339

(51) Int. Cl.
*H01L 29/788* (2006.01)
(52) U.S. Cl. .............. 257/317; 257/315; 257/316; 257/319
(58) Field of Classification Search ........ 257/315–317, 257/319–320, E27.103
See application file for complete search history.

(56) References Cited

U.S. PATENT DOCUMENTS

| | | | |
|---|---|---|---|
| 5,949,711 A | 9/1999 | Kazerounian | 365/185.05 |
| 6,344,993 B1 | 2/2002 | Harari et al. | 365/185.01 |
| 6,531,731 B1 * | 3/2003 | Jones et al. | 257/314 |
| 6,531,735 B1 * | 3/2003 | Kamigaki et al. | 257/324 |
| 6,710,409 B1 * | 3/2004 | Vyvoda | 257/347 |
| 6,815,759 B1 * | 11/2004 | Horiguchi et al. | 257/316 |
| 2003/0053345 A1 * | 3/2003 | Moriya et al. | 365/200 |
| 2004/0070026 A1 * | 4/2004 | Kamigaki et al. | 257/326 |

FOREIGN PATENT DOCUMENTS

| | | |
|---|---|---|
| JP | 2001-230332 | 8/2001 |
| JP | 2001-237330 | 8/2001 |

OTHER PUBLICATIONS

J. Choi et al., "A 0.15 μm NAND Flash Technology with 0.11 μm² Cell Size for 1 Gbit Flash Memory", IEEE Technical Digest of International Device Meeting, 2000, pp. 767-770.

(Continued)

*Primary Examiner*—Allan R. Wilson
(74) *Attorney, Agent, or Firm*—Miles & Stockbridge P.C.

(57) ABSTRACT

An object of the present invention is to provide a semiconductor memory device suitable for larger-capacity storage because of its ability to store 3 or more bits in one element and capable of a high-speed and high-efficiency write operation due to a reduced leakage current during the write operation and provide a fabrication method therefor. According to the present invention, each of elements has a source region, a drain region, a control gate, two charge storage regions, and one or more assist gates. During a write operation, source side injection writing is performed with respect to a write target element by using the assist gates, while adjacent elements are isolated by field isolation using the assist gates.

9 Claims, 49 Drawing Sheets

OTHER PUBLICATIONS

T. Jung et al., "A 3.3V 128Mb Multi-Level NAND Flash Memory for Mass Storage Applications", IEEE International Solid-State-Circuit Conference, 1996, pp. 32-33.

B. Eitan et al., "Can NROM, a 2 Bit, Trapping Storage NVM Cell, Give a Real Challenge to Floating Gate Cells?", International Conference on Solid State Devices and Materials, Tokyo 1999, pp. 522-523 (extended abstract).

T. Kobayashi et al., "A Giga-Scale Assist-Gate (AG) -AND-Type Flash Memory Cell with 20-MB/s Programming Throughput for Content-Downloading Applications", IEEE Technical Digest of International Electron Device Meeting, 2001, pp. 29-32.

* cited by examiner

2301

2302   2303

2813    2814

3001                    3001

3002  3002

3701

3702  3702

NON-VOLATILE SEMICONDUCTOR MEMORY

FIELD OF THE INVENTION

The present invention relates to a semiconductor non-volatile memory element and to a semiconductor memory device.

BACKGROUND OF THE INVENTION

With the introduction of advanced applications and services and broader-band information networks in recent years, a larger capacity and a higher write speed have been required simultaneously of a flash memory as a semiconductor non-volatile memory element. In particular, the requirement for a larger-capacity flash memory has been growing far faster than the advancement of microfabrication technologies.

To providing a larger capacity, an approach of reducing the physical size of an element and another approach of storing a plurality of bits in one element and thereby reducing a per-bit area have been made from different directions. The former approach of reducing the physical size of the element is made by optimizing the structure of a memory element. As an example of the approach, there can be listed IEEE Technical Digest of International Device Meeting (see Non-Patent Document 1) As a conventional multi-bit technology for storing a plurality of bits of information in one element, a multi-level technology which prepares a plurality of levels to store 2 bits in each of cells has been used primarily. A multi-state technology for storing 2 bits in each of elements by storing electrons in spatially discrete places within one element by using the discrete memory effect of silicon nitride or the like has also been proposed recently. As a conventional example of the former multi-level multi-bit technology, there can be listed IEEE International Solid-State-Circuit Conference (see Non-Patent Document 2). As an example of the latter multi-state multi-bit technology, there can be listed Extended Abstract of the 1999 International Conference on Solid State Devices and Materials (see Non-Patent Document 3). Examples of the technology for positively forming two places in which charges are to be stored are disclosed in Patent Documents 1, 2, and 4.

A description will be given to a higher write speed. For a write operation to a single element, a writing method using the Fowler-Nordheim (F-N) tunneling effect has been used. Although a write operation to an element using the F-N tunnel effect requires a long time, a write speed which is high to a degree is obtainable when measured on a chip level since write operations to a large number of memory elements can be performed simultaneously. In accordance with the F-N tunneling method using a high voltage, however, the area of a peripheral circuit cannot be reduced so that the chip area is increased, i.e., cost is increased, which makes it difficult to provide a large capacity.

As structures which enable a high-speed write operation without the provision of an isolation, a virtual ground array in which a diffusion is shared by adjacent elements and a memory device using a high-efficiency writing method termed source side injection (SSI) have been proposed. The method is disclosed in, e.g., Patent Document 3.

There has also been proposed recently an element structure which achieves both a reduction in element size and a high-speed write operation at the same time (see, e.g., Non-Patent Document 4). The structure uses a field isolation technology for electrically isolating adjacent elements from each other in a MOS structure instead of an isolation region composed of silicon dioxide which occupies a large proportion in element area. By the field isolation technology and the multi-level multi-bit technology, a reduction in the element area has been achieved. By implementing a split gate structure using a gate used for the electric isolation, a high-efficiency write operation in accordance with a method termed source side injection (SSI) is performed and a high-speed write operation is thereby enabled.

[Patent Document 1]
  JP-A No. 230332/2001

[Patent Document 2]
  JP-A No. 237330/2001

[Patent Document 3]
  U.S. Pat. No. 6,344,993

[Patent Document 4]
  U.S. Pat. No. 5,949,711

[Non-Patent Document 1]
  IEEE Technical Digest of International Device Meeting 2000, p. 767

[Non-Patent Document 2]
  IEEE International Solid-State-Circuit Conference 1996, pp.32–33

[Non-Patent Document 3]
  Extended Abstract of the 1999 International Conference on Solid State Devices and Materials, Tokyo 1999, pp.522–523

[Non-Patent Document 4]
  IEEE Technical Digest of International Electron Device Meeting 2001, p.29

As described above, the demand for a larger capacity has been growing far faster than the advancement of microfabrication technologies. To meet the demand, the multi-bit storage technology which stores 2 bits in one element has thus far been introduced. However, a greater demand for a larger capacity has been placed by the market, which requests the storage of 3 or more bits.

Problems encountered by the multi-level multi-bit technology will be described herein below. To impart a uniform write or erase characteristic to each of a plurality of memory elements under the condition under which the width of the distribution of the threshold voltage of the element should be reduced compared with the case of 1-bit storage, it is required to perform a write or erase operation while repeating a verify operation which performs reading after the application of a pulse. In the case of performing write/erase operations to a plurality of elements, therefore, a period of time several to several tens of times longer than an average charge injection (release) time for a single element becomes necessary. Thus far, a technology which prepares four threshold voltage levels and stores 2 bits of information in one element has been used practically. With overheads resulting from the verify operation, however, it is significantly difficult to achieve both the storage of 8 or more levels (3 bits of) information and high-speed write/erase operations at the same time.

Problems encountered by the multi-state multi-bit technology will also be described herein below. The conventional multi-state multi-bit storage accomplishes multi-bit storage by a method termed channel hot electron (CHE) injection, in which charges are injected independently in charge storage regions at the vicinity of the source and drain edge of a memory element. Since the method uses only two types of charge storage regions which are the source-edge region and the drain-edge regions, the maximum amount of information that can be stored is naturally 2 bits. In terms of performing a high-speed write operation, the CHE allows a high-speed operation to a single element. However, since the proportion of currents injected into the charge storage regions relative to currents flowing between the source and drain is low, i.e., a writing efficiency is low, it is necessary to allow large currents to flow between the source and drain. Since the number of elements to which write operations can be performed simultaneously is limited by the limited current driving ability of a peripheral circuit, it is difficult to achieve a high write speed on a chip level.

To enable a high-speed write operation on a chip level, it is necessary to simultaneously perform write operations to a large number of elements. To enable simultaneous write operations to a large number of elements, it is essential to perform high-efficiency write operations and reduce a leakage current flowing during the write operations. Although the use of the SSI writing method enables a high-efficiency write operation, the SSI method normally requires a high voltage of 3 V or more to be applied between the source and drain. Even if an element is scaled down through miniaturization, the voltage is not scaled down. This is because electrons in the channel should be accelerated till they reach a state having an energy higher than a physical amount of an energy barrier (3.2 eV) between a gate oxide film and silicon. The voltage is also applied between the source and drain of an element adjacent to a write target element. To reduce the leakage current flowing during the write operation, it is necessary to reduce a leakage current in the element adjacent to the write target element.

The leakage current can be reduced by using the conventional physical isolation region. However, since the dimensions of the physical isolation region cannot be reduced normally, element miniaturization is difficult. Even when the field isolation is used, if the gate length is reduced as a result of miniaturization, a leakage current is increased disadvantageously by a punch-through effect. As a result, it becomes difficult to perform a high-speed write operation.

SUMMARY OF THE INVENTION

In view of the foregoing, it is therefore an object of the present invention to provide a semiconductor memory device suitable for larger-capacity storage because of its ability to store 3 or more bits in one element and capable of a high-speed and high-efficiency write operation due to a reduced leakage current during the write operation and provide a fabrication method therefor.

The present invention has solved the foregoing problems by providing a semiconductor memory element comprising: a well region having a first conductivity type and formed in a principal surface of a semiconductor substrate; source and drain regions each having a second conductivity type and formed in the well region to have a specified distance therebetween; first and second gates and a charge storage region each formed on a portion of the principal surface of the semiconductor substrate interposed between the source and drain regions via a first insulating film; and a third gate formed over the charge storage region via a second insulating film, the charge storage region being provided between the first and second gates.

Preferably, the charge storage region has a layer composed of a plurality of semiconductor nano-crystals.

Preferably, the charge storage region has a silicon nitride thin film.

Preferably, the charge storage region has a silicon oxynitride thin film.

Preferably, the charge storage region has a floating gate composed of polysilicon.

Preferably, the third insulating film is composed of a silicon dioxide doped with nitrogen.

The present invention has also solved the foregoing problems by providing a semiconductor memory device having a memory cell array composed of an arrangement of a plurality of the semiconductor memory elements described above, the semiconductor memory device comprising: first local bit lines each connecting respective drain regions of the plurality of semiconductor memory elements arranged in the first direction; second local bit lines each connecting respective source regions of the plurality of semiconductor memory elements connected by the corresponding one of the first local bit lines, first assist gate lines each connecting respective first gates of the plurality of semiconductor memory elements each connected by the corresponding one of the first local bit lines; second assist gate lines each connecting respective second gates of the plurality of semiconductor memory elements each connected by the corresponding one of the first local bit lines; and word lines each connecting respective third gates of the plurality of semiconductor memory elements arranged in the direction orthogonal to the first direction, the plurality of semiconductor memory elements connected by one of the first local bit lines being connected individually to the different word lines.

When information is written in one of the semiconductor memory elements, 0 V is preferably applied to each of the first and second assist gates of the first semiconductor memory element adjacent to the one of the semiconductor memory elements on one side thereof and sharing the corresponding one of the word lines with the one of the semiconductor memory elements and 0 V is preferably applied to each of the first and second assist gates of the second semiconductor memory element adjacent to the one of the semiconductor memory elements on the other side thereof and sharing the word line with the one of the semiconductor memory elements.

The first assist gate lines are tied on an every other line basis at one end of the memory array, while the second assist gate lines are tied on an every other line basis at the other end of the memory array.

DETAILED DESCRIPTION OF THE PREFERRED EMBODIMENTS

Semiconductor memory elements and semiconductor memory devices according to the specific embodiments of the present invention will be described herein below.

Embodiment 1

Figure 1:
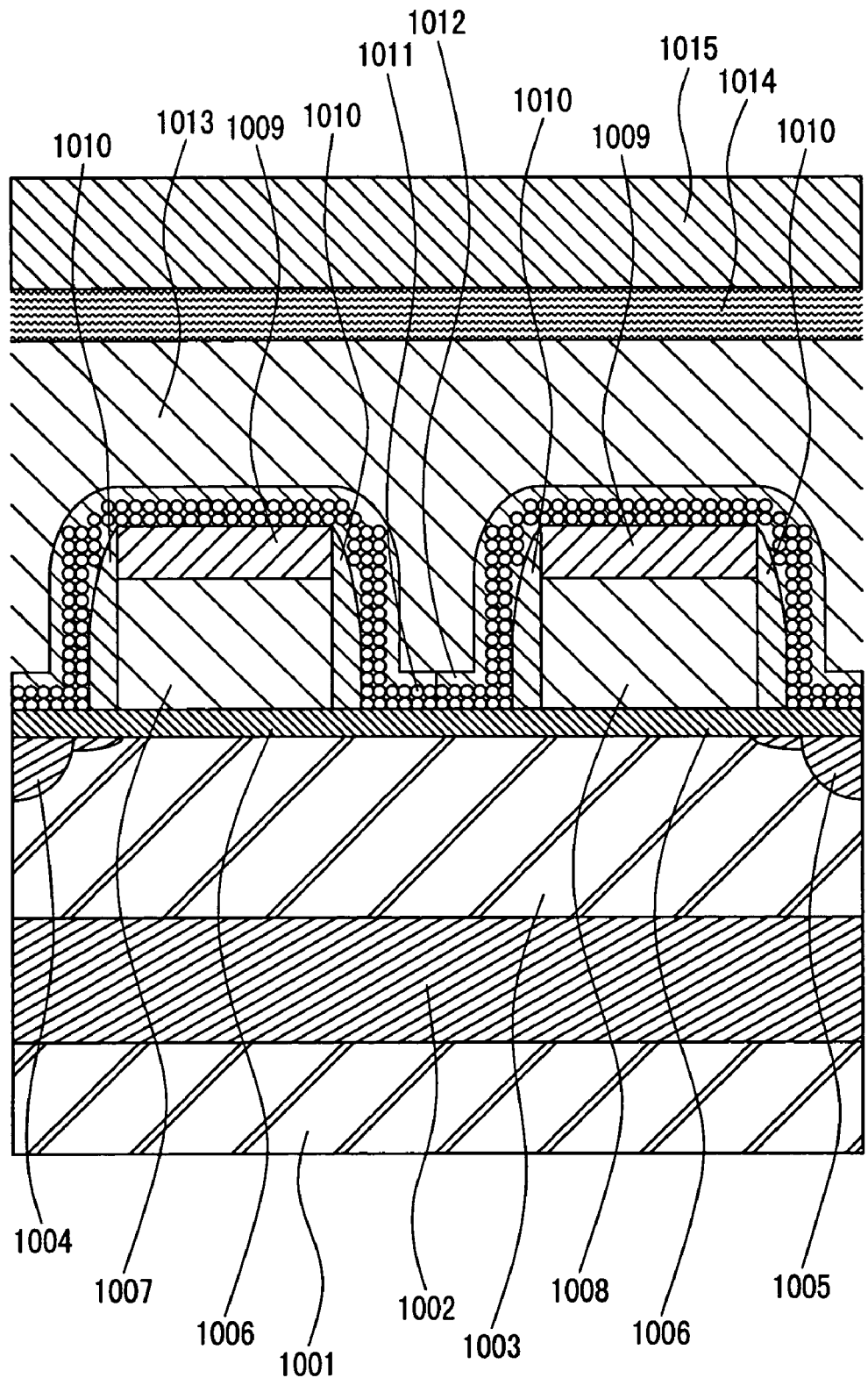
FIG. 1 is a cross-sectional view of a semiconductor memory element according to Embodiment 1.

FIG. 1 shows a cross-sectional structure of the semiconductor memory element according to the present embodiment. In FIG. 1, each of components is hatched and some of the components are not depicted for easy viewing of the drawing. The memory element has a so-called triple well structure in which an n-type well region 1002 is provided in a p-type silicon substrate 1001 and a p-type well region 1003 is provided thereover. The p-type well region 1003 has n-type diffusion regions which form a source 1004 and a drain 1005. A first assist gate electrode 1007 and a second assist gate electrode 1008 each composed of n-type polysilicon are provided on a channel region between the source 1004 and the drain 1005 via a gate insulating film 1006 composed of silicon dioxide. A silicon nitride ($Si_3N_4$) 1009 is deposited over the first and second assist gate electrodes 1007 and 1008, while sidewall structures 1010 made of silicon dioxide are provided on the respective side surfaces of the first and second assist gate electrodes 1007 and 1008. A plurality of grains 1011 made of i-type polysilicon are present over the source 1004, the drain 1005, the first and second assist gate electrodes 1007 and 1008, and the portion of the gate insulating film located between the first and second assist gate electrodes 1007 and 1008. The plurality of silicon grains 1011 are insulated from each other by silicon dioxide.

A control gate electrode composed of n-type polysilicon 1013 and metal silicide 1014 is provided over these plurality of silicon grains 1011 via a silicon dioxide film 1012. A silicon dioxide film 1015 is stacked on the control gate electrode.

Figure 2:
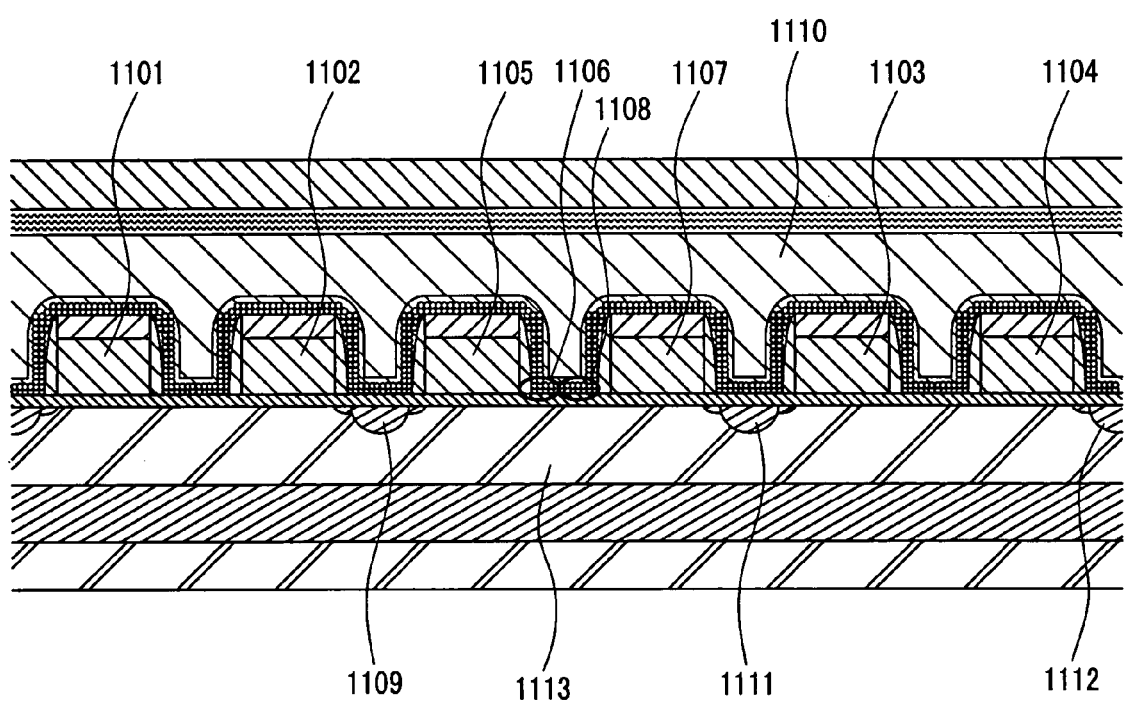
FIG. 2 is a cross-sectional view of an arrangement of a plurality of the semiconductor memory elements according to Embodiment 1.

Referring to FIG. 2, a description will be given to the operation of the semiconductor memory element according to the present embodiment. Since the semiconductor memory element according to the present embodiment operates in cooperation with adjacent elements, three adjacent semiconductor memory elements are shown in FIG. 2.

The description will be given first to the writing of information. To prevent the destruction of information in the adjacent memory elements, the adjacent memory elements are electrically disconnected by applying 0 V or a negative voltage to each of the first and second assist gate electrodes 1101 and 1102 of one of the adjacent memory element and to each of the first and second assist gate electrodes 1103 and 1104 of the other of the adjacent memory elements. In contrast to conventional practice which has physically disconnected the adjacent memory elements from each other by using a region composed of silicon dioxide which is termed an isolation region, the present embodiment features the electrical disconnection of the adjacent memory elements. This obviates the necessity to form the isolation region and thereby achieves reductions in process cost and element area. A write operation is performed by independently controlling the injection of charges into a charge storage region 1106 composed of the plurality of silicon grains located closer to the first assist gate electrode 1105 of the element to which the write operation is to be performed and the injection of charges into a charge storage region 1108 composed of the plurality of silicon grains located closer to the second assist gate electrode 1107 of the element to which the write operation is to be performed. In the case of injecting charges into the charge storage region 1106, 0 V, 1 V, and 7 V are applied to the source region 1109, to the first assist gate electrode 1105, and to the second assist gate electrode 1107, respectively. Then, 14 V is further applied to the control gate electrode 1110. At this time, the channel underlying the first assist gate electrode 1105 undergoes weak inversion and therefore becomes high in resistance, while the other channels undergo strong inversion and therefore become low in resistance.

Then, 5 V is applied to a drain 1111. The application causes the generation of hot electrons only in the portion of the channel underlying the charge storage region 1106. The hot electrons generated are accelerated by an electric field resulting from the control gate electrode 1110 and injected into the charge storage region 1106. Since hot electrons are barely generated in the portion of the channel adjacent the second assist gate electrode 1107, the injection of electrons barely occurs in the charge storage region 1108. This allows the injection of electrons into the charge storage region 1106 independent of the injection of electrons into the charge storage region 1108. The method is termed source side injection in contrast to a normal method which causes the generation of hot electrons in the vicinity of the drain. Since the source side injection method allows high-efficiency generation of hot electrons, power consumed by the write operation can be reduced. By controlling the total number of electrons injected into the charge storage region 1106 by using a plurality of levels which are 4 or more levels, only the charge storage region 1106 can store quaternary, i.e., 2 or more bits of information. Since the diffusion region is shared by the adjacent elements, 5 V is applied between the drain 1111 and the diffusion region 1112 of each of the adjacent element.

Since each of elements has two assist gate electrodes which electrically disconnect the adjacent elements, a more excellent punchthrough property is obtainable according to the present embodiment than in the case where electrical disconnection is effected by using a single assist gate. Accordingly, a leakage current in the adjacent elements during the write operation can be reduced and write operations can be performed simultaneously to a larger number of elements on a chip level. If electrons are to be injected in the charge storage region 1108, on the other hand, 0 V, 1 V, and 7 V are applied to the drain region 1111, to the second assist gate electrode 1107, and to the first assist gate electrode 1105, respectively. At this time, the channel underlying the first assist gate electrode 1107 becomes high in resistance, while the other channels become low in resistance. Then, 5 V is applied to the source 1109. The application causes the generation of hot electrons only in the portion of the channel underlying the charge storage region 1108. The hot electrons generated are accelerated by an electric field resulting from the control gate electrode 1110 and injected only in the charge storage region 1108. In this manner, independent injection of electrons can be performed with respect to the charge storage region 1106 closer to the first assist gate electrode 1105 and to the charge storage region 1108 closer to the second assist gate electrode 1107. If quaternary information is stored in each of the charge storage regions 1106 and 1108, information corresponding to hexadecimal, i.e., 4 bits of information can be stored in one memory element so that fabrication cost is reduced. It will easily be appreciated that a further reduction in fabrication cost is achievable by storing quaternary or higher-order information corresponding to 4 values or more in one of the charge storage regions and storing 4 or more bits of information in one memory element.

A description will be given to the erasing of information.

An erase operation is performed by applying 0 V to a p-type well 1113 and applying −18 V to the control gate electrode 1110. At this time, electrons in the charge storage regions are extracted therefrom into the substrate by a tunneling effect termed F-N tunneling caused by an electric field resulting from the control gate electrode 1110. Otherwise, it is also possible to apply +18 V to the control gate electrode 1110 and thereby extract the electrons into the control gate electrode 1110 by the F-N tunneling. This allows each of generated voltages to have a positive value not less than 0 V and simplifies a peripheral circuit for generating a power supply and achieves a reduction in chip area. In either of the cases, erase operations are performed simultaneously to the charge storage region 1106 closer to the first assist gate electrode 1105 and to the charge storage region 1108 closer to the second assist gate electrode 1107, thereby enabling high-speed erase operations. Alternatively, it is also possible to apply +20 V to each of the first and second assist gate electrodes 1105 and 1107 and thereby extract the electrons into the first and second assist gate electrodes 1105 and 1107 by the F-N tunneling. By independently controlling each of the voltages given to the first and second assist gate electrode 1105 and 1107 at this time, the electrons stored in the charge storage region 1106 closer to the first assist gate electrode 1105 and the electrons stored in the charge storage region 1108 closer to the second assist gate electrode 1107 can be erased independently.

Besides the foregoing methods each using the F-N tunneling, an erase operation using hot holes can also be performed. In this case, the adjacent memory elements are electrically disconnected by applying 0 V or a negative voltage to each of the first and second assist gate electrodes 1101 and 1102 of one of the adjacent memory elements and to each of the first and second assist gate electrodes 1103 and 1104 of the other of the adjacent memory elements. To erase the information from the charge storage region 1106 closer to the first assist gate electrode 1105, 0 V, −12 V, −12 V are applied to the source 1109, to the first assist gate electrode 1105, and to the second assist gate electrode 1107, respectively. Subsequently, −12 V is applied to the control gate electrode 1110 and 5 V is applied to the drain 1111. At this time, hot holes are generated in the vicinity of the source 1109. The hot holes generated are accelerated by an electric field resulting from the first assist gate electrode 1105 and from the control gate electrode 1110 and injected into the charge storage region 1106 closer to the first assist gate electrode 1105 to be recombined with electrons and extinct. Accordingly, information stored in the charge storage region 1106 closer to the first assist gate electrode 1105 is thereby erased. To erase the information in the charge storage region 1108 closer to the second assist gate electrode 1107 therefrom, the adjacent memory elements are electrically disconnected by similarly applying 0 V or a negative voltage to each of the first and second assist gate electrodes 1101 and 1102 of one of the adjacent memory elements and to each of the first and second assist gate electrodes 1103 and 1104 of the other of the adjacent memory elements. Then, 0 V, −12 V, and −12 V are applied to the drain 1111, to the second assist gate electrode 1107, and to the first assist gate electrode 1105, respectively. Subsequently, −12 V and 5 V are applied to the control gate electrode 1110 and to the source 1109, respectively. At this time, hot holes are generated in the vicinity of the drain 1109 so that information stored in the charge storage region 1108 closer to the second gate electrode 1107 is erased. Since the method allows an operation at a lower voltage than each of the methods using the F-N tunneling, the peripheral circuit can be reduced in size and the chip area can be reduced, i.e., cost can be reduced. By adjusting the voltage relations, erase operations can also be performed simultaneously to the electron storage region 1106 closer to the first assist gate electrode 1105 and to the electron storage region 1108 closer to the second assist gate electrode 1107.

A description will be given first to the reading of information.

The description will be given to the case of reading information stored in the charge storage region 1106 closer to the first assist gate electrode 1105 therefrom First, the adjacent memory elements are electrically disconnected by applying 0 V or a negative voltage to each of the first and second assist gate electrodes 1101 and 1102 of one of the adjacent memory elements and to each of the first and second assist gate electrodes 1103 and 1104 of the other of the adjacent memory elements. Then, 0 V is applied to the source 1109. By applying 3 V to the first assist gate electrode 1105, the channel underlying the first assist gate electrode 1105 is lowered in resistance. By applying 7 V to the second assist gate electrode 1107, the channel underlying the second assist gate electrode 1107 is lowered in resistance. By adjusting the potential at the second assist gate electrode 1107 to be higher than the potential at the first assist gate electrode 1105, the channel underlying the charge storage region 1108 closer to the second assist gate electrode 1107 is lowered in resistance. Then, 4 V is applied to the drain 1111. Subsequently, a voltage pulse is applied to the control gate electrode 1110 and a current or voltage in the drain 1111 is monitored, whereby the information stored in the charge storage region 1106 closer to the first assist gate electrode 1105 is read therefrom. Since an electric field resulting from the electrons stored in the charge storage region 1108 closer to the second assist gate electrode 1107 is cancelled out by an electric field resulting from the second assist gate electrode 1107, the threshold voltage of the memory element is dependent only on the number of the electrons stored in the charge storage region 1106 closer to the first assist gate electrode 1105. By varying a positive voltage pulse applied to the control gate electrode 1110 and monitoring the current or voltage in the drain 1111 a plurality of times, the information can be read therefrom. The description will be given to the reading of information stored in the charge storage region 1108 closer to the second assist gate electrode 1107 therefrom. The adjacent memory elements are electrically disconnected by applying 0 V or a negative voltage to each of the first and second assist gate electrodes 1101 and 1102 of one of the adjacent memory elements and to each of the first and second assist gate electrodes 1103 and 1104 of the other of the adjacent memory elements. Then, 0 V is applied to the drain 1111. By applying 3 V to the second assist gate electrode 1107, the channel underlying the second assist gate electrode 1107 is lowered in resistance. By applying 7 V to the first assist gate electrode 1105, each of the channel underlying the first assist gate electrode 1105 and the channel underlying the charge storage region 1106 closer to the first assist gate electrode 1105 is lowered in resistance. Then, 4 V is applied to the source 1109. Subsequently, a voltage pulse is applied to the control gate electrode 1110 and a current or voltage in the source 1109 is monitored, whereby the information stored in the charge storage region 1108 closer to the second assist gate electrode 1107 is read therefrom.

A description will be given to a semiconductor memory device in which a plurality of the semiconductor memory elements are arranged.

Figure 3:
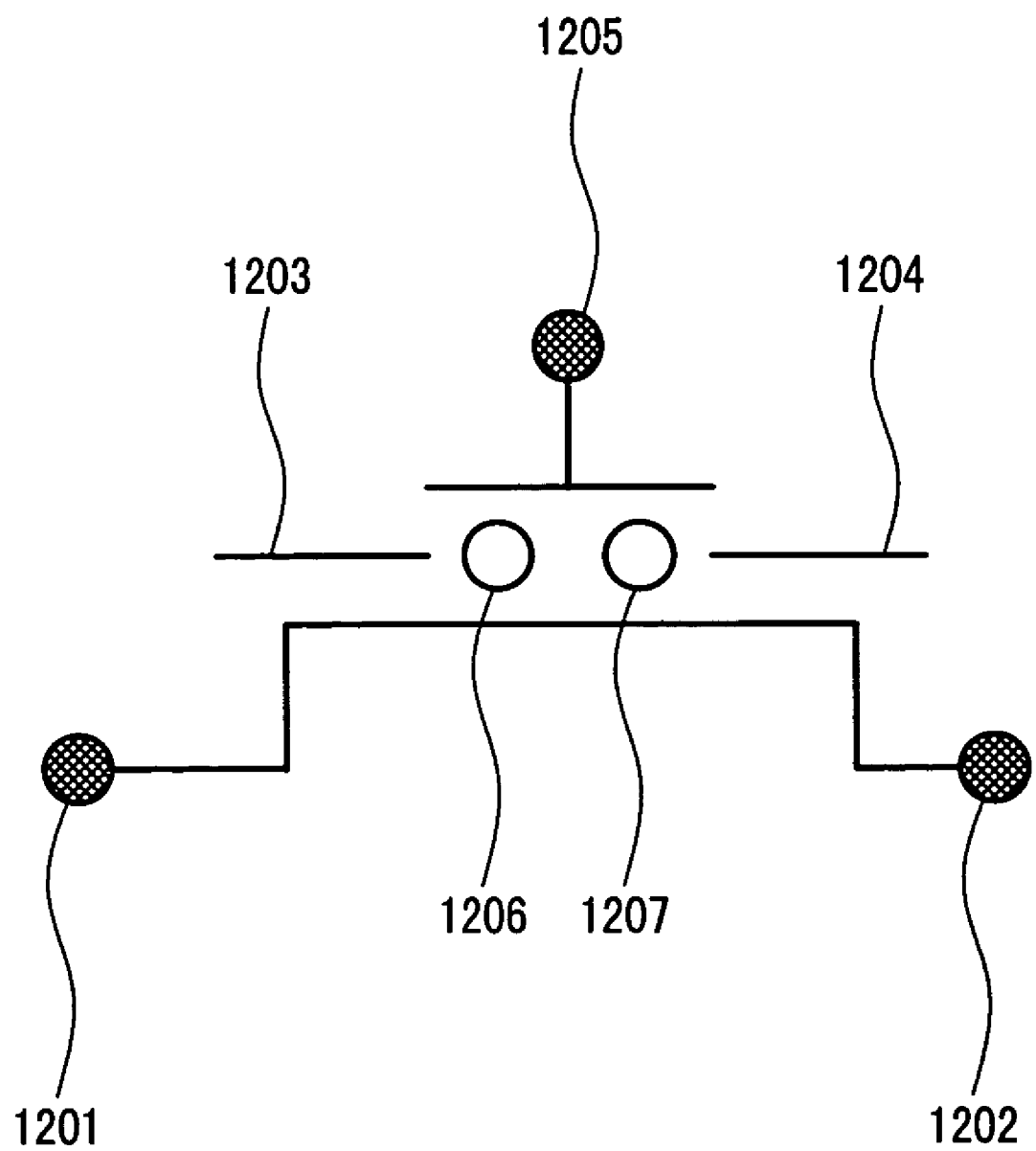
FIG. 3 is a representation on a circuit diagram which corresponds to the semiconductor memory element according to Embodiment 1.

FIG. 3 is a representation on a circuit diagram which corresponds to a single memory element according to the present embodiment. A source 1201 and a drain 1202 correspond to 1109 in FIG. 2 and 1111 in FIG. 2, respectively, while a first assist gate electrode 1203 and a second assist gate electrode 1204 correspond to 1105 and 1107 in FIG. 2, respectively. A control gate electrode 1205 corresponds to 1110 in FIG. 2, while a source-side charge storage region 1206 and a drain-side charge storage region 1207 correspond to 1106 and 1108 in FIG. 2, respectively.

Figure 4:
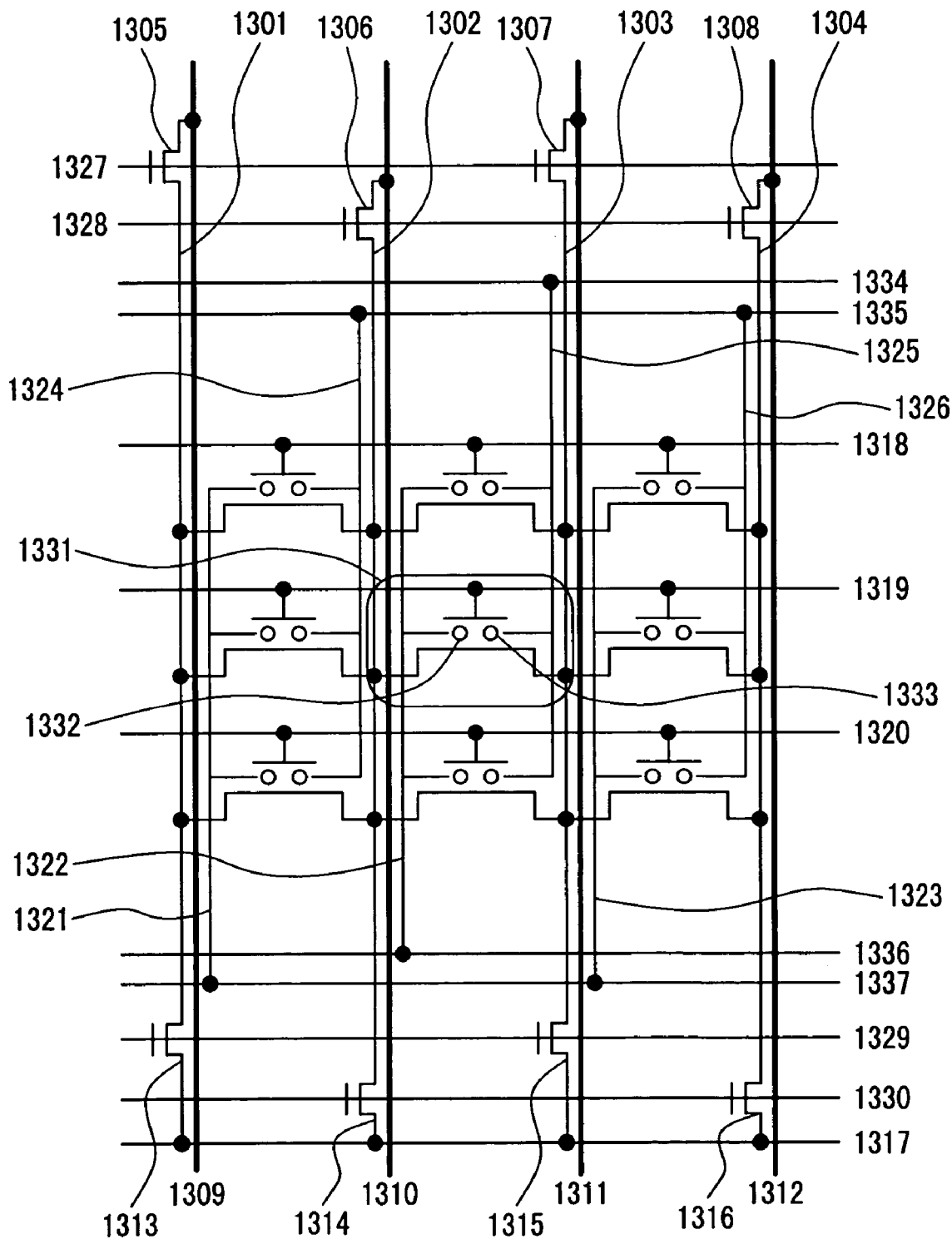
FIG. 4 shows an equivalent circuit of a semiconductor memory device according to Embodiment 1.
Figure 5:
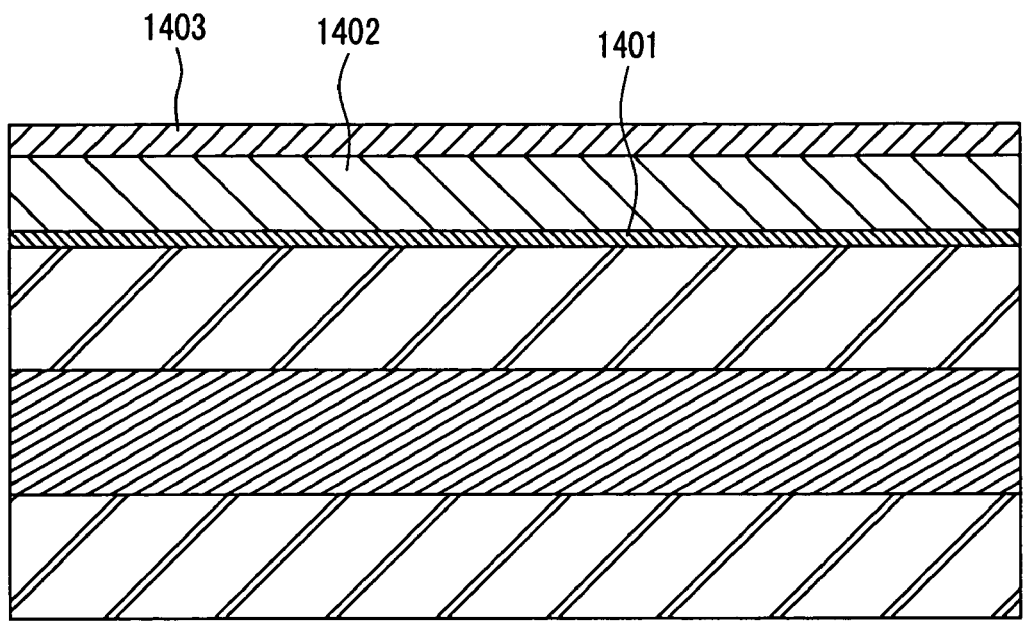
FIG. 5 is a structural cross-sectional view in a plane parallel with a word line for illustrating a process step for the fabrication of the semiconductor memory device according to Embodiment 1.
Figure 6:
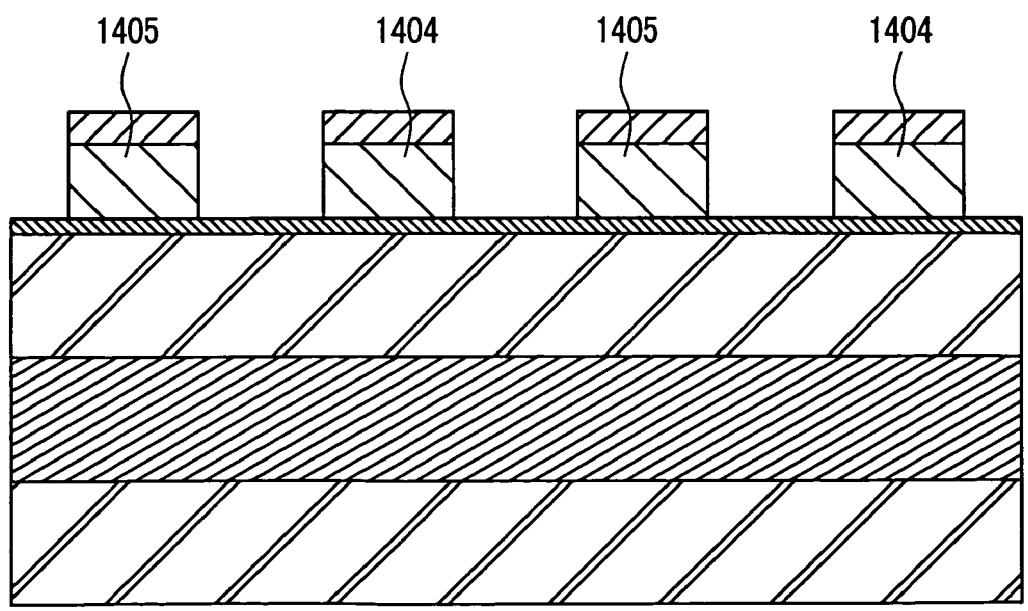
FIG. 6 is a cross-sectional view in a plane parallel with word lines for illustrating the process of fabricating the semiconductor memory device according to Embodiment 1.
Figure 7:
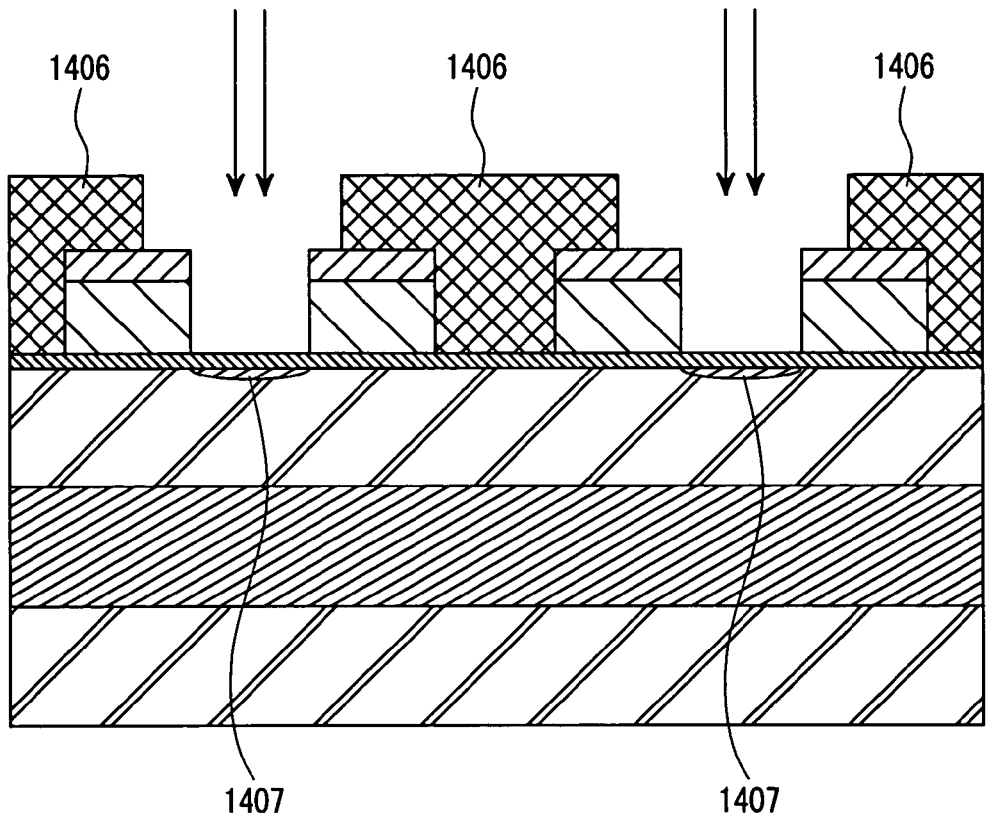
FIG. 7 is a cross-sectional view in a plane parallel with the word lines for illustrating the process of fabricating the semiconductor memory device according to Embodiment 1.
Figure 8:
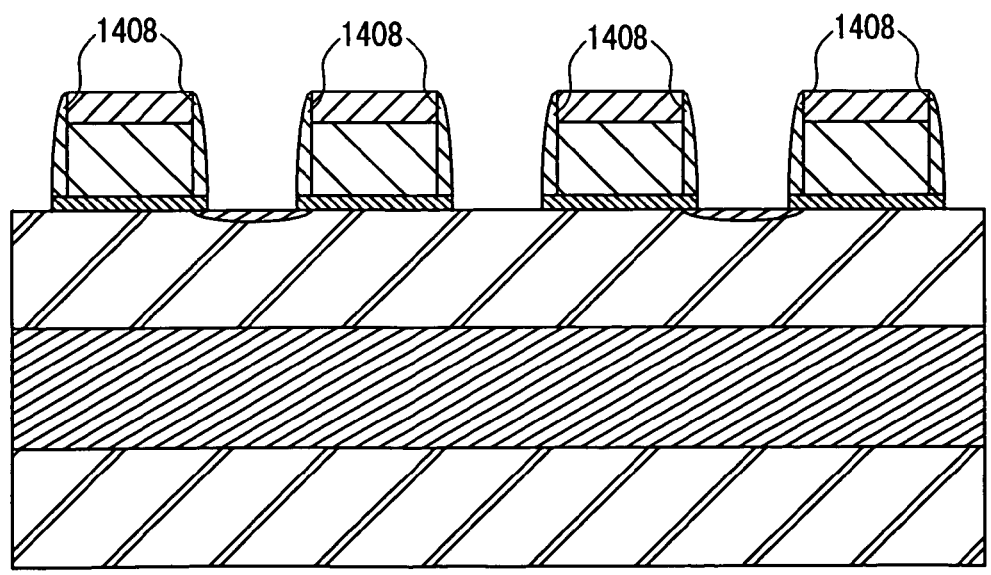
FIG. 8 is a cross-sectional view in a plane parallel with the word lines for illustrating the process of fabricating the semiconductor memory device according to Embodiment 1.
Figure 9:
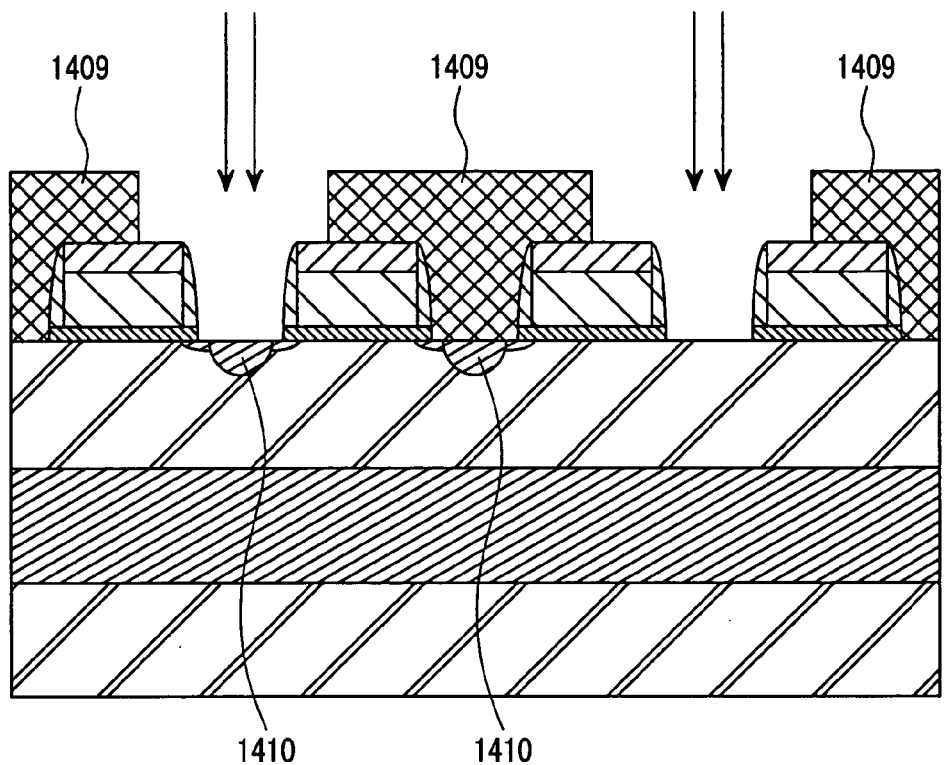
FIG. 9 is a cross-sectional view in a plane parallel with the word lines for illustrating the process of fabricating the semiconductor memory device according to Embodiment 1.

FIG. 4 is an equivalent circuit diagram of a semiconductor memory device in which a plurality of the semiconductor memory elements according to the present embodiment are arranged. Although the semiconductor memory device is actually composed of numerous memory elements, the equivalent circuit of the memory device shown herein is composed of 3×3 memory elements for purposes of illustration. Local bit lines 1301, 1302, 1303, and 1304 provide connections between the respective source regions or drain regions of the plurality of semiconductor memory elements at the respective diffusions thereof. Global bit lines 1309, 1310, 1311, and 1312 extending in directions parallel with the local bit lines are connected to these local bit lines via respective select transistors 1305, 1306, 1307, and 1308. A source line 1317 extending in a direction perpendicular to the local bit lines is also connected to the local bit lines via respective select transistors 1313, 1314, 1315, and 1316. Word lines 1318, 1319, and 1320 provide connections between the respective control gates of the memory elements in directions orthogonal to the local bit lines. First assist gate lines 1321, 1322, and 1323 provide connections between the respective first assist gates of the memory elements in directions parallel with the local bit lines. Second assist gate lines 1324, 1325, and 1326 connect the respective second assist gates of the memory elements in directions parallel with the local bit lines. A first select line 1327 provides a connection between the gate of the select transistor connecting the n-th (where n=1, 2, 3, . . . ) local bit line to the corresponding global bit line and the gate of the select transistor connecting the (n+2)-th local bit line to the corresponding global bit line. A second select line 1328 provides a connection between the gate of the select transistor connecting the (n+1)-th local bit line to the corresponding global bit line and the gate of the select transistor connecting the (n+3)-th local bit line to the corresponding global bit line. A third select line 1329 provides a connection between the gate of the select transistor connecting the n-th local bit line to the source line and the gate of the select transistor connecting the (n+2)-th local bit line to the source line. A fourth select line 1330 provides a connection between the gate of the select transistor connecting the (n+1)-th local bit line to the source line and the gate of the select transistor connecting the (n+3)-th local bit line to the source line. These first, second, third, and fourth select lines 1327, 1328, 1329, and 1330 extend in directions perpendicular to the local bit lines. The n-th first assist gate line is connected to the (n+2)-th first assist gate line and the (n+1)-th first assist gate line is connected to the (n+3)-th first assist gate line. Likewise, the n-th second assist gate line is connected to the (n+2)-th second assist gate line and the (n+1)-th second assist gate line is connected to the (n+3)-th second assist gate line. By thus tying the assist gate lines, an area reduction, i.e., a cost reduction can be achieved, while controllability is retained.

Figure 10:
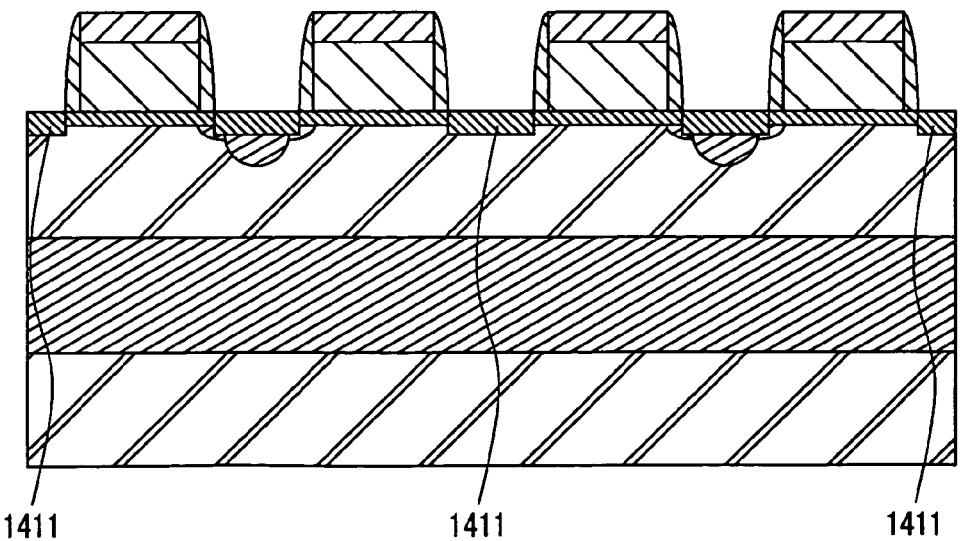
FIG. 10 is a cross-sectional view in a plane parallel with the word lines for illustrating the process of fabricating the semiconductor memory device according to Embodiment 1.
Figure 11:
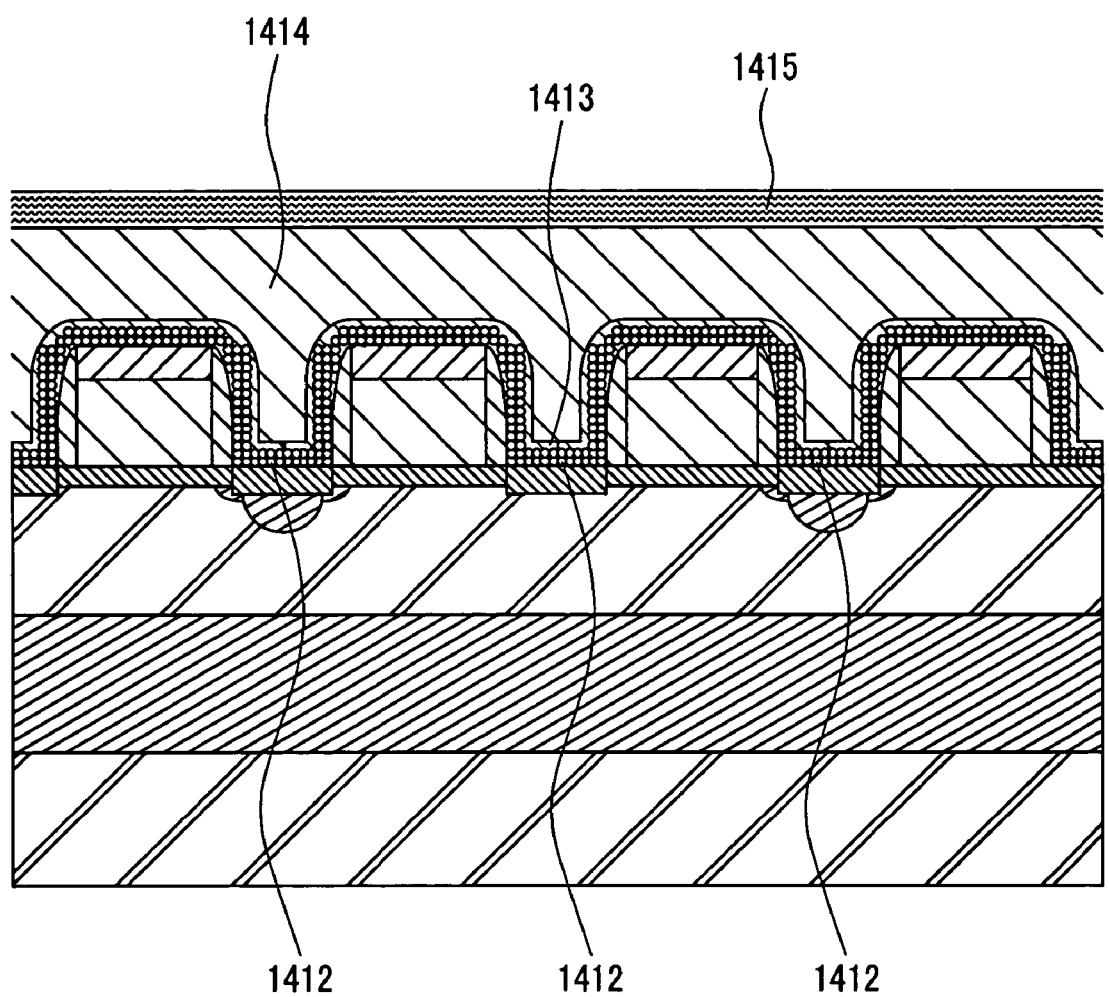
FIG. 11 is a cross-sectional view in a plane parallel with the word lines for illustrating the process of fabricating the semiconductor memory device according to Embodiment 1.

A fabrication process according to the present embodiment will be described with reference to FIGS. 5 to 11. After the triple well structure is formed in the silicon substrate by ion implantation, boron ions are implanted into a region located over the p-type well to adjust the threshold voltage. After a gate insulating film 1401 for the first and second assist gate electrodes is formed by oxidizing the substrate surface, a polysilicon film 1402 doped with phosphorus and a silicon nitride film 1403 are deposited. Instead of the silicon nitride film, a thin silicon dioxide film may also be deposited appropriately. By using a photoresist as a mask, the silicon nitride film 1403 and the polysilicon film 1402 are etched successively. In the process step, first and second assist gate electrodes 1404 and 1405 are formed. A pattern for forming diffusions is further transferred onto a resist by photolithography. By using the resist 1406 as a mask, arsenic ions are implanted with a low energy, thereby forming diffusions 1407. After a thin silicon dioxide film is deposited by LPCVD, it is etched to form so-called sidewall structures 1408 on the respective side surfaces of the first and second assist gate electrodes 1404 and 1405. A pattern for forming diffusions is transferred again onto a resist and arsenic ions are implanted with a high energy by using the resist 1409 as a mask, whereby deep diffusions 1410 are formed. By implanting arsenic ions in two separate steps, it becomes possible to improve the short-channel characteristic and reduce the resistance of each of the diffusions. At this time, it is also possible to remove the sidewall structure composed of silicon dioxide by photolithography and etching. A cleaning process is performed and a gate insulating film 1411 is formed again by thermal oxidation. Although the thickness of the gate insulating film formed at this time is equal to the thickness of the gate insulating film for the first or second assist gate electrodes in FIGS. 1 and 2, the thickness may be changed as shown in FIG. 10. The thickness of the gate insulating film 1401 under the first and second assist gate electrodes that has been adjusted to be smaller than the thickness of the gate insulating film 1411 is particularly effective in improving the properties of isolation and data retention. Then, the i-type silicon grains each having a diameter of about 10 nm are further deposited by LPCVD. Subsequently, the individual silicon grains are insulated from each other by thermal oxidation or plasma oxidation. In this case, the individual silicon grains may also be insulated from each other by plasma nitridation. A silicon nitride film which is excellent in charge storage property provides a satisfactory charge storage property. By performing the steps of depositing and oxidizing the silicon grains a plurality of times, a charge storage region 1412 is formed. Thereafter, a thin silicon dioxide film 1413 is deposited by LPCVD. It is also possible to reform the silicon dioxide thin film by, e.g., annealing the silicon dioxide thin film in an ammonia atmosphere and thermally oxidizing it thereafter so that the silicon dioxide thin film has an excellent insulating property. Then, a polysilicon thin film 1414 doped with phosphorus to form a control gate electrode and a tungsten silicide thin film 1415 for lowering the resistance of the control gate are further deposited. The polysilicon thin film and the thin film made of tungsten silicide are processed by photolithography to form the control gate electrode. The control gate electrode is formed in a direction orthogonal to the first and second assist gate electrodes. Thereafter, a silicon dioxide thin film is deposited and an interconnecting step is performed.

Figure 12:
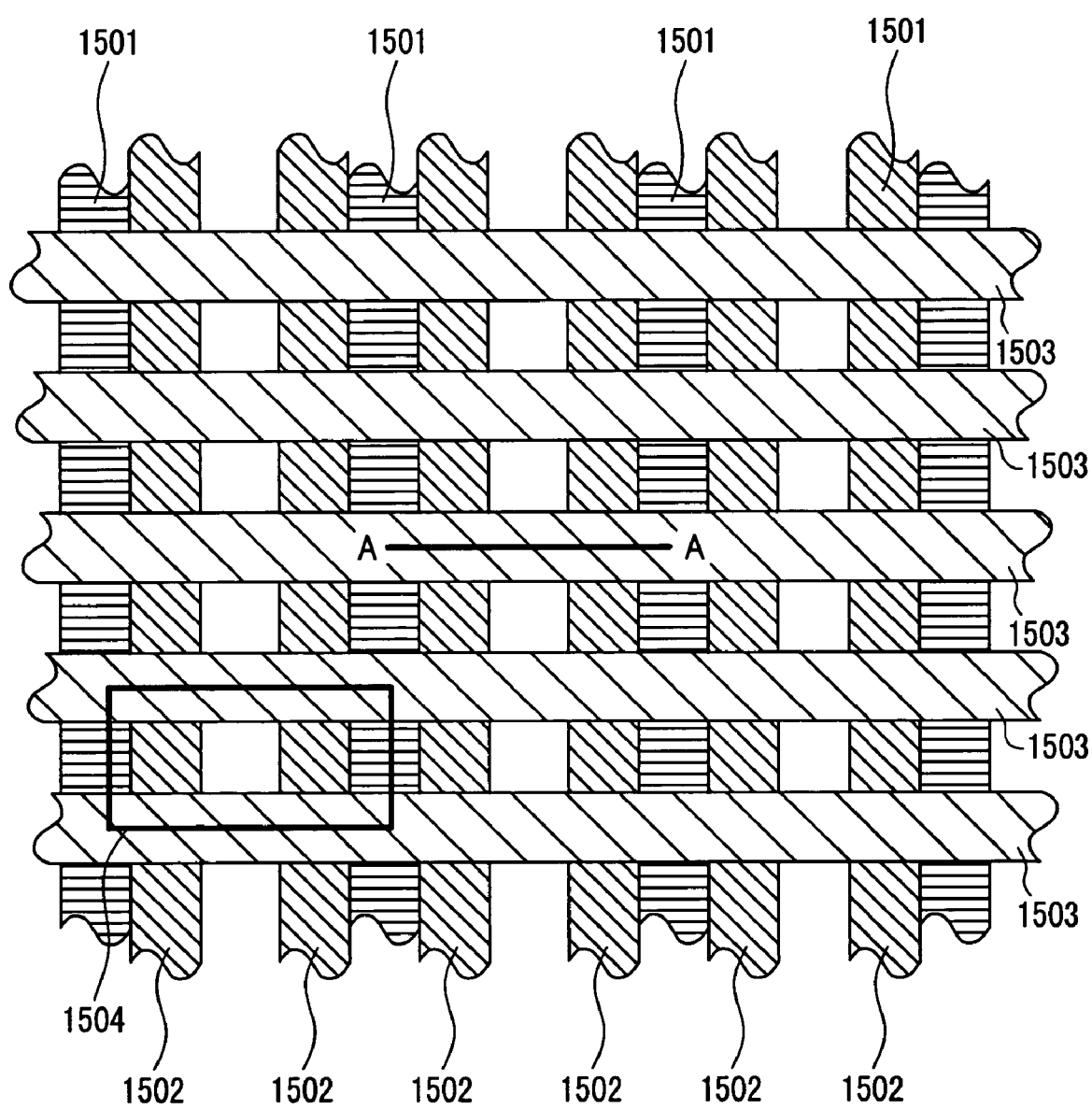
FIG. 12 is a plan view of the semiconductor memory device according to Embodiment 1.

FIG. 12 is a plan view of the semiconductor device according to the present embodiment. Local bit lines 1501 composed of the diffusions extend in parallel with assist gate lines 1502 composed of polysilicon Word lines 1503 composed of polysilicon extend in directions orthogonal to the local bit lines 1501 and the assist gate lines 1502. A cross-sectional view taken along the line A-A in FIG. 12 corresponds to FIG. 1. A minimum unit is a structure denoted by 1504 and, if a minimum feature size is F, the area thereof becomes $8F^2$ or less.

Figure 13:
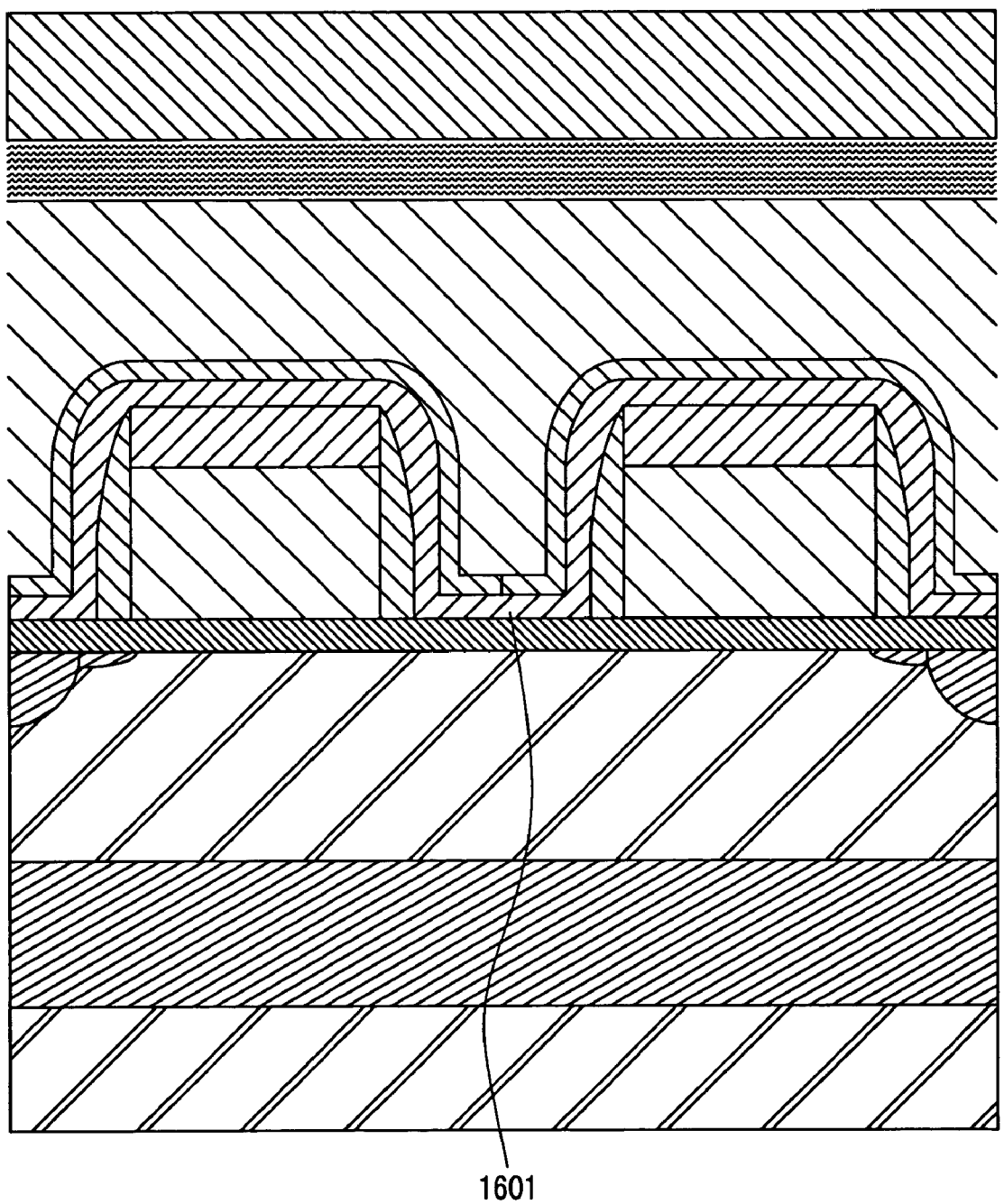
FIG. 13 is a cross-sectional view of the semiconductor memory element according to Embodiment 1 in which charge storage regions are composed of silicon nitride.
Figure 14:
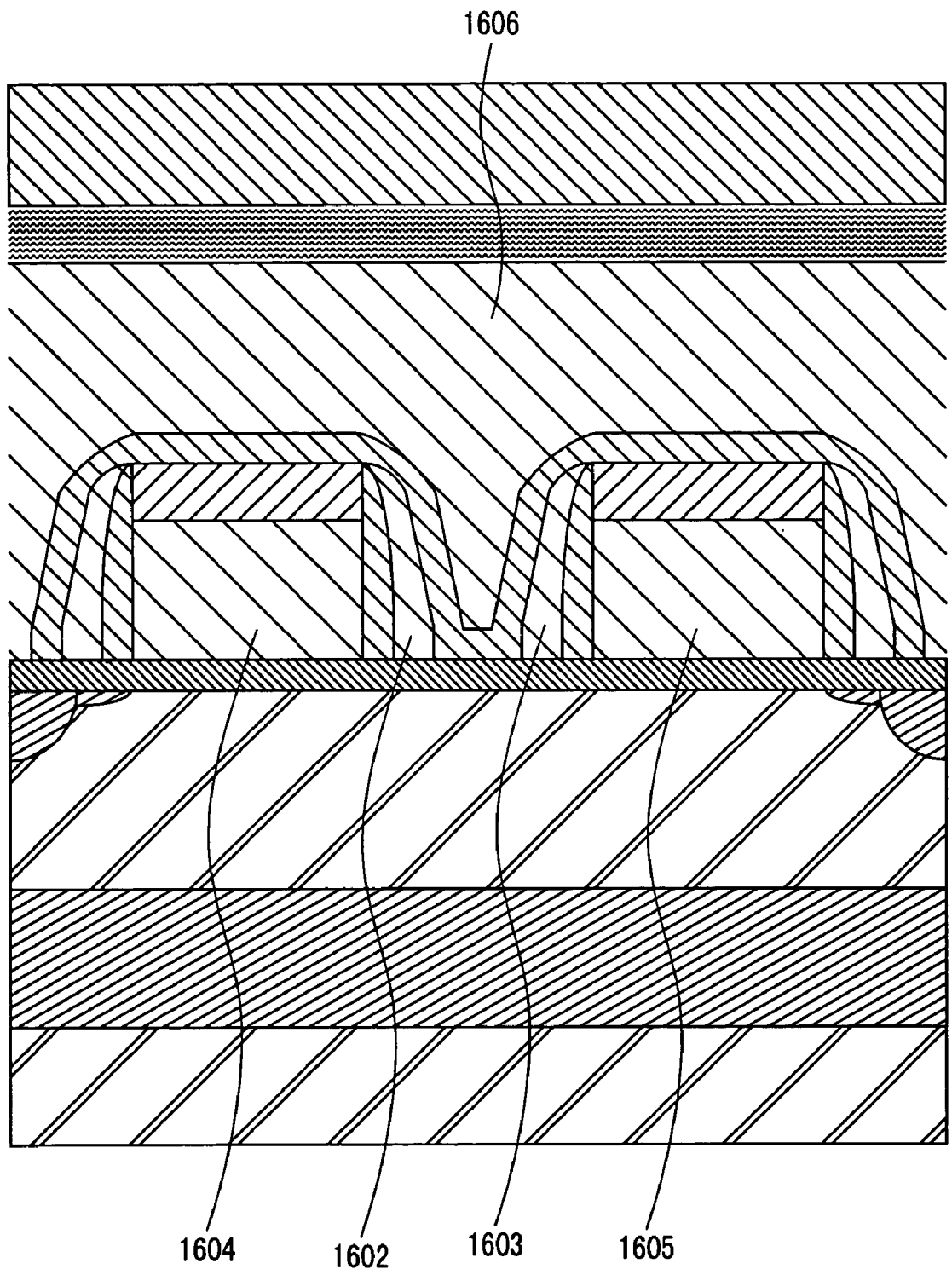
FIG. 14 is a cross-sectional view of the semiconductor memory element according to Embodiment 1 in which the charge storage regions are composed of polysilicon.

The multi-bit technology which enables storage of binary or higher-order information in each of the cells of the memory elements and characterizes the present embodiment is realized by dispersively storing charges in spatially divided regions such as the insulated silicon grains. Therefore, the technology can also be realized if the charge storage regions are composed of a silicon nitride film 1601 having charge trap sites therein, as shown in FIG. 13. The use of the silicon nitride film has advantages of reduced fabrication steps using dry etching and the like over the use of the plurality of silicon grains. Instead of the silicon nitride film, it is also possible to use a silicon oxynitride film similarly capable of trapping charges. The same effects are also achievable by using floating gate electrodes 1602 and 1603 composed of polysilicon, as shown in FIG. 14. In the case of using the floating gates composed of polysilicon, it is possible to provide intensified capacitive coupling between the floating gates 1602 and 1603, a first assist gate electrode 1604, a second assist gate electrode 1605, and a control gate electrode 1606 so that the advantages of lower-voltage write, read, and erase operations are offered.

Embodiment 2

Figure 15:
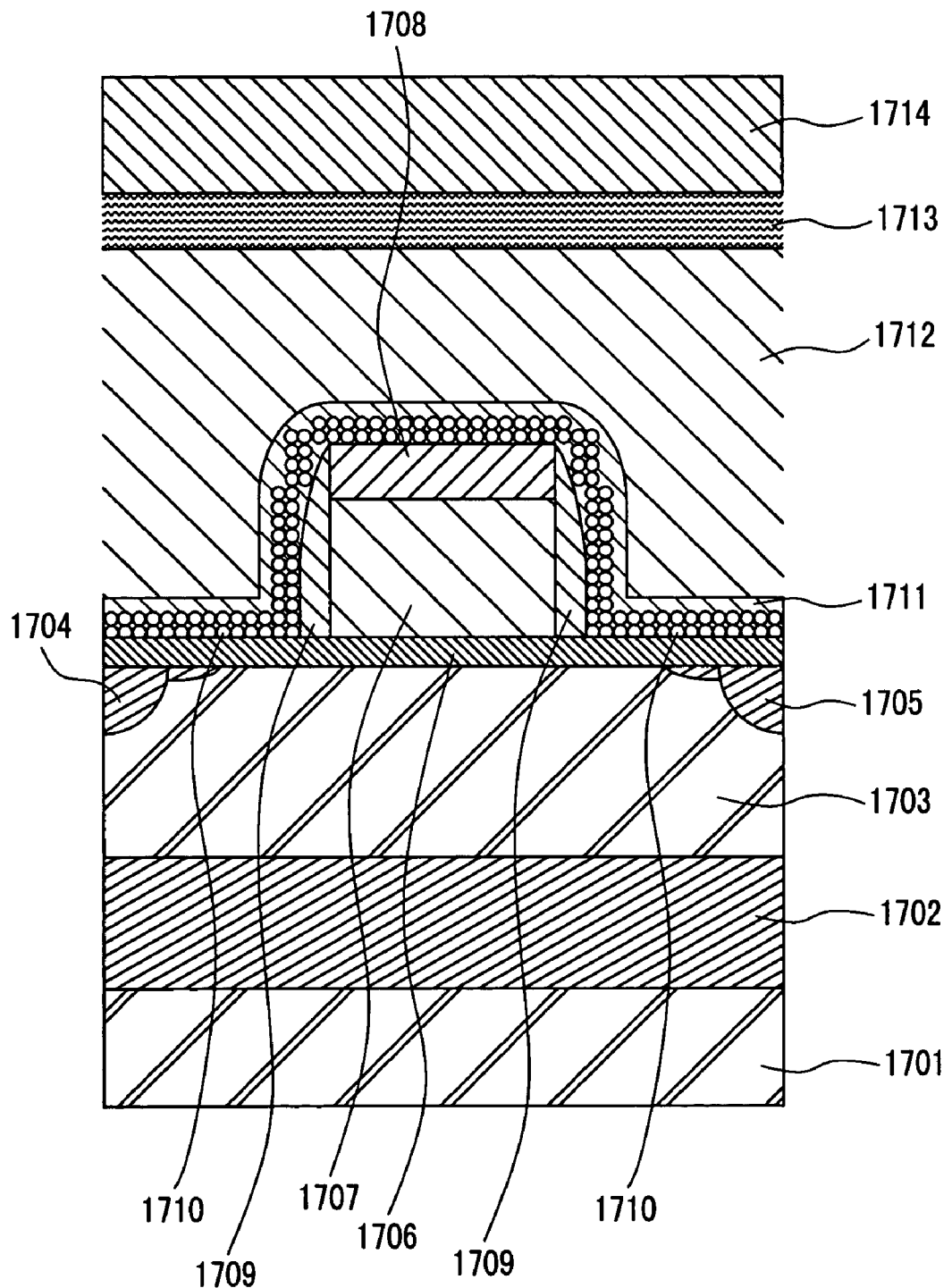
FIG. 15 is a structural cross-sectional view of a semiconductor memory element according to Embodiment 2.

FIG. 15 shows a cross-sectional structure of the semiconductor memory element according to the present embodiment. The memory element has a triple well structure in which an n-type well region 1702 is provided in a p-type silicon substrate 1701 and a p-type well region 1703 is provided therein. In the p-type well region 1703, n-type diffusion regions are present to form a source region 1704 and a drain region 1705. An assist gate electrode 1707 composed of n-type polysilicon with a thickness of 50 nm is provided on a channel region between the source region 1704 and the drain region 1705 via a gate oxide film 1706 composed of silicon dioxide with a thickness of 7 nm. A silicon nitride ($Si_3N_4$) cap 1708 is stacked on the assist gate electrode 1707 and a sidewall structure 1709 composed of silicon dioxide is provided on each of the side surfaces thereof. A plurality of n-type silicon grains 1710 each having a diameter of about 5 nm, which are to form charge storage regions, are present on the portions of the gate oxide film uncovered with the assist gate electrode 1707 and with the sidewall structure 1709, on the sidewall structure 1709, and on the silicon nitride cap 1708. The plurality of n-type silicon grains 1710 are insulated from each other by a silicon dioxide with a thickness of 2.5 nm. A control gate electrode composed of a polysilicon film 1712 with a thickness of 150 nm and a tungsten silicide film 1713 with a thickness of 30 nm, which are stacked in layers, is provided over these plurality of n-type silicon grains 1710 via a silicon dioxide film 1711 with a thickness of 13 nm. A silicon dioxide 1714 is stacked on the control gate electrode.

Figure 16:
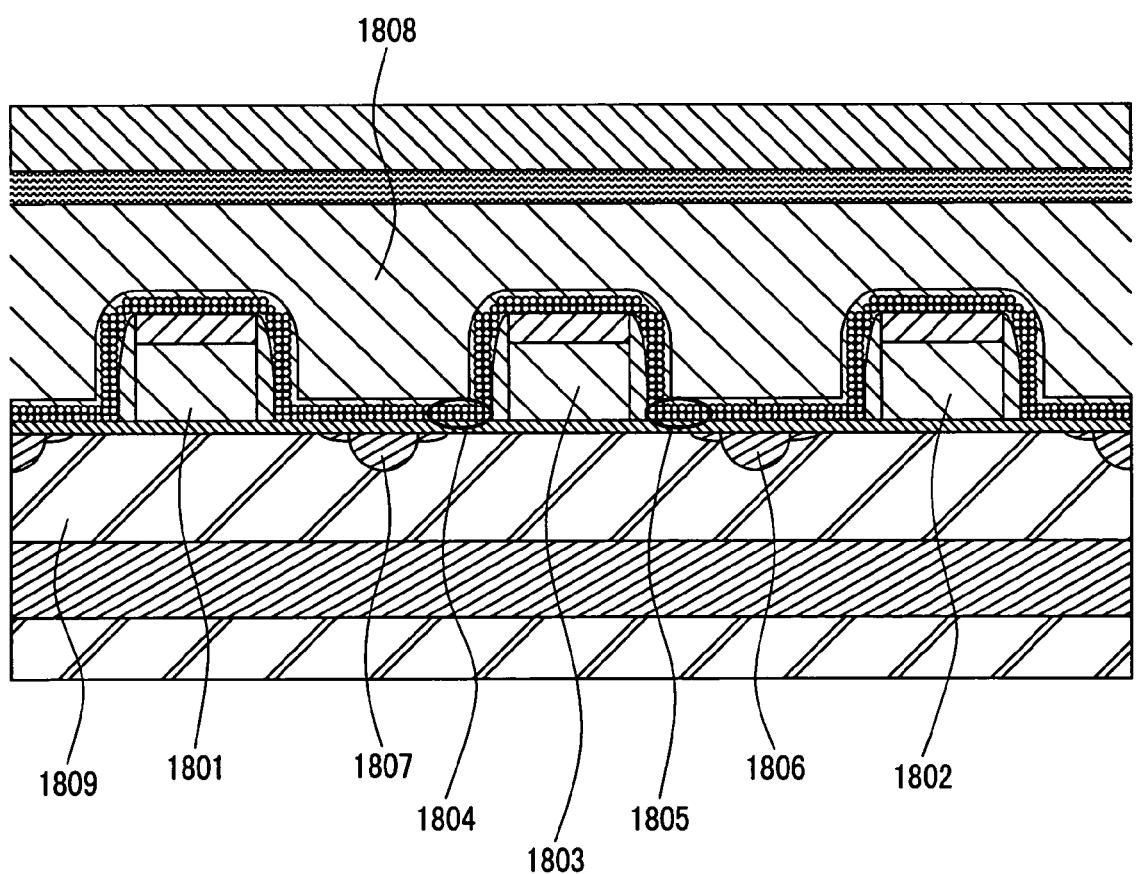
FIG. 16 is a cross sectional view of an arrangement of a plurality of the semiconductor memory elements according to Embodiment 2.

Referring to FIG. 16, a description will be given to the operation of the semiconductor memory element according to the present embodiment. Since the semiconductor memory element according to the present embodiment operates in cooperation with adjacent elements, the adjacent semiconductor memory elements are shown in FIG. 16.

The description will be given first to the writing of information. To prevent the destruction of information in the adjacent memory elements, the adjacent memory elements are electrically disconnected by applying 0 V or a negative voltage to each of the respective assist gate electrodes 1801 and 1802 of the adjacent memory elements. In contrast to conventional practice which has physically disconnected the adjacent memory elements by using a region composed of silicon dioxide which is termed an isolation region, the present embodiment is characterized by the electrical disconnection of the adjacent memory elements, similarly to Embodiment 1. By using the method of electrically disconnecting the adjacent memory elements, the present embodiment also achieves reductions in process cost and element area, similarly to Embodiment 1. A write operation is performed by independently injecting charges into a charge storage region 1804 composed of the plurality of silicon grains located closer to a source 1807 relative to the assist gate electrode 1803 and into a charge storage region 1805 composed of the plurality of silicon grains located closer to a drain 1806 relative to the assist gate. electrode 1803. In the case of injecting charges into the charge storage region 1804 closer to the source, 0V and 1V are applied to the drain 1806 and to the assist gate electrode 1803, respectively, while 5 V is applied to the source 1807. Then, 14V is applied to the control gate electrode 1808. At this time, the channel underlying the assist gate electrode 1803 becomes high in resistance and the other channels become low in resistance so that hot electrons are generated only in the portion of the channel underlying the assist gate electrode 1803 which is in close proximity to the source 1807. The hot electrons generated are accelerated by an electric field resulting from the control gate electrode 1808 and injected into the charge storage region 1804. Since hot electrons are barely generated in the portion of the channel underlying the assist gate electrode 1803 which is in close proximity to the drain 1806, the injection of electrons barely occurs in the charge storage region 1805. This allows the injection of electrons into the charge storage region 1804 independent of the injection of electrons into the charge storage region 1805. Since the method allows high-efficiency generation of hot electrons, power consumed by the write operation can be reduced so that a high-speed write operation is performed. By controlling the total number of electrons injected into the charge storage region 1804 by using a plurality of levels which are 4 or more levels, only the charge storage region 1804 can store quaternary, i.e., 2 or more bits of information. It will easily be appreciated that an operation which controls the total number of electrons to be stored by using 2 levels and stores 1 bit of information can also be performed, as has been performed conventionally. In the case of injecting charges into the charge storage region 1805 closer to the drain 1806, 0V and 1V are applied to the source region 1807 and to the assist gate electrode 1803, respectively, while 5 V is applied to the drain region 1806. Then, 14V is applied to the control gate electrode 1808. At this time, the channel underlying the assist gate electrode 1803 becomes high in resistance and the other channels become low in resistance so that hot electrons are generated only in the portion of the channel underlying the assist gate electrode 1803 which is in close proximity to the drain 1806. The hot electrons generated are accelerated by an electric field resulting from the control gate electrode 1808 and injected into the charge storage region 1805. Since hot electrons are barely generated in the portion of the channel underlying the assist gate electrode 1803 which is in close proximity to the source 1807, the injection of electrons barely occurs in the charge storage region 1804. This allows the injection of electrons into the charge storage region 1805 independent of the injection of electrons into the charge storage region 1804. If quaternary information is stored in each of the charge storage region 1804 closer to the source 1807 and the charge storage region 1805 closer to the drain 1806, hexadecimal, i.e., 4 bits of information, i.e., 4 bits can be stored in one memory element so that fabrication cost is reduced. It will easily be appreciated that a further reduction in fabrication cost is achievable by storing quaternary or higher-order information in one of the charge storage regions and storing 4 or more bits of information in one memory element.

A description will be given next to the erasing of information. An erase operation is performed by applying 0V to a p-type well 1809 and applying −20 V to the control gate 1808. At this time, electrons in the charge storage regions are extracted therefrom into the substrate by a tunneling effect termed F-N tunneling caused by an electric field resulting from the control gate electrode 1808. Otherwise, it is also possible to apply +20V to the control gate electrode 1808 and thereby extract the electrons into the control gate electrode 1808 by the F-N tunneling. Alternatively, it is also possible to apply +20 V to the assist gate 1803 and thereby extract the electrons into the assist gate electrode 1803 by the F-N tunneling. In either of the cases, erase operations are performed simultaneously to the charge storage region 1804 closer to the source 1807 and to the charge storage region 1805 closer to the drain 1806, thereby enabling high-speed erase operations.

An erase operation using hot holes can also be performed. First, the adjacent memory elements are electrically disconnected by applying, e.g., 0 V or a negative voltage to each of the assist gate electrodes 1801 and 1802 of the adjacent memory elements. To erase the information in the charge storage region 1804 closer to the source 1807 therefrom, 0 V, −12 V, and −12 V are applied to the drain 1806, to the assist gate electrode 1803, and to the control gate electrode 1808, respectively. Subsequently, 5 V is applied to the source 1807. At this time, hot holes are generated in the vicinity of the source 1807. The hot holes generated are accelerated by an electric field produced by the control gate electrode 1808 and injected into the charge storage region 1804 to be recombined with electrons and extinct. Accordingly, information stored in the charge storage region 1804 is thereby erased. To erase the information in the charge storage region 1805 therefrom, the adjacent memory elements are electrically disconnected by similarly applying 0 V or a negative voltage to each of the assist gate electrodes 1801 and 1802 of the adjacent memory elements, while 0 V and −12 V are applied to the source 1807 and to the assist gate electrode 1803, respectively. Subsequently, −12 V and 5 V are applied to the control gate electrode 1808 and to the drain 1806, respectively. At this time, hot holes are generated in the vicinity of the drain 1806 so that information stored in the charge storage region 1805 is erased. Since the method allows an operation at a lower voltage than each of the methods using the F-N tunneling, the peripheral circuit can be reduced in size and the chip area can be reduced, i.e., cost can be reduced. By adjusting the voltage relations, erase operations can also be performed simultaneously to the electron storage region 1804 and to the electron storage region 1805.

A description will be given next to the reading of information.

The description will be given first to the case of reading information stored in the charge storage region 1804 closer to the source 1807 therefrom. First, the adjacent memory elements are electrically disconnected by applying 0 V or a negative voltage to each of the assist gate electrodes 1801 and 1802 of the adjacent memory elements. Then, 0 V is applied to the source 1807. By applying 3 V to the assist gate electrode 1803, the channel underlying the assist gate electrode 1803 is lowered in resistance. Then, 2 V is applied to the drain 1806. Subsequently, a voltage pulse is applied to the control gate electrode 1808 and a current or voltage in the drain 1806 is monitored, whereby the information stored in the charge storage region 1804 is read therefrom. Since a current flows through a depletion layer under the charge storage region 1805 due to a high drain voltage, it does not receive the influence of the electrons stored in the charge storage region 1805. Accordingly, the threshold voltage of the memory element is dependent only on the number of the electrons stored in the charge storage region 1804. If a plurality of levels of charges are stored in the charge storage region 1804, multi-bit information can be read therefrom by varying the magnitude of a positive voltage pulse applied to the control gate electrode 1808 and monitoring the current or voltage in the drain 1806 a plurality of times In the case of reading information stored in the charge storage region 1805 closer to the drain 1806 therefrom, it is sufficient to switch the voltages applied to the source 1807 and to the drain 1806 appropriately.

A description will be given next to a semiconductor memory device in which a plurality of the semiconductor memory elements are arranged.

Figure 17:
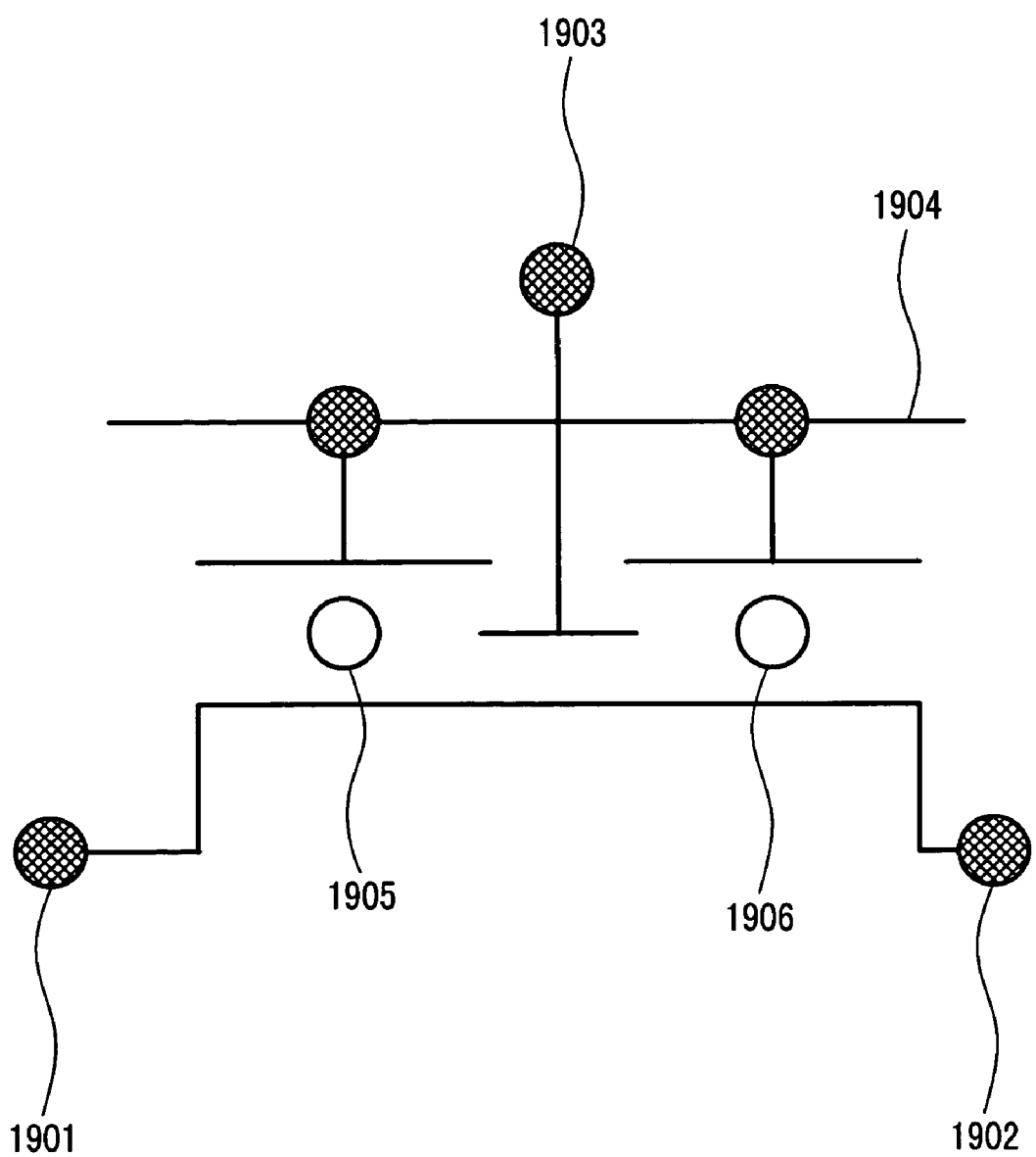
FIG. 17 is a representation on a circuit diagram which corresponds to the semiconductor memory element according to Embodiment 2.

FIG. 17 is a representation on a circuit diagram which corresponds to a single memory element according to the present embodiment. A source 1901 and a drain 1902 correspond to 1807 and 1806 in FIG. 16, respectively, while an assist gate electrode 1903 and a control gate electrode 1904 correspond to 1803 and 1808 in FIG. 16. A source-side charge storage region 1905 and a drain-side charge storage region 1906 correspond to 1804 and 1805 in FIG. 16, respectively.

Figure 18:
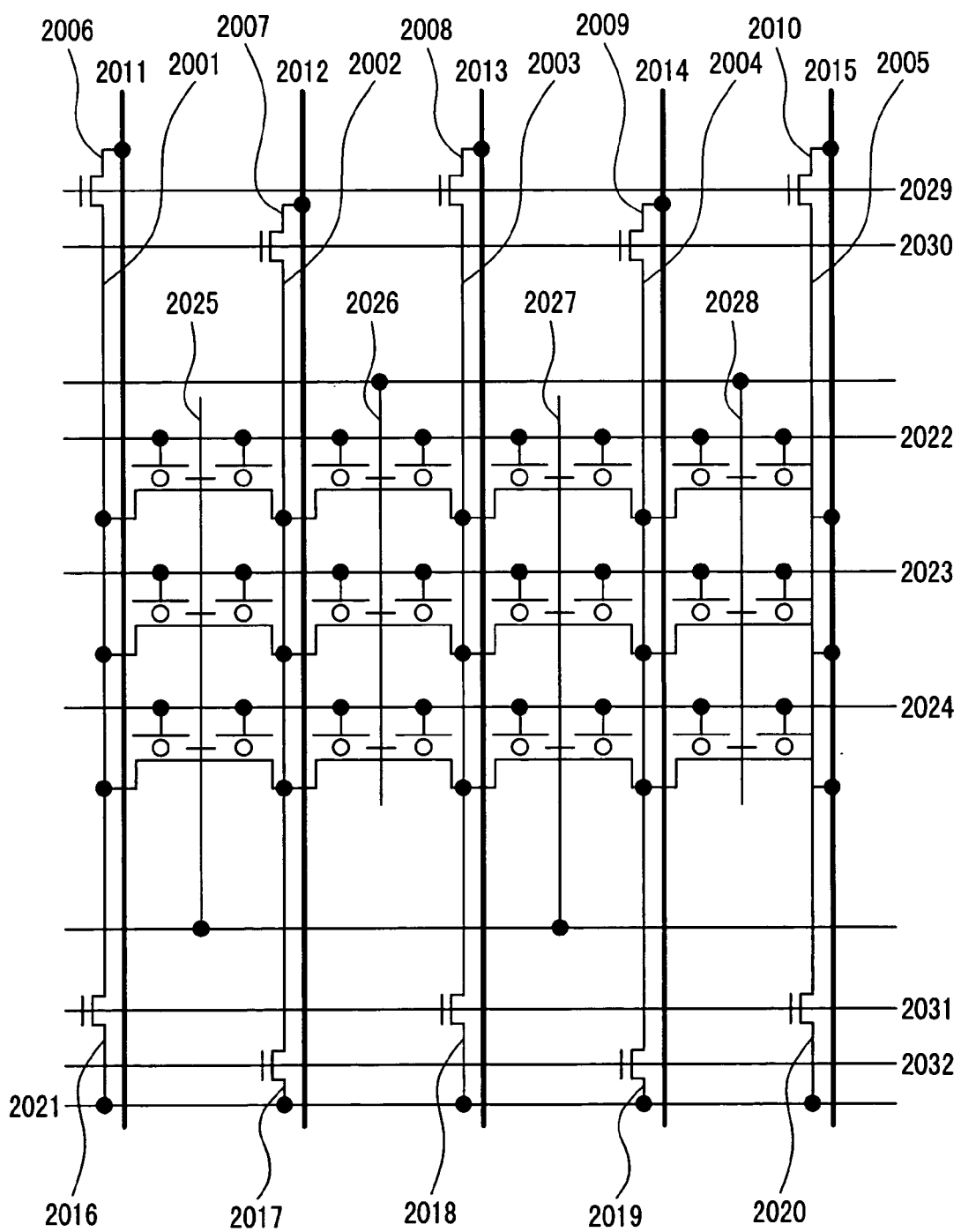
FIG. 18 shows an equivalent circuit of a semiconductor memory device according to Embodiment 2.
Figure 19:
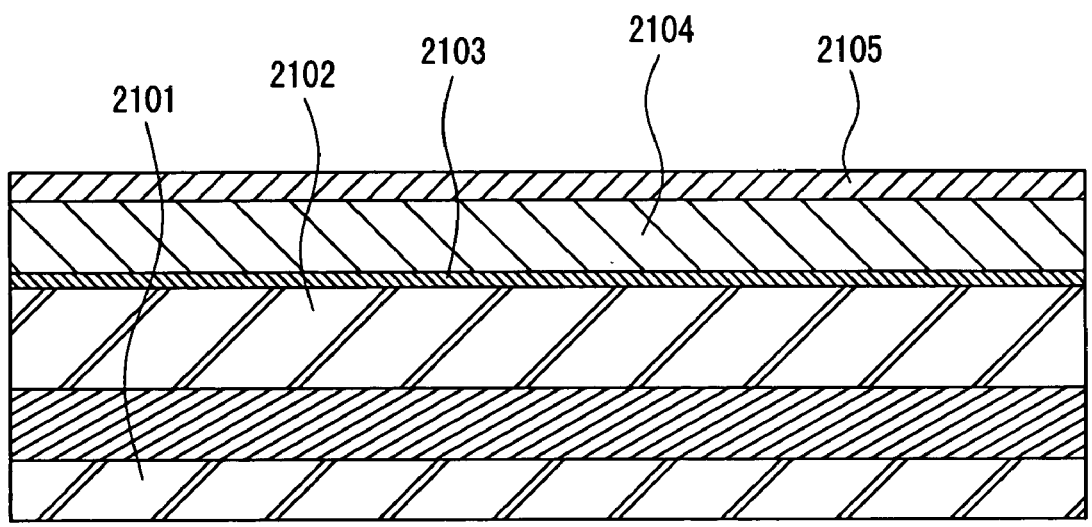
FIG. 19 is a cross-sectional view in a plane parallel with word lines for illustrating the process of fabricating the semiconductor memory device according to Embodiment 2.
Figure 20:
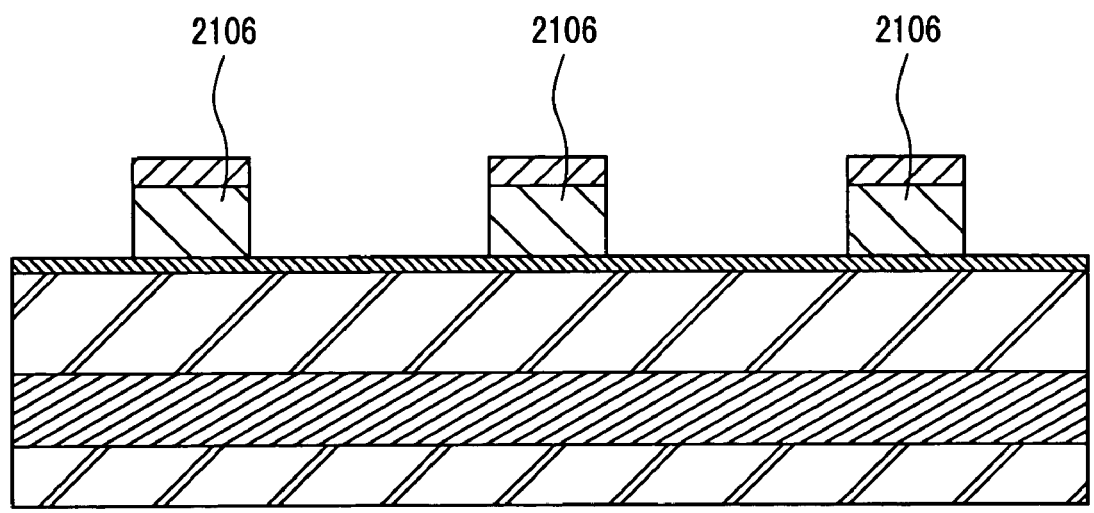
FIG. 20 is a cross-sectional view in a plane parallel with the word lines for illustrating the process of fabricating the semiconductor memory device according to Embodiment 2.
Figure 21:
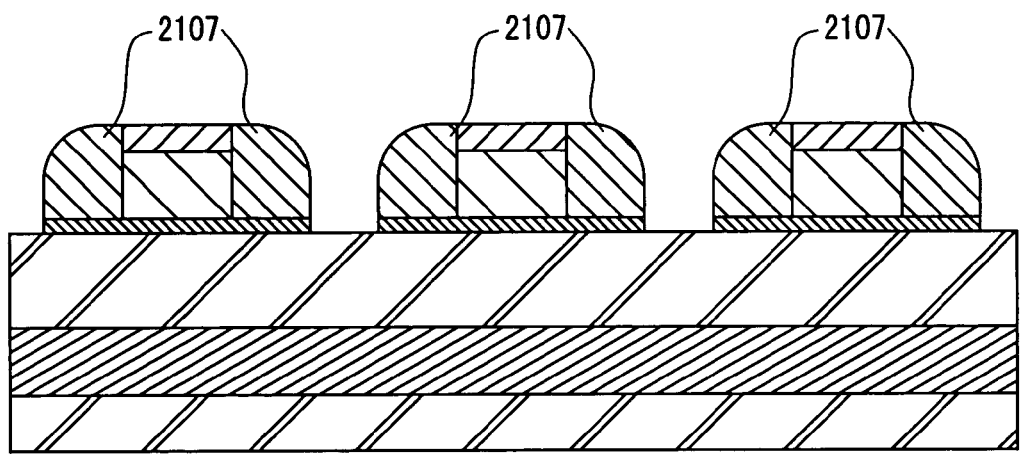
FIG. 21 is a cross-sectional view in a plane parallel with the word lines for illustrating the process of fabricating the semiconductor memory device according to Embodiment 2.
Figure 22:
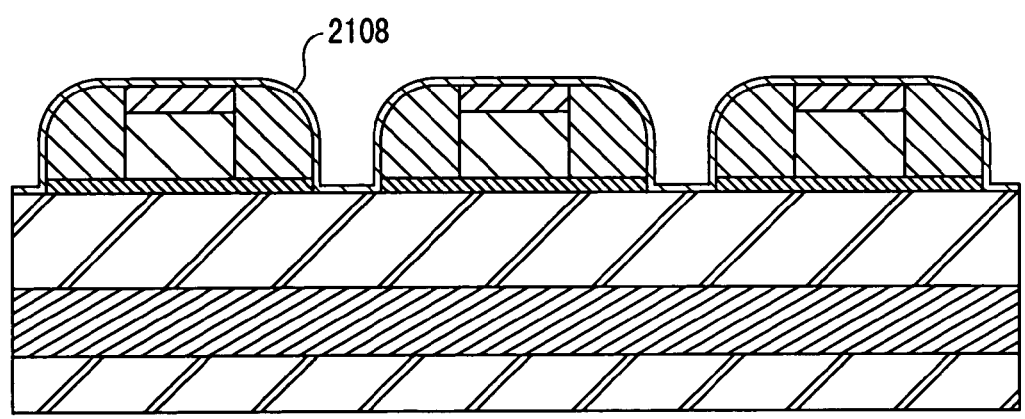
FIG. 22 is a cross-sectional view in a plane parallel with the word lines for illustrating the process of fabricating the semiconductor memory device according to Embodiment 2.

FIG. 18 is an equivalent circuit diagram of a semiconductor memory device in which a plurality of the semiconductor memory elements according to the present embodiment are arranged. Although the semiconductor memory device is actually composed of numerous memory elements, the equivalent circuit of the memory device shown herein is composed of 4×3 memory elements for purposes of illustration. Local bit lines 2001, 2002, 2003, 2004, and 2005 provide connections between the respective source regions or drain regions of the plurality of semiconductor memory elements at the respective diffusions thereof. Global bit lines 2011, 2012, 2013, 2014, and 2015 extending in directions parallel with the local bit lines are connected to these local bit lines via respective select transistors 2006, 2007, 2008, 2009, and 2010. A source line 2021 extending in a direction perpendicular to the local bit lines is also connected to the local bit lines via respective select transistors 2016, 2017, 2018, 1019, and 2020. Word lines 2022, 2023, and 2024 provide connections between the respective control gates of the memory elements in directions orthogonal to the local bit lines. Assist gate lines 2025, 2026, 2027, and 2028 provide connections between the respective assist gates of the memory elements in directions parallel with the local bit lines. A first select line 2029 provides a connection between the gate electrode of the select transistor connecting the n-th (where n=1, 2, 3, . . . ) local bit line to the corresponding global bit line and the gate electrode of the select transistor connecting the (n+2)-th local bit line to the corresponding global bit line. A second select line 2030 provides a connection between the gate electrode of the select transistor connecting the (n+1)-th local bit line to the corresponding global bit line and the gate electrode of the select transistor connecting the (n+3)-th local bit line to the corresponding global bit line. A third select line 2031 provides a connection between the gate electrode of the select transistor connecting the n-th local bit line to the source line and the gate electrode of the select transistor connecting the (n+2)-th local bit line to the source line. A fourth select line 2032 provides a connection between the gate electrode of the select transistor connecting the (n+1)-th local bit line to the source line and the gate electrode of the select transistor connecting the (n+3)-th local bit line to the source line. These select lines 2029 to 2032 extend in directions perpendicular to the local bit lines. The n-th assist gate line is connected to the (n+2)-th assist gate line and the (n+1)-th assist gate line is connected to the (n+3)-th assist gate line. By thus tying the assist gate lines, an area reduction, i.e., a cost reduction can be achieved, while controllability is retained.

Figure 27:
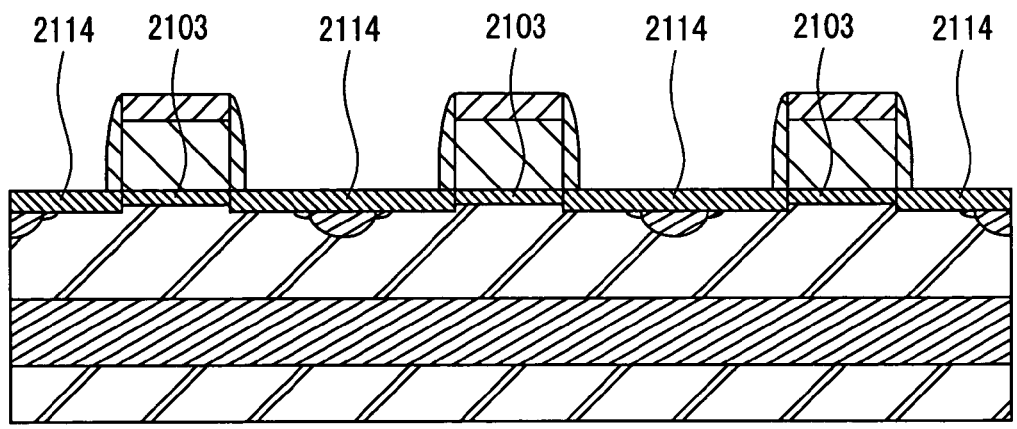
FIG. 27 is a cross-sectional view in a plane parallel with the word lines for illustrating the process of fabricating the semiconductor memory device according to Embodiment 2.
Figure 28:
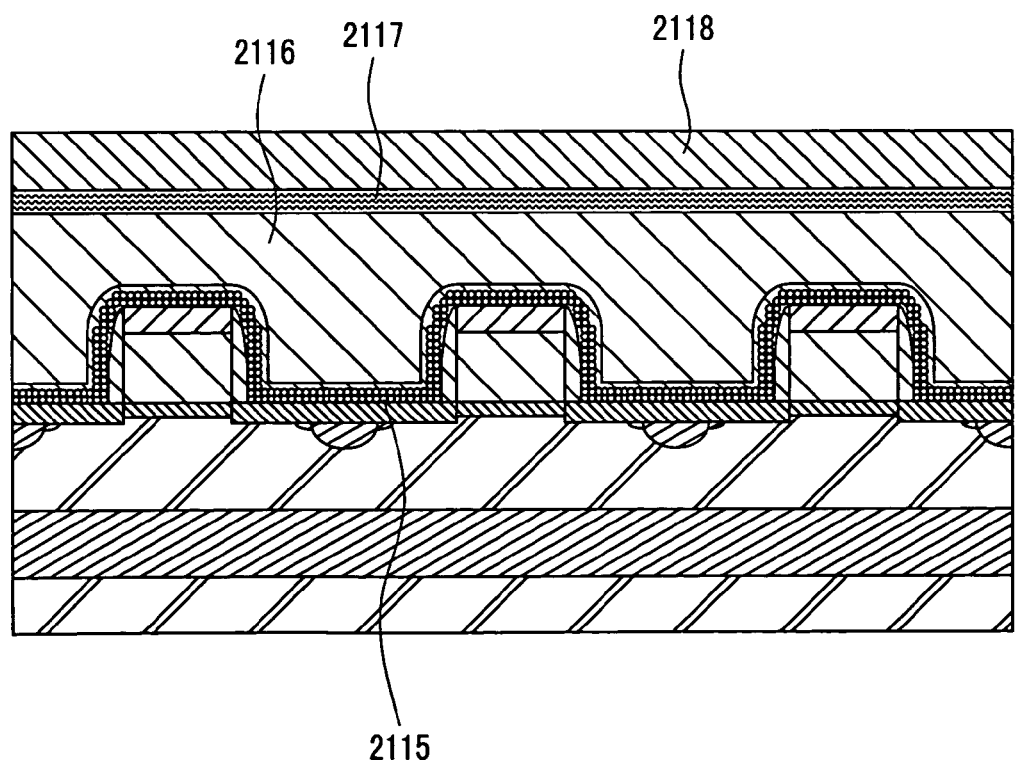
FIG. 28 is a cross-sectional view in a plane parallel with the word lines for illustrating the process of fabricating the semiconductor memory device according to Embodiment 2.

A fabrication process according to the present embodiment will be described with reference to FIGS. 19 to 28. After the triple well structure is formed in a silicon substrate 2101 by ion implantation, boron (B) is ion-implanted into a region located over a p-type well 2102 to adjust the threshold voltage. After a gate insulating film 2103 is formed by oxidizing the substrate surface, a polysilicon film 2104 and a $Si_3N_4$ film 2105 are deposited by LPCVD. By using a photoresist as a mask, the $Si_3N_4$ film and the polysilicon film are etched successively, whereby assist gate electrodes 2106 are formed. Thereafter, a silicon dioxide thin film is deposited and etched back to form sidewall structures 2107 on the respective side surfaces of the assist gate electrodes. After a cleaning process, a silicon dioxide thin film 2108 is further deposited. Then, by using the assist gate electrodes 2106 and the sidewall structures 2107 as a mask, implantation of arsenic (As) ions is performed with a low energy from oblique directions as indicated by the arrows 2109 in FIG. 23. Subsequently, implantation of arsenic ions is performed again with a low energy from directions opposite to those indicated by the arrows 2109. Additionally, implantation of arsenic ions is performed with a high energy from directions perpendicular to the substrate 2101 as indicated by the arrows 2111 in FIG. 25, whereby diffusion structures 2112 are formed. By thus performing ion implantations at varied angles, it becomes possible to suppress the short-channel effect of the memory elements and reduce the resistance of each of the diffusions. After removing the sidewall structures 2107 by dry etching, a silicon dioxide thin film is deposited again and etched back, thereby forming sidewall structures 2113. Thereafter, a gate oxide film 2114 is formed by thermal oxidation. Although the thickness of the silicon dioxide film formed at this time may be equal to the thickness of the silicon oxide film 2103 film as the gate oxide film for the assist gates, the properties of data retention and isolation can be improved by forming a film 2114 thicker than the silicon oxide film 2103 as shown in FIG. 27. Then, n-type silicon grains 2115 are deposited by LPCVD. The use of n-type silicon for the grains reduces a voltage drop in each of the grains and lowers a voltage applied to the control gate. Subsequently, thermal oxidation or plasma oxidation is performed, thereby insulating the plurality of silicon grains 2115 from each other. The deposition and oxidation of the silicon grains are performed a plurality of times to form the charge storage region. Then, a polysilicon film 2116 for forming a control gate electrode and a tungsten silicide 2117 for lowering the resistance of the control gate electrode are further stacked. After the control electrode is formed by etching, a silicon dioxide thin film 2118 is deposited and an interconnecting step is performed.

Figure 29:
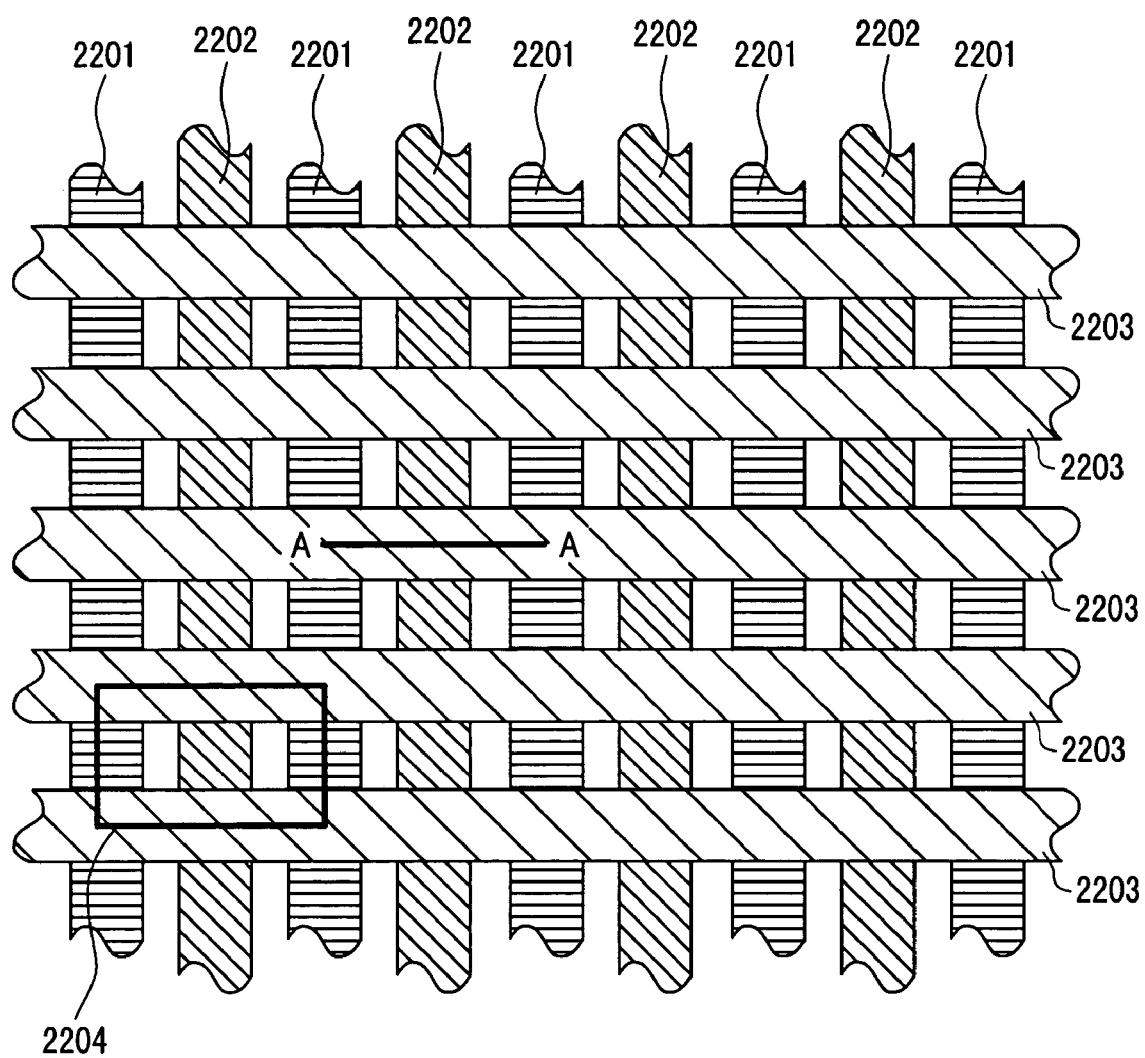
FIG. 29 is a plan view of the semiconductor memory device according to Embodiment 2.

FIG. 29 is a plan view of the semiconductor device according to the present embodiment. Local bit lines 2201 composed of the diffusions extend in parallel with assist gate lines 2202 composed of polysilicon. Word lines 2203 composed of polysilicon extend in directions orthogonal to the local bit lines 2201 and the assist gate lines 2202. A cross-sectional view taken along the line A—A in FIG. 29 corresponds to FIG. 15. A minimum unit is a structure denoted by 2204 and, if a minimum feature size is F, the area thereof becomes $6F^2$ or less.

Figure 23:
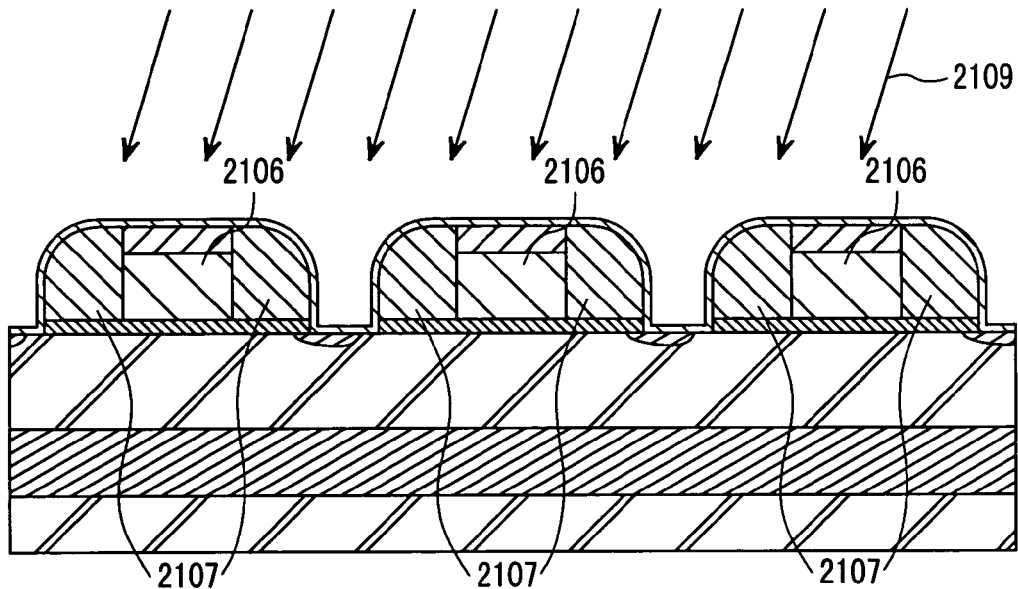
FIG. 23 is a cross-sectional view in a plane parallel with the word lines for illustrating the process of fabricating the semiconductor memory device according to Embodiment 2.
Figure 24:
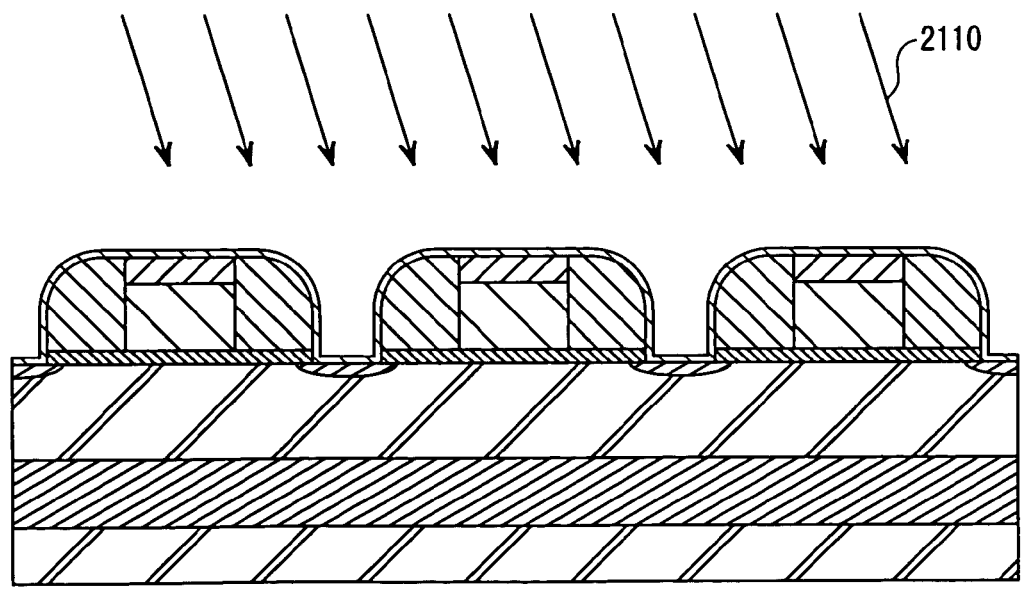
FIG. 24 is a cross-sectional view in a plane parallel with the word lines for illustrating the process of fabricating the semiconductor memory device according to Embodiment 2.
Figure 25:
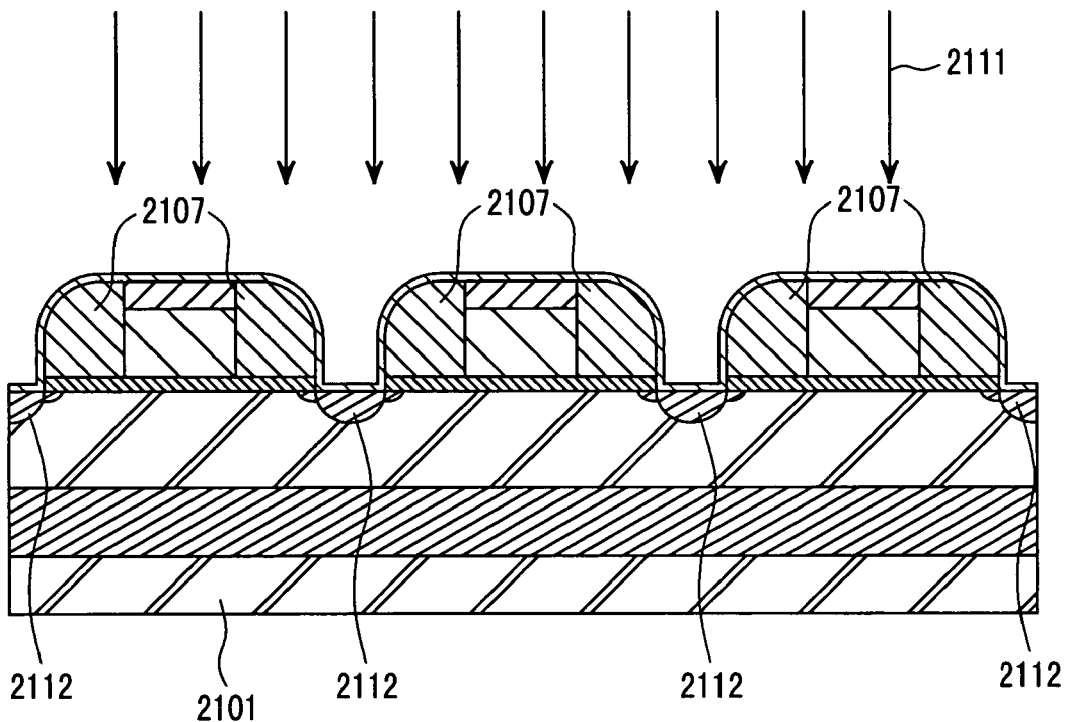
FIG. 25 is a cross-sectional view in a plane parallel with the word lines for illustrating the process of fabricating the semiconductor memory device according to Embodiment 2.
Figure 26:
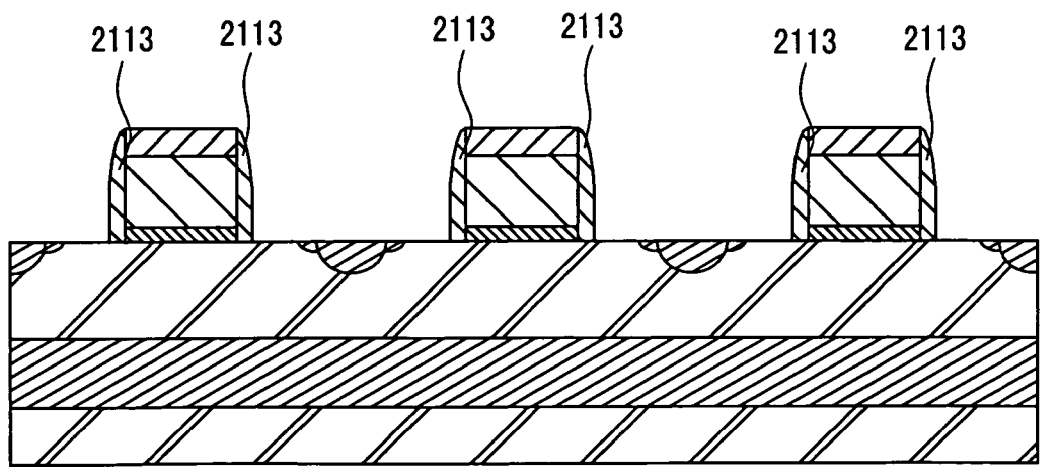
FIG. 26 is a cross-sectional view in a plane parallel with the word lines for illustrating the process of fabricating the semiconductor memory device according to Embodiment 2.
Figure 30:
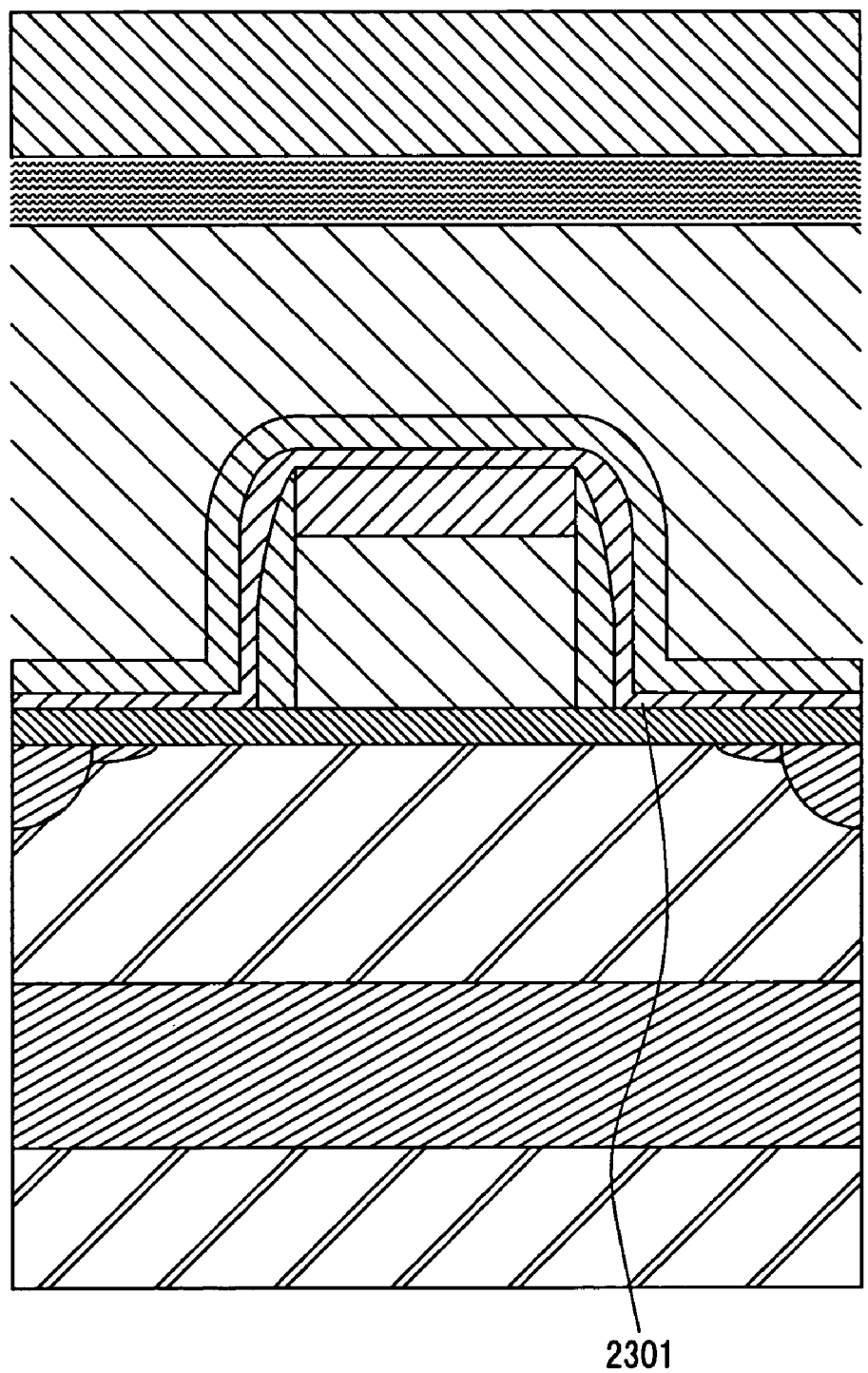
FIG. 30 is a cross-sectional view of the semiconductor memory element according to Embodiment 2 in which charge storage regions are composed of silicon nitride.
Figure 31:
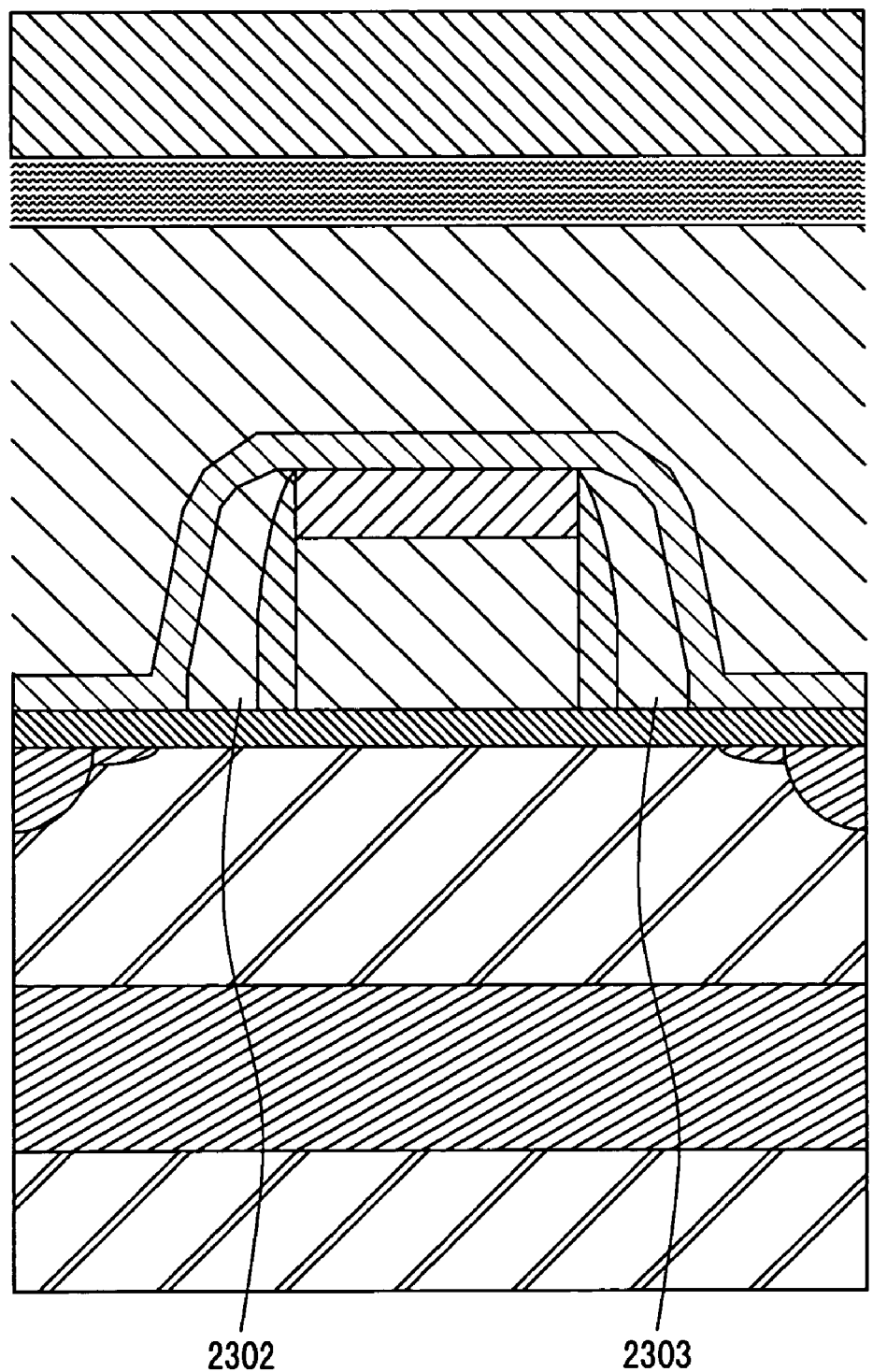
FIG. 31 is a cross-sectional view of the semiconductor memory element according to Embodiment 2 in which the charge storage regions are composed of polysilicon.

The multi-bit technology which enables storage of binary or higher-order information in each of the cells of the memory elements and characterizes the present embodiment is realized by dispersively storing charges in spatially divided regions such as the insulated silicon grains. Therefore, the technology can also be realized if the charge storage regions are composed of a silicon nitride film 2301 having charge trap sites therein, as shown in FIG. 30. Since the use of the silicon nitride film achieves a reduction in the film thickness of the charge storage region, it has advantages of reduced fabrication steps using dry etching and the like over the use of the plurality of silicon grains. Instead of the silicon nitride film, it is also possible to use a silicon oxynitride film similarly capable of trapping charges. The same effects are also achievable by using floating gate electrodes 2302 and 2303 composed of polysilicon, as shown in FIG. 23. In the case of using the floating gate electrodes composed of polysilicon, it is possible to provide intensified capacitive coupling between the floating gate electrodes, an assist gate electrode, and a control gate electrode so that the advantages of lower-voltage write, read, and erase operations are offered.

Embodiment 3

Figure 32:
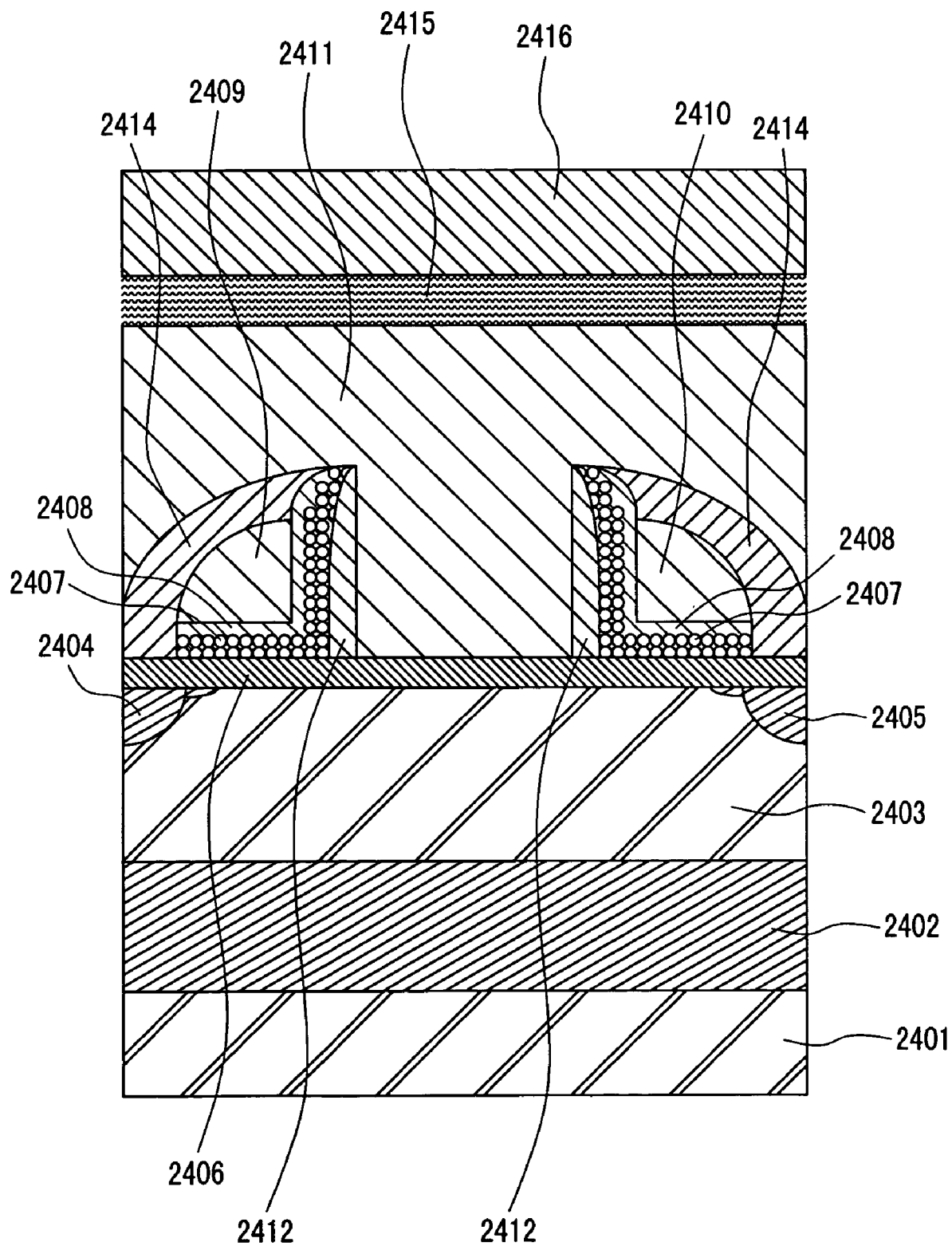
FIG. 32 is a cross-sectional view of a semiconductor memory element according to Embodiment 3.

FIG. 32 shows a cross-sectional structure of the semiconductor memory element according to the present embodiment. The memory element has a triple well structure in which an n-type well region 2402 is provided in a p-type silicon substrate 2401 and a p-type well region 2403 is provided therein. In the p-type well region 2403, n-type diffusion regions are present to form a source region 2404 and a drain region 2405. A gate oxide film 2406 composed of silicon dioxide with a thickness of 7 nm is present on a channel region between the source region 2404 and the drain region 2405. First and second assist gate electrodes 2409 and 2410 each composed of n-type polysilicon with a thickness of 50 nm are provided on the gate insulating film 2406 with a plurality of silicon grains 2407 each having a diameter of about 10 mm and a silicon dioxide thin film 2408 interposed therebetween. A control gate 2411 is also provided on the gate insulating film 2406 in such a manner as to cover the first and second assist gate electrodes 2409 and 2410. A multilayer film consisting of the silicon dioxide thin film 2408, the plurality of silicon grains 2407 each having a diameter of about 10 nm, and sidewall structures 2412 each composed of silicon dioxide or a silicon nitride thin film 2414 is present between the first or second assist gate electrode 2409 or 2410 and the control gate electrode 2411. A tungsten silicide 2415 and a silicon dioxide 2416 are stacked on the control gate electrode 2411.

Figure 33:
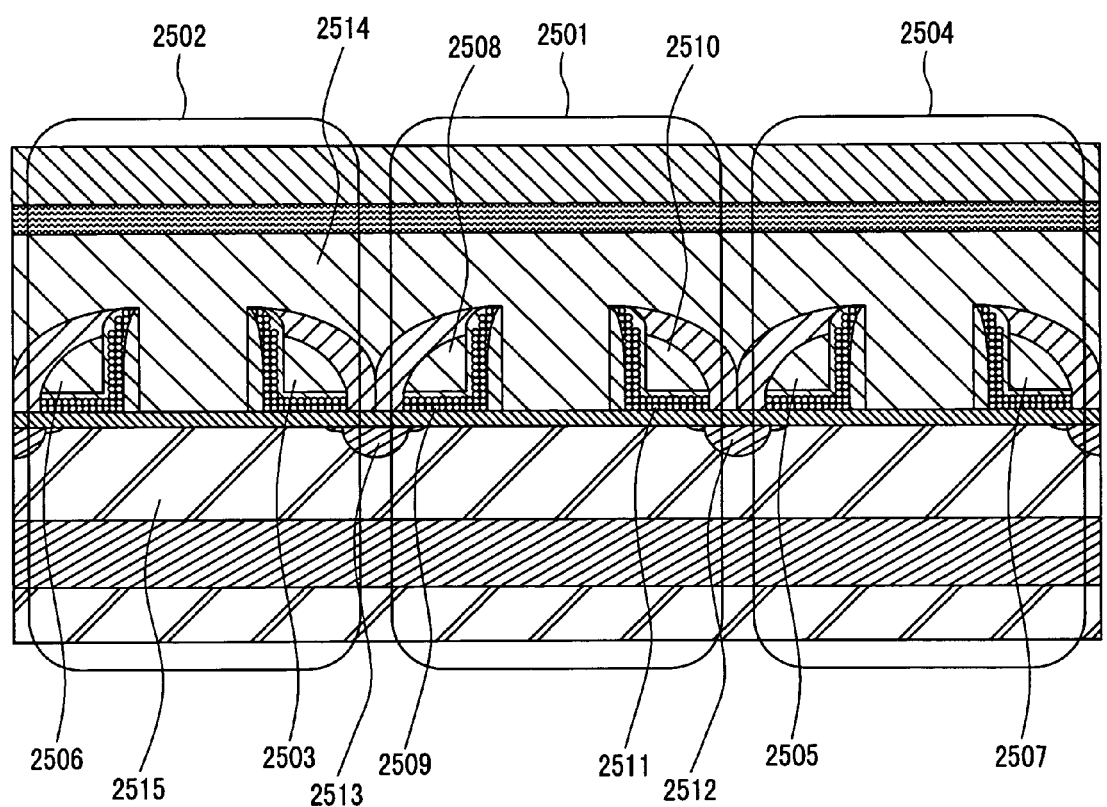
FIG. 33 is a cross-sectional view of an arrangement of the plurality of semiconductor memory elements according to Embodiment 3.

Referring to FIG. 33, a description will be given next to the operation of the semiconductor memory element according to the present embodiment. Since the semiconductor memory element according to the present embodiment operates in cooperation with adjacent elements, three adjacent semiconductor memory elements are shown in FIG. 33.

The description will be given first to the writing of information by taking, as an example, the case where information is written in a semiconductor memory element 2501. To prevent the destruction of information in the adjacent memory elements, 0 V or a negative voltage is applied to the second assist gate electrode 2503 of the memory element 2502 adjacent to the memory element 2501 and to the first assist gate electrode 2505 of the adjacent memory element 2504 located on the side opposite to the memory element 2502, thereby electrically disconnecting the memory element 2501 from the adjacent memory elements 2502 and 2504. For the electric disconnection, it is also possible to simultaneously apply 0 V or a negative voltage to the first assist gate electrode 2506 of the memory element 2502 and to the second assist gate electrode 2507 of the memory element 2504, in addition to the second assist gate electrode 2503 and the first assist gate electrode 2505, and thereby electrically disconnect the memory element 2501 from the adjacent memory elements 2502 and 2504. Thus, the use of the four gate electrodes of the memory elements 2503, 2505, 2506, and 2507 improves a disconnection property and reduces the gate length of each of the first and second assist gate electrodes, thereby achieving a reduction in the area of the memory elements, i.e., a cost reduction.

A write operation is performed by independently injecting charges into a charge storage region 2509 composed of a plurality of silicon grains present under a first assist gate electrode 2508 and into a charge storage region 2511 composed of a plurality of silicon grains present under a second assist gate electrode 2510. In the case of storing charges in the charge storage region 2509, 0 V, 5 V, 7 V, 1.5 V, and 14 V are applied to a drain region 2512, to a source region 2513, to the second assist gate electrode 2510, to a control gate electrode 2514, and to the first assist gate electrode 2508, respectively. At this time, the channel underlying each of the first and second assist gate electrodes 2508 and 2510 is brought into a low-resistance state through strong inversion, while the channel underlying the control gate electrode 2514 is brought into a high-resistance state through weak inversion. Accordingly, a voltage drop between the source and drain mostly occurs at a connecting portion between the channel underlying the control gate electrode 2514 and the channel underlying the first assist gate electrode 2508. As a result, an electric field concentrates on the portion so that hot electrons are generated only in the portion. The hot electrons generated are accelerated by an electric field resulting from the first assist gate electrode 2508 and injected into the charge storage region 2509. Since hot electrons are barely generated in the vicinity of the channel underlying the assist gate electrode 2510, the injection of electrons barely occurs in the charge storage region 2511 underlying the second assist gate electrode 2510. This allows the injection of electrons into the charge storage region 2509 independent of the injection of electrons into the charge storage region 2511. Since the method allows high-efficiency generation of hot electrons, power consumed by the write operation can be reduced so that a high-speed write operation is performed. By controlling the total number of electrons injected into the charge storage region 2509 by using a plurality of levels which are 4 or more levels, only the charge storage region 2509 can store quaternary, i.e., 2 or more bits of information. In the case of storing charges in the charge storage region 2511 underlying the second assist gate electrode 2510, 0 V, 5 V, 7 V, 1.5 V, and 14 V are applied to the source region 2513, to the drain region 2512, to the first assist gate electrode 2508, to the control gate electrode 2514, and to the second assist gate electrode 2510, respectively. At this time, the channel underlying each of the first and second assist gate electrodes 2508 and 2510 becomes low in resistance, while the channel underlying the control gate electrode 2514 become high in resistance. Accordingly, a voltage drop between the source and drain mostly occurs at a connecting portion between the channel underlying the control gate electrode 2514 and the channel underlying the second assist gate electrode 2510. As a result, an electric field concentrates on the portion so that hot electrons are generated only in the portion. The hot electrons generated are accelerated by an electric field resulting from the second assist gate electrode 2510 and injected into the charge storage region 2511. If quaternary information is stored in each of the charge storage regions 2509 and 2511, hexadecimal, i.e., 4 bits of information can be stored in one element so that fabrication cost is reduced. It will easily be appreciated that a further reduction in fabrication cost is achievable by storing quaternary or higher-order information in one of the charge storage regions and storing 4 or more bits of information in one memory element.

A description will be given to the erasing of information. The description will be given first to a method for erasing information stored in the charge storage region 2509 therefrom. First, 0 V is applied to the p-type well 2515, while −20

V is applied to the first assist gate electrode 2508. At this time, electrons stored in the charge storage region 2509 are extracted therefrom into the substrate by a tunneling effect termed F-N tunneling caused by an electric field resulting from the first assist gate electrode 2508. Likewise, 0 V is applied to the p-type well 2515, while −20 V is applied to the second assist gate electrode 2510, to erase information stored in the charge storage region 2511 therefrom. At this time, electrons stored in the charge storage region 2511 are extracted into the substrate by the F-N tunneling effect. Otherwise, it is also possible to apply +20 V to each of the first and second assist gate electrodes 2508 and 2510 and thereby extract electrons in the charge storage regions therefrom into the first and second assist gate electrodes 2508 and 2510, respectively. In the arrangement, a negative voltage is no more necessary for the operation of the memory element so that the area of the peripheral circuit is reduced successively and cost is effectively reduced thereby. In contrast to the erase operations using the F-N tunneling according to Embodiments 1 and 2 which apply voltages to the gate electrodes extending in parallel with the source 2513 and 2512 and thereby extract electrons, the erase operation using the F-N tunneling according to the present embodiment is characterized by the application of voltages to the gate electrodes extending in directions orthogonal to the source 2513 and the drain 2512.

A description will be given next to the reading of information. The description will be given first to the case of reading information stored in the charge storage region 2509 therefrom. First, 0 V or a negative voltage is applied to the second assist gate electrode 2503 of the adjacent memory element 2502 and to the first assist gate electrode 2505 of the adjacent memory element 2504, thereby electrically disconnecting the adjacent memory elements 2502 and 2504. Then, 0 V and 3 V are applied to the source 2513 and to the control gate electrode 2514, respectively, while 7 V is further applied to the second assist gate electrode 2510. Since the voltage applied to the second assist gate electrode is sufficiently high, it becomes possible to bring the channel underlying the second assist gate electrode into a low-resistance state irrespective of the number of electrons stored in the charge storage region 2511 and read the information in the charge storage region 2509 therefrom independently of the charge storage region 2511. Then, 1 V is applied to the drain 2512. Subsequently, a voltage pulse is applied to the first assist gate electrode 2508 and a current or voltage in the drain 2512 is monitored, whereby the information stored in the charge storage region 2509 is read therefrom. To read information stored in the charge storage region 2511 therefrom, 0 V or a negative voltage is applied to the second assist gate electrode 2503 of the adjacent memory element 2502 and to the first assist gate electrode 2505 of the adjacent memory element 2504, thereby electrically disconnecting the adjacent memory elements 2502 and 2504. For the electric disconnection, it is also possible to simultaneously apply 0 V or a negative voltage to the first assist gate electrode 2506 of the memory element 2502 and to the second assist gate electrode 2507 of the memory element 2504, in addition to the second assist gate electrode 2503 and the first assist gate electrode 2505, and thereby electrically disconnect the memory element 2501 from the adjacent memory elements 2502 and 2504, in the same manner as in the write operation. Since the use of the four gate electrodes of the memory elements 2503, 2505, 2506, and 2507 improves a disconnection property and reduces the gate length of each of the first and second assist gate electrodes, a reduction in the area of the memory elements, i.e., a cost reduction can also be achieved similarly.

A description will be given to a semiconductor memory device in which a plurality of the semiconductor memory elements are arranged.

Figure 34:
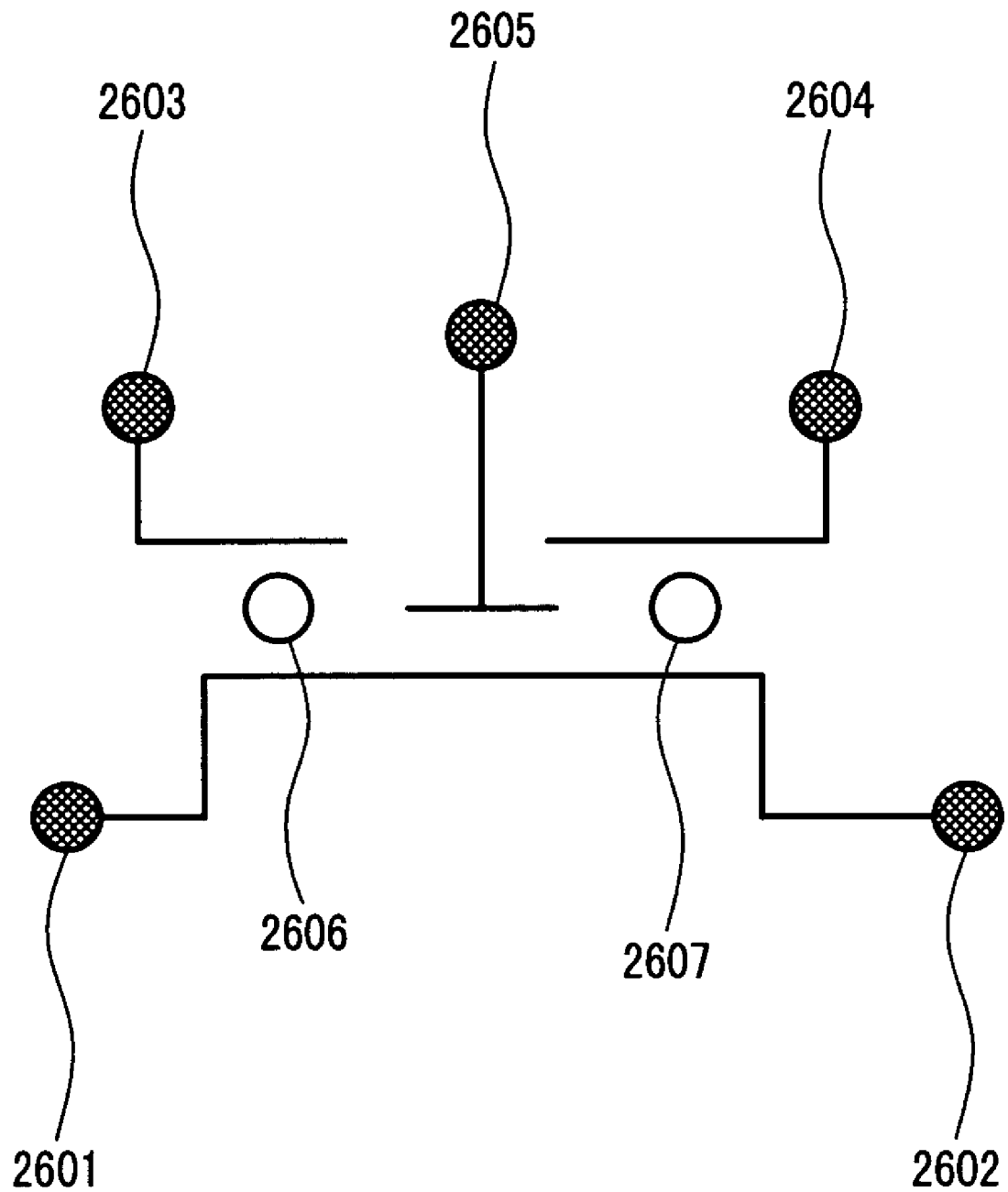
FIG. 34 is a representation on a circuit diagram which corresponds to the semiconductor memory element according to Embodiment 3.

FIG. 34 is a representation on a circuit diagram which corresponds to a single memory element according to the present embodiment. A source 2601 and a drain 2602 correspond to 2513 and 2512 in FIG. 33, respectively, while a first assist gate electrode 2603 and a second assist gate electrode 2604 correspond to 2508 and 2510 in FIG. 33, respectively. A control gate electrode 2605 corresponds to 2514 in FIG. 33, while charge storage regions 2606 and 2607 correspond to 2509 and 2511 in FIG. 33, respectively.

Figure 35:
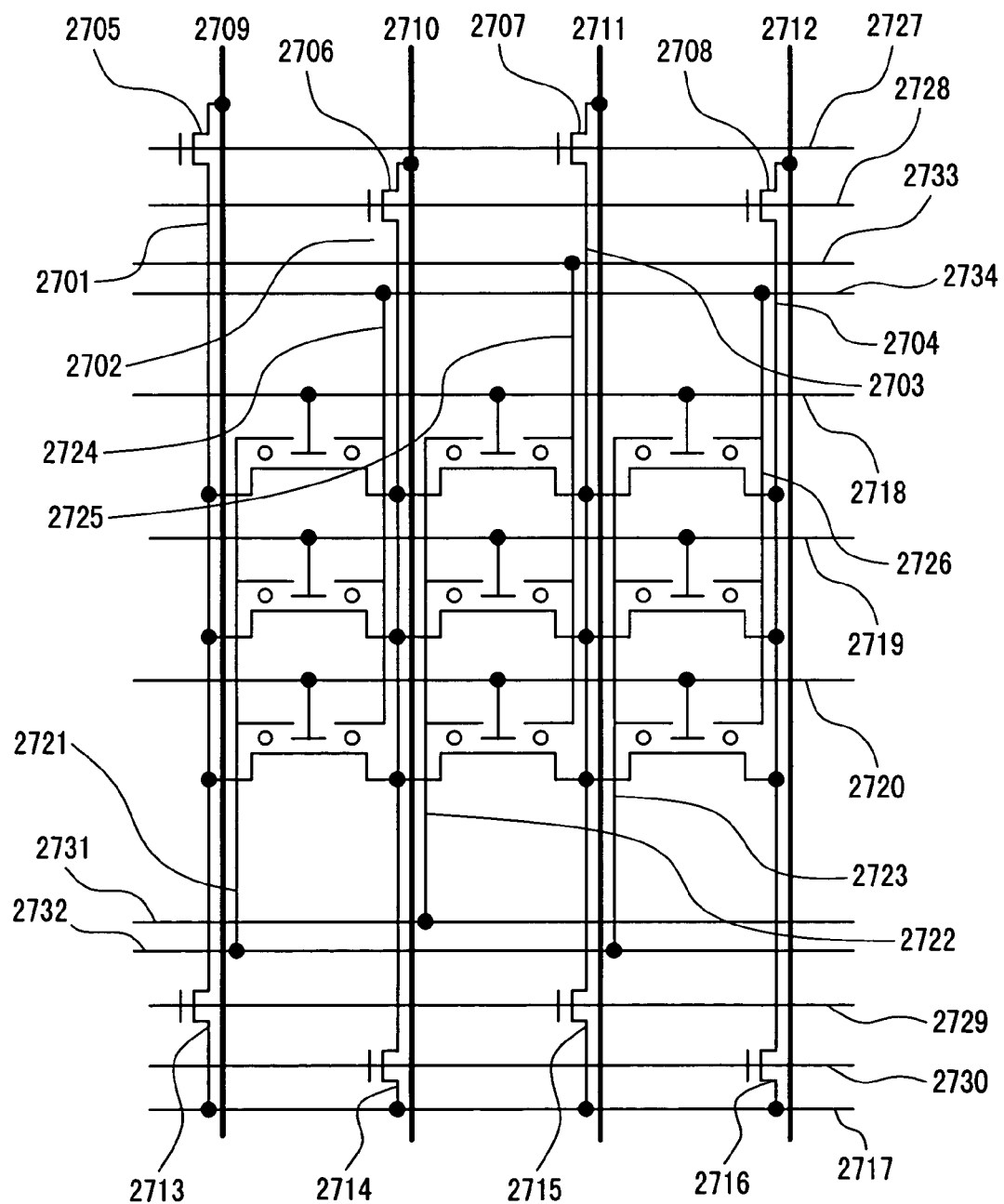
FIG. 35 shows an equivalent circuit of a semiconductor memory device according to Embodiment 3.
Figure 36:
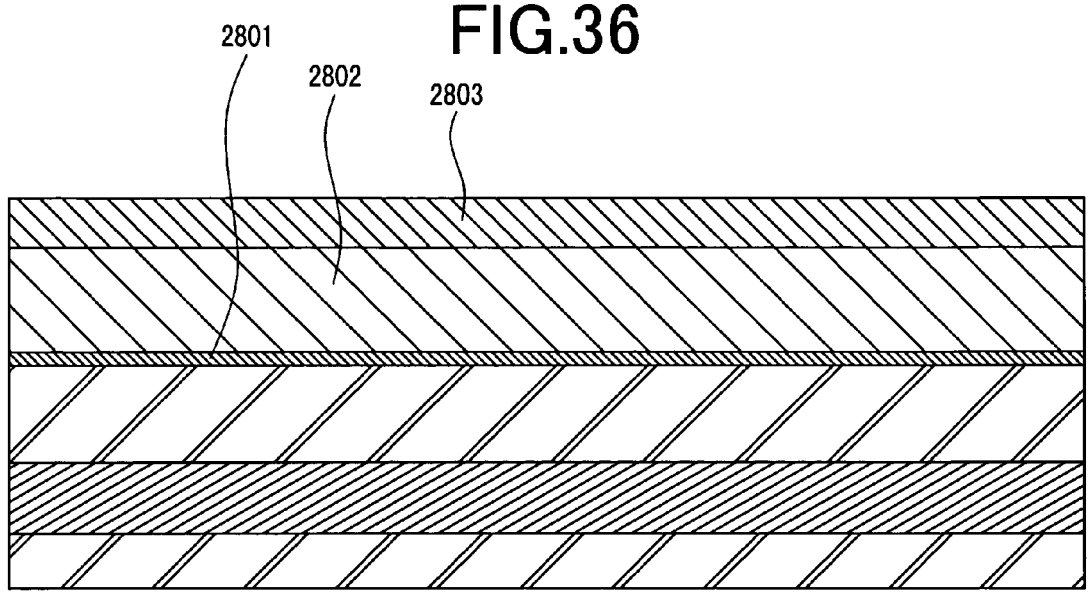
FIG. 36 is a cross-sectional view in a plane parallel with word lines for illustrating the process of fabricating the semiconductor memory device according to Embodiment 3.
Figure 37:
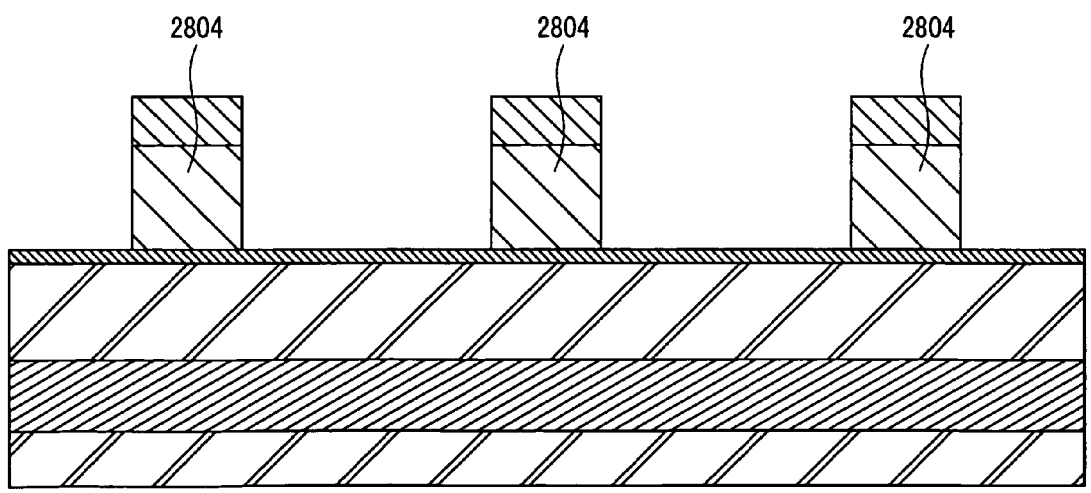
FIG. 37 is a cross-sectional view in a plane parallel with the word lines for illustrating the process of fabricating the semiconductor memory device according to Embodiment 3.
Figure 38:
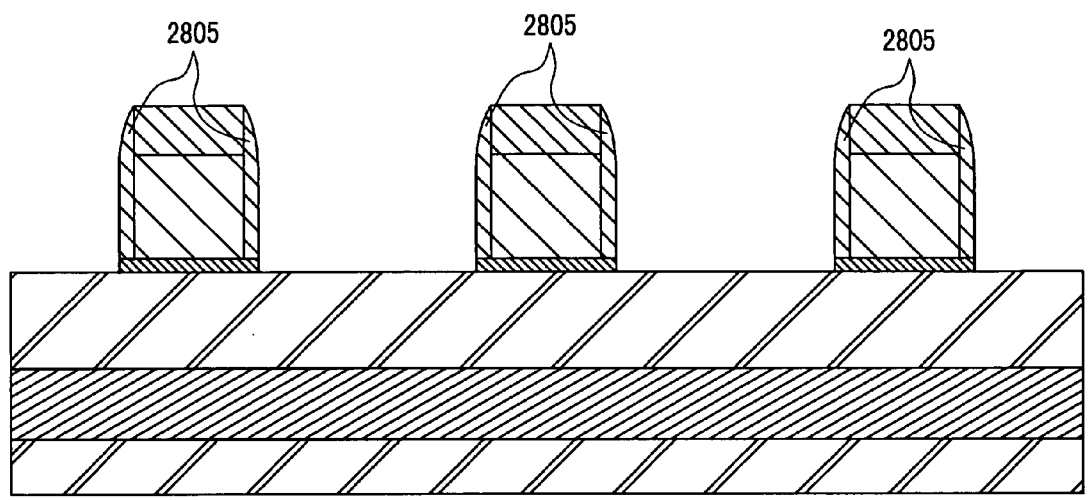
FIG. 38 is a cross-sectional view in a plane parallel with the word lines for illustrating the process of fabricating the semiconductor memory device according to Embodiment 3.
Figure 39:
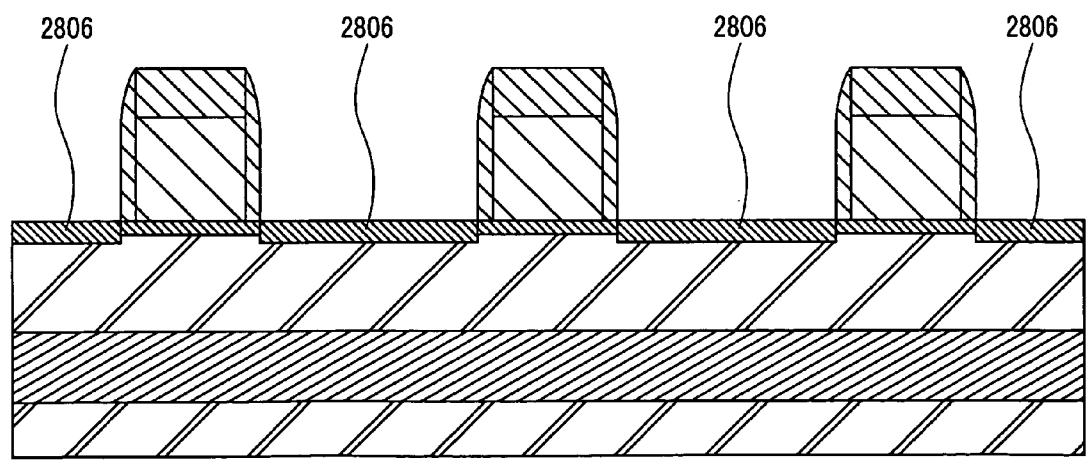
FIG. 39 is a cross-sectional view in a plane parallel with the word lines for illustrating the process of fabricating the semiconductor memory device according to Embodiment 3.
Figure 40:
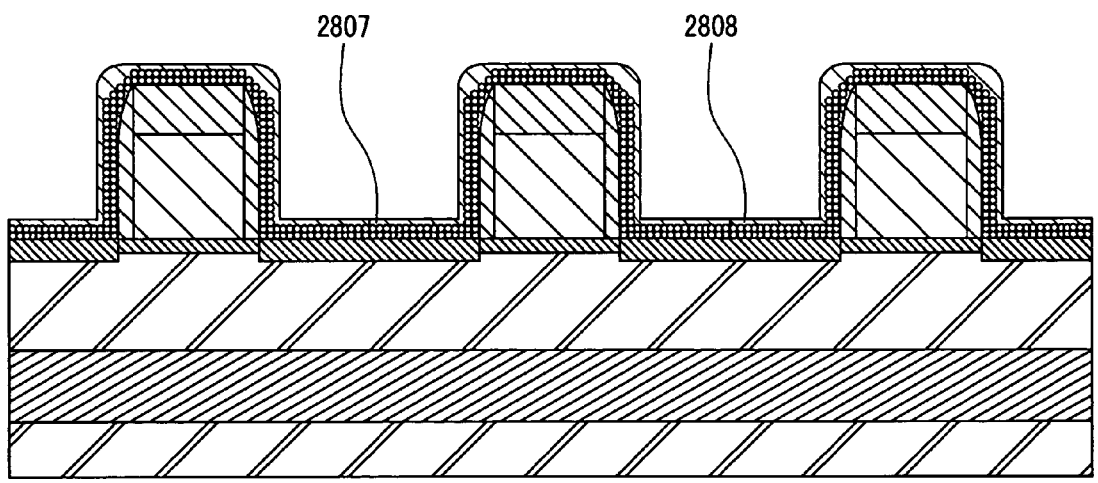
FIG. 40 is a cross-sectional view in a plane parallel with the word lines for illustrating the process of fabricating the semiconductor memory device according to Embodiment 3.
Figure 41:
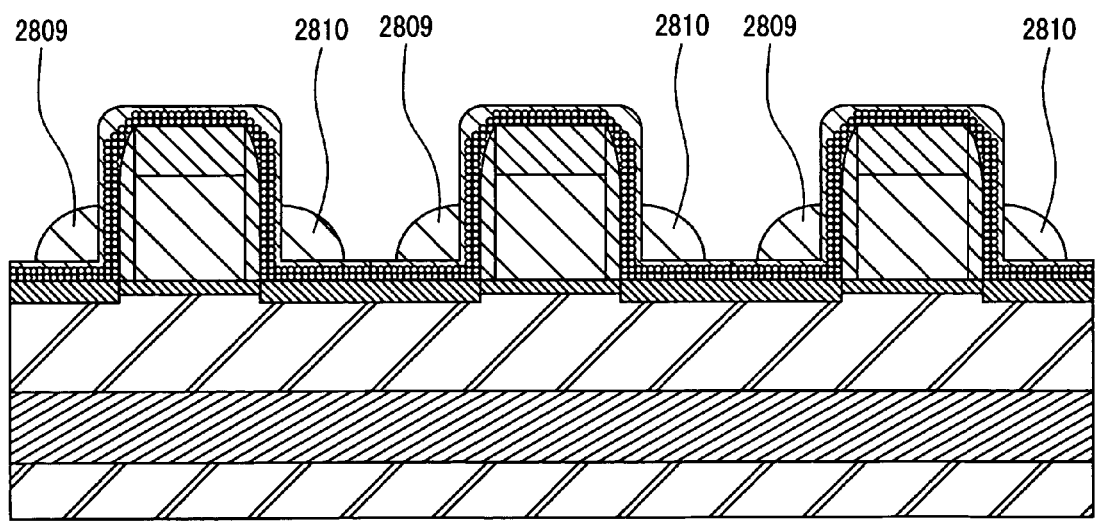
FIG. 41 is a cross-sectional view in a plane parallel with the word lines for illustrating the process of fabricating the semiconductor memory device according to Embodiment 3.
Figure 42:
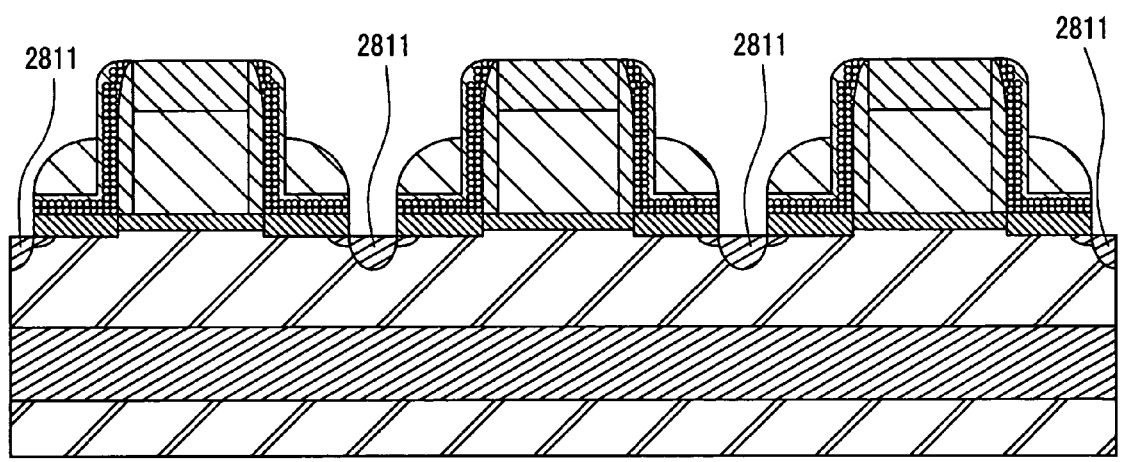
FIG. 42 is a cross-sectional view in a plane parallel with the word lines for illustrating the process of fabricating the semiconductor memory device according to Embodiment 3.
Figure 43:
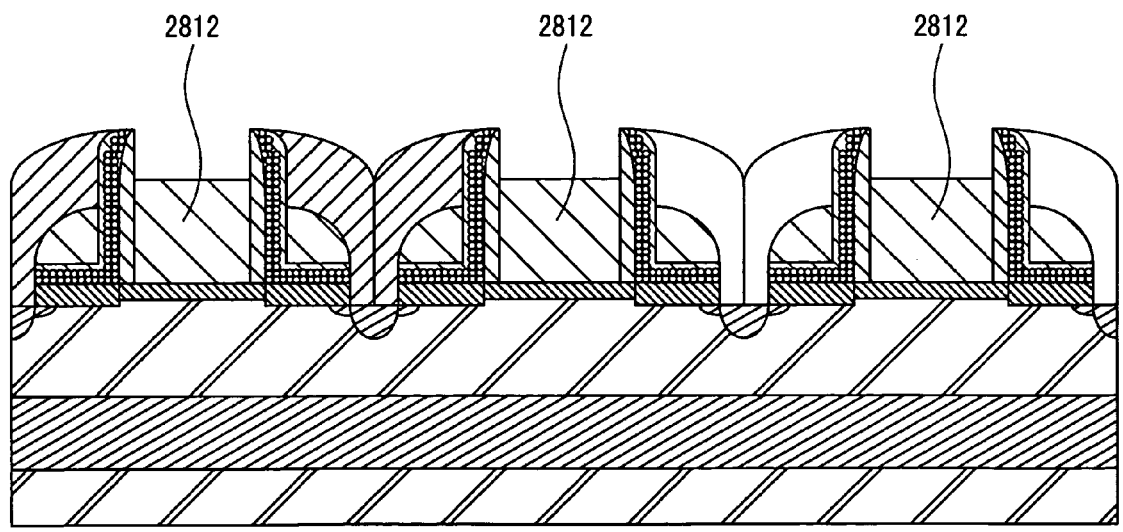
FIG. 43 is a cross-sectional view in a plane parallel with the word lines for illustrating the process of fabricating the semiconductor memory device according to Embodiment 3.
Figure 44:
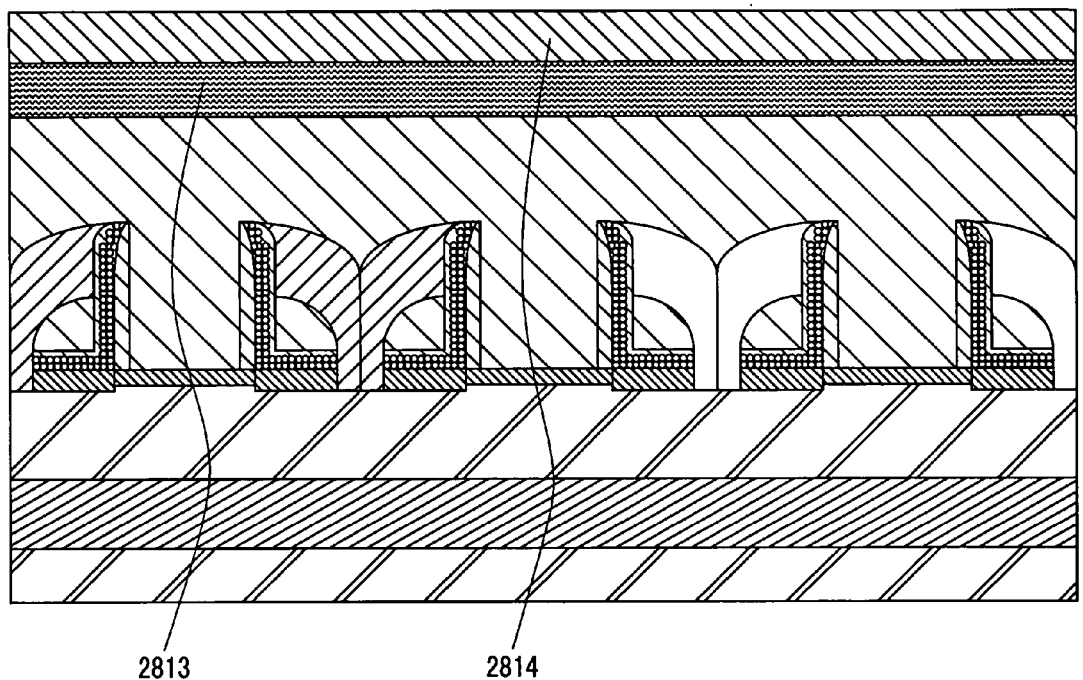
FIG. 44 is a cross-sectional view in a plane parallel with the word lines for illustrating the process of fabricating the semiconductor memory device according to Embodiment 3.

FIG. 35 is an equivalent circuit diagram of a semiconductor memory device in which a plurality of the semiconductor memory elements according to the present embodiment are arranged. Although the semiconductor memory device is actually composed of numerous memory elements, the equivalent circuit of the memory device shown herein is composed of 3×3 memory elements for purposes of illustration. Local bit lines 2701, 2702, 2703, and 2704 provide connections between the respective source regions or drain regions of the plurality of semiconductor memory elements at the respective diffusions thereof. Global bit lines 2709, 2710, 2711, and 2712 extending in directions parallel with the local bit lines are connected to these local bit lines via respective select transistors 2705, 2706, 2707, and 2708. A source line 2717 extending in a direction perpendicular to the local bit lines is also connected to the local bit lines via respective select transistors 2713, 2714, 2715, and 2716. Word lines 2718, 2719, and 2720 connect the respective control gates of the memory elements in directions orthogonal to the local bit lines. First assist gate lines 2721, 2722, and 2723 provide connections between the respective first assist gates of the memory elements in directions parallel with the local bit lines. Second assist gate lines 2724, 2725, and 2726 connect the respective second assist gates of the memory elements in directions parallel with the local bit lines. A first select line 2727 provides a connection between the gate electrode of the select transistor connecting the n-th (where n=1, 2, 3, . . . ) local bit line to the corresponding global bit line and the gate electrode of the select transistor connecting the (n+2)-th local bit line to the corresponding global bit line. A second select line 2728 provides a connection between the gate of the select transistor connecting the (n+1)-th local bit line to the corresponding global bit line and the gate of the select transistor connecting the (n+3)-th local bit line to the global bit line. In FIG. 35, the gate electrode of the select transistor 2705 and the gate electrode of the select transistor 2707 are connected to the first select line 2727, while the gate electrode of the select transistor 2706 and the gate electrode of the select transistor 2708 are connected to the second select line 2728. A third select line 2729 provides a connection between the gate electrode of the select transistor connecting the n-th local bit line to the source line and the gate electrode of the select transistor connecting the (n+2)-th local bit line to the source line. A fourth select 2730 line provides a connection between the gate of the select transistor connecting the (n+1)-th local bit line to the source line and the gate electrode of the select transistor connecting the (n+3)-th local bit line to the source line. In FIG. 35, the gate electrode of the select transistor 2713 and the gate electrode of the select transistor 2715 are connected to the third select line 2729, while the gate electrode of the select transistor 2714 and the gate electrode of the select transistor 2716 are connected to the fourth select line 2730. These select lines 2727, 2728, 2729, and 2830 extend in directions perpendicular to the local bit lines. The n-th first assist gate line is connected to the (n+2)-th first assist gate line and the (n+1)-th first assist gate line is connected to the (n+3)-th first assist gate line.

The corresponding ones in FIG. 35 are the first assist gate lines 2721 and 2723 connected to a line 2732. Likewise, the n-th second assist gate line is connected to the (n+2)-th second assist gate line and the (n+1)-th second assist gate line is connected to the (n+3)-th second assist gate line. The corresponding ones in FIG. 35 are the second assist gate lines 2724 and 2726 connected to a line 2734. By thus tying the even-numbered first and second assist gate lines and tying the odd-numbered first and second assist gate lines, an area reduction, i.e., a cost reduction can be achieved, while controllability is retained, in the same manner as in Embodiments 1 and 2.

A fabrication process according to the present embodiment will be described with reference to FIGS. 36 to 44. After the triple well structure is formed in a silicon substrate by ion implantation, B ions are implanted into a region located over a p-type well to adjust the threshold voltage. A gate oxide film 2801 for the control gate electrodes is formed by oxidizing the substrate surface. Subsequently, a polysilicon thin film 2802 and a silicon dioxide thin film 2803 are further deposited. By performing photolithography and dry etching, control gate electrodes 2804 are formed. Then, a silicon dioxide is deposited and etched back, thereby forming sidewall structures 2805. Subsequently, a gate insulating film 2806 for the first and second assist gate electrodes is formed by thermal oxidation. The insulating film to be formed may have the same thickness as the gate insulating film for the control gate electrodes or a thickness larger than that of the gate insulating film for the control gate electrodes for ensured reliability. After the charge storage regions are formed by repeating the deposition and plasma oxidation of polysilicon grains 2807 doped with phosphorus a plurality of times, a silicon dioxide thin film 2808 is deposited. Then, a polysilicon thin film doped with phosphorus is further deposited and etched back, thereby forming first and second assist gate electrodes 2809 and 2810. By using the first and second assist gate electrodes 2809 and 2910 as a mask, etching is performed to form openings for the source and drain regions. Arsenic ions are implanted into the source and drain regions through the openings from directions perpendicular to the substrate and from directions tilted at 60 degrees relative to the substrate. In the process step, impurity regions 2811 for the source and drain are formed. Then, a silicon nitride thin film is deposited and etched back to expose the polysilicon composing the control gate electrodes 2812. Thereafter, a polysilicon doped with phosphorus, a tungsten silicide 2813, and a silicon dioxide 2814 are deposited continuously and subjected to photolithography, thereby forming the control gate electrodes.

Figure 45:
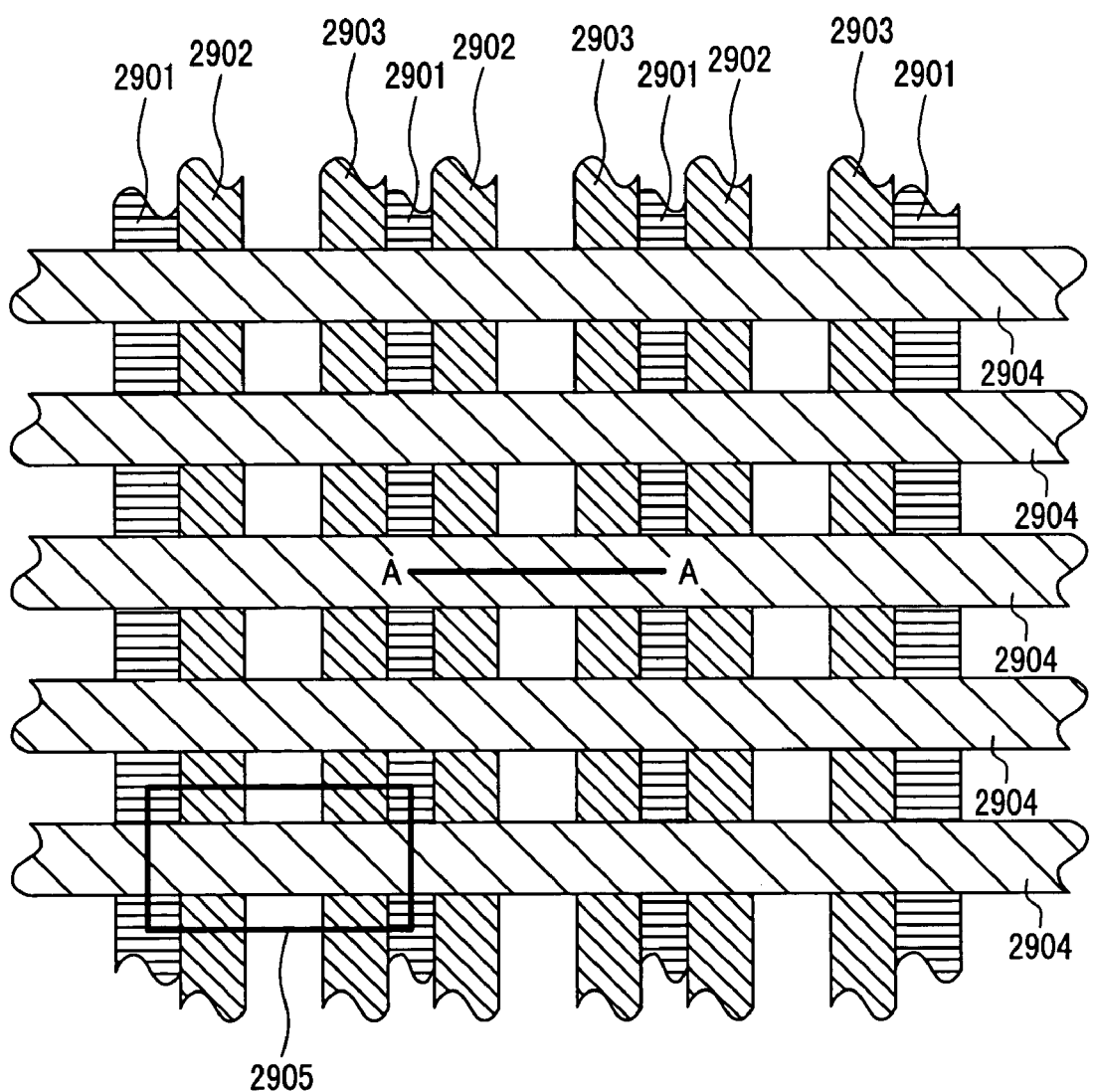
FIG. 45 is a plan view of the semiconductor memory device according to Embodiment 3.

FIG. 45 is a plan view of the semiconductor device according to the present embodiment. Local bit lines 2901 composed of the diffusions extend in parallel with assist gate lines 2902 and 2903 each composed of polysilicon. Word lines 2904 composed of polysilicon extend in directions orthogonal to the local bit lines 2901 and the assist gate lines 2902 and 2903. A cross-sectional view taken along the line A—A in FIG. 45 corresponds to FIG. 32. A minimum unit is a structure denoted by 2905 and, if a minimum feature size is F, the area thereof becomes $6F^2$ or less.

Figure 46:
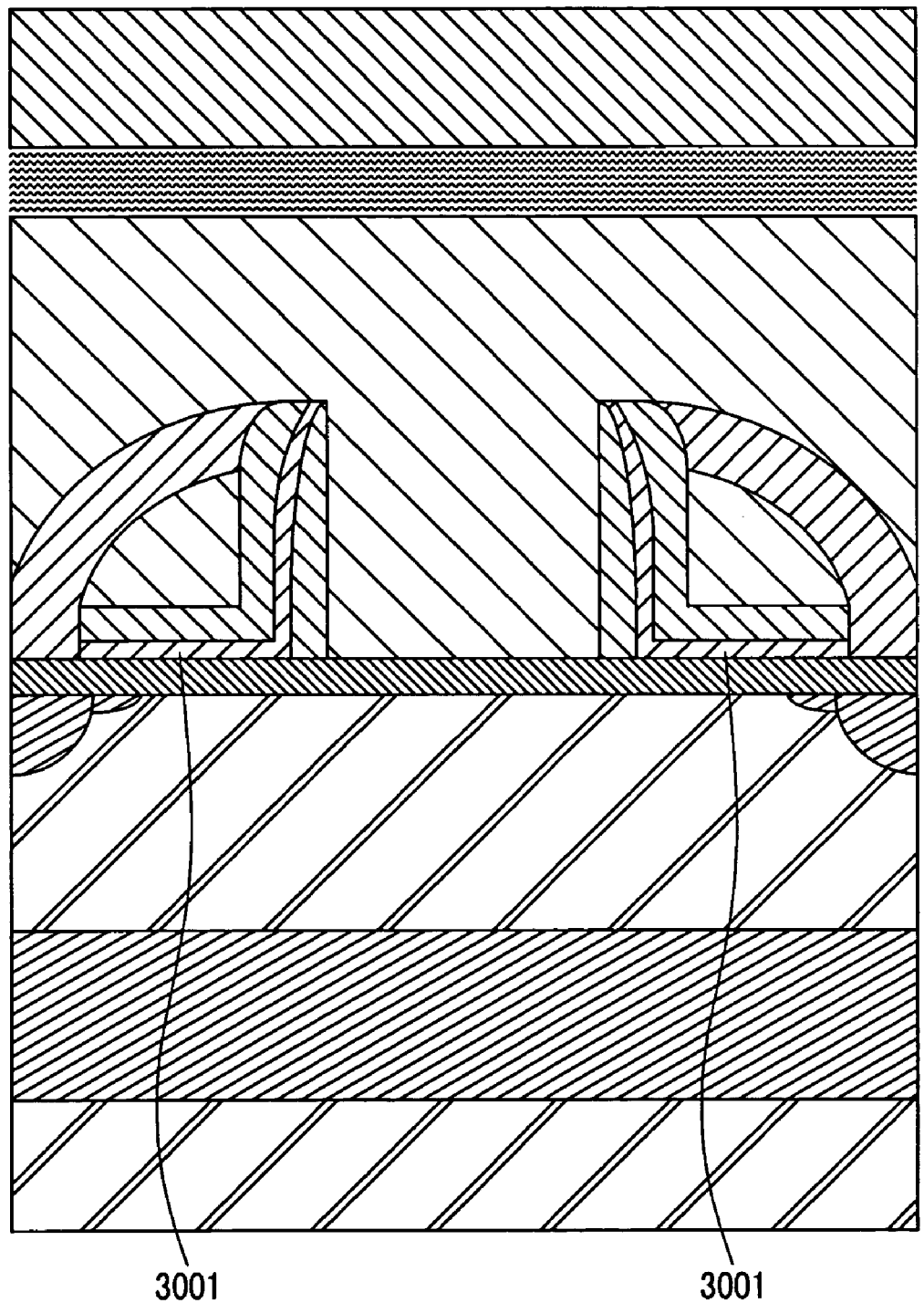
FIG. 46 is a cross-sectional view of the semiconductor memory element according to Embodiment 3 in which charge storage regions are composed of silicon nitride.
Figure 47:
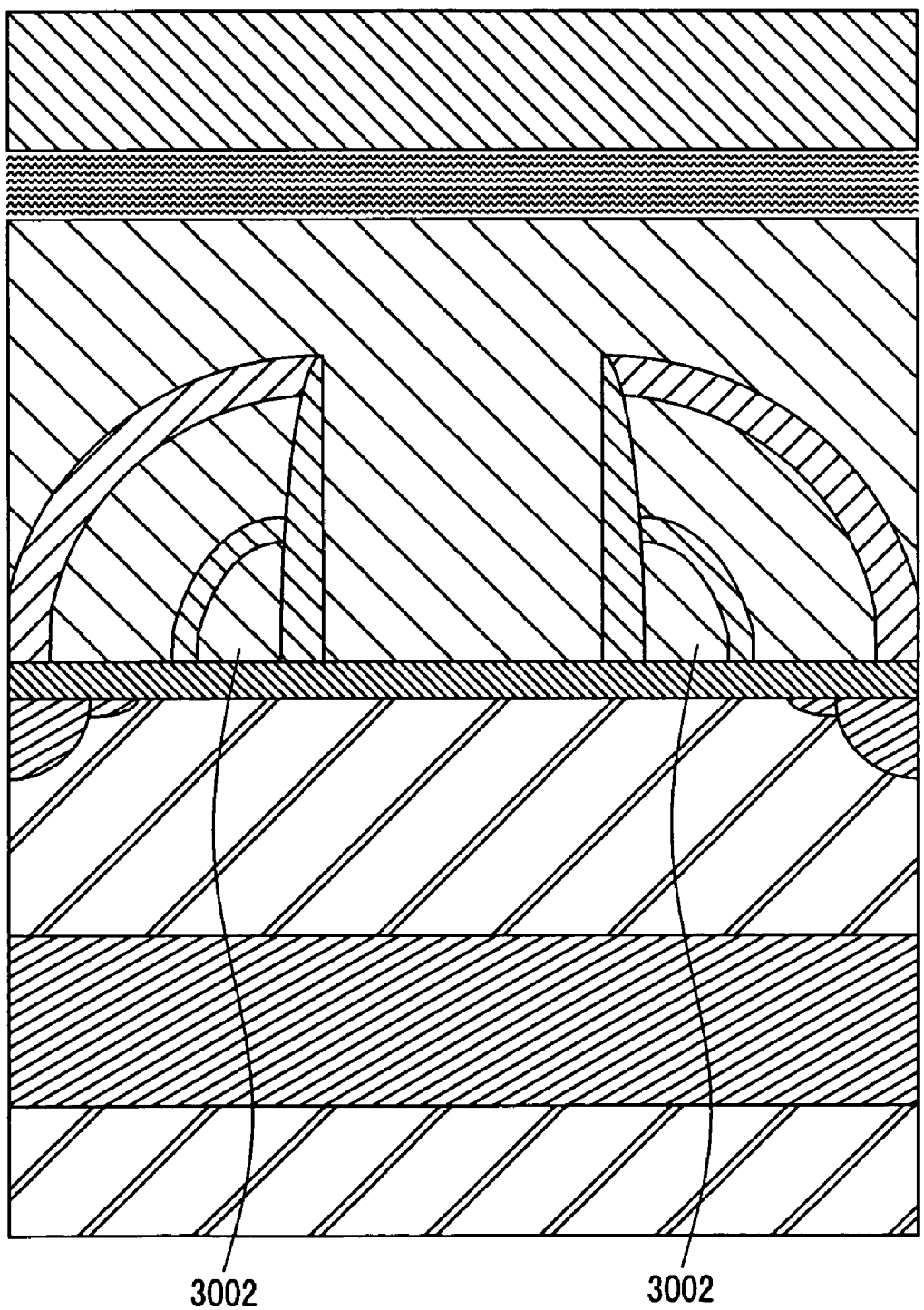
FIG. 47 is a cross-sectional view of the semiconductor memory element according to Embodiment 3 in which the charge storage regions are composed of polysilicon.

The multi-bit technology which enables storage of binary or higher-order information in each of the cells of the memory elements and characterizes the present embodiment is realized by dispersively storing charges in spatially divided regions such as the insulated silicon grains. Therefore, the technology can also be realized if the charge storage regions are composed of a silicon nitride film 3001 having charge trap sites therein, as shown in FIG. 46. Since the use of the silicon nitride film achieves a reduction in the film thickness of the charge storage region, it has advantages of reduced fabrication steps using dry etching and the like over the use of the plurality of silicon grains. Instead of the silicon nitride film, it is also possible to use a silicon oxynitride film similarly capable of trapping charges. The same effects are also achievable by using floating gates 3002 composed of polysilicon, as shown in FIG. 47. In the case of using the floating gates composed of polysilicon, it is possible to provide intensified capacitive coupling between the floating gates, a first assist gate, a second assist gate, and a control gate so that the advantages of lower-voltage write, read, and erase operations are offered.

Embodiment 4

Figure 48:
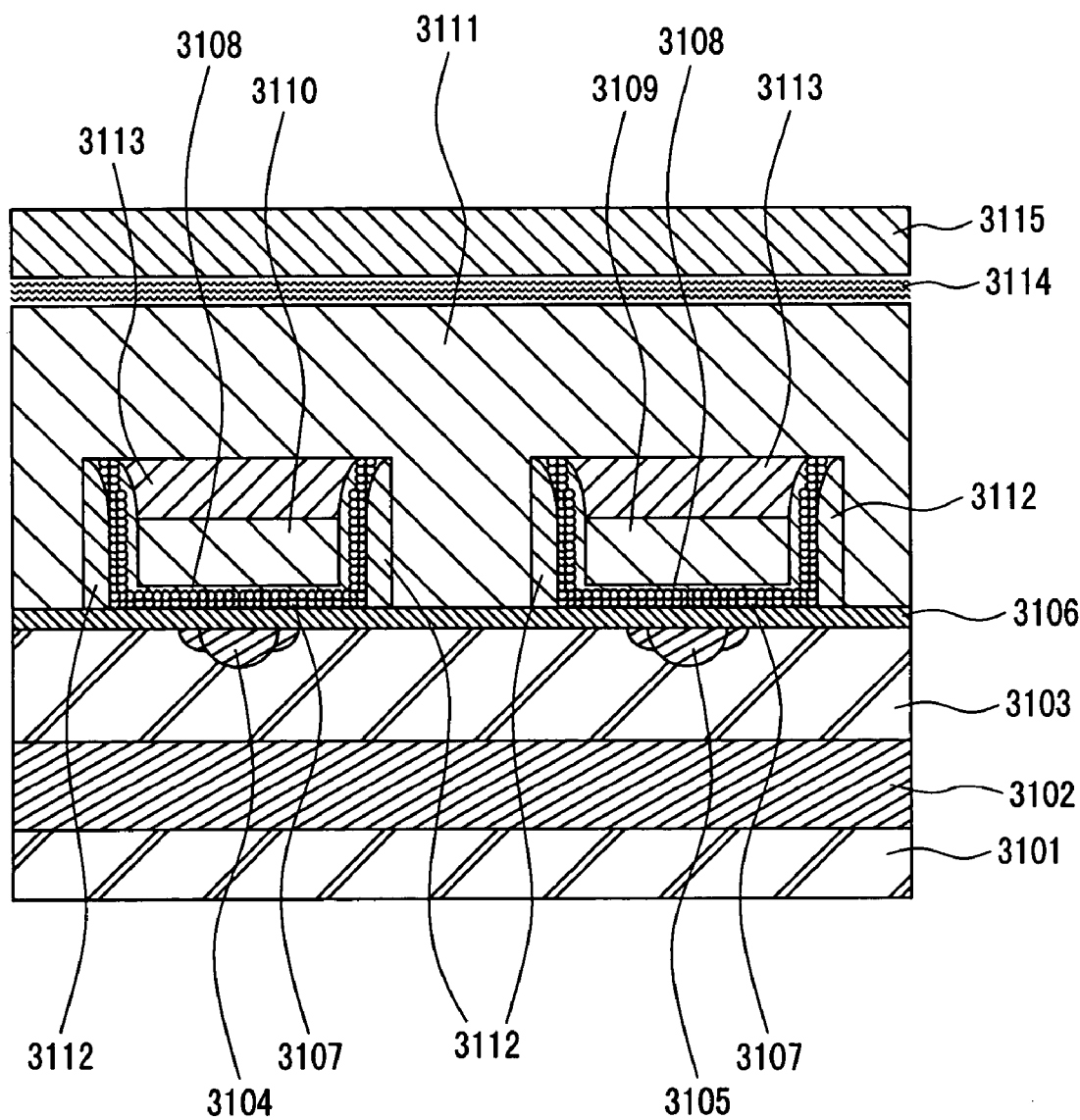
FIG. 48 is a cross-sectional view of a semiconductor memory element according to Embodiment 4.

FIG. 48 shows a cross-sectional structure of the semiconductor memory element according to the present embodiment. The memory element has a triple well structure in which an n-type well region 3102 is provided in a p-type silicon substrate 3101 and a p-type well 3103 is provided therein. In the p-type well region 3103, n-type regions are present to form a source region 3104 and a drain region 3105. An assist gate electrode 3110 composed of polysilicon is present on the channel region between the source and drain regions 3104 and 3105 in overlapping relation with the source region 3104 via a gate oxide film 3106, a plurality of silicon grains 3107 each having a diameter of about 10 nm, and a silicon dioxide thin film 3108. Likewise, an assist gate electrode 3109 is present in overlapping relation with the drain region 3105. These assist gate electrodes 3109 and 3110 are shared by the adjacent semiconductor memory elements. A control gate electrode 3111 is present on the insulating film 3106. In a direction perpendicular to the substrate, a silicon dioxide thin film 3112, the plurality of silicon grains 3107, and a silicon dioxide thin film 3108 are present between the control gate electrode 3111 and the assist gate electrode 3109. In a direction parallel with the substrate, a silicon nitride 3113 is present between the control gate electrode 3111 and the assist gate electrode 3109. A tungsten silicide 3114 and a silicon dioxide thin film 3115 are stacked on the control gate electrode 3111.

Figure 49:
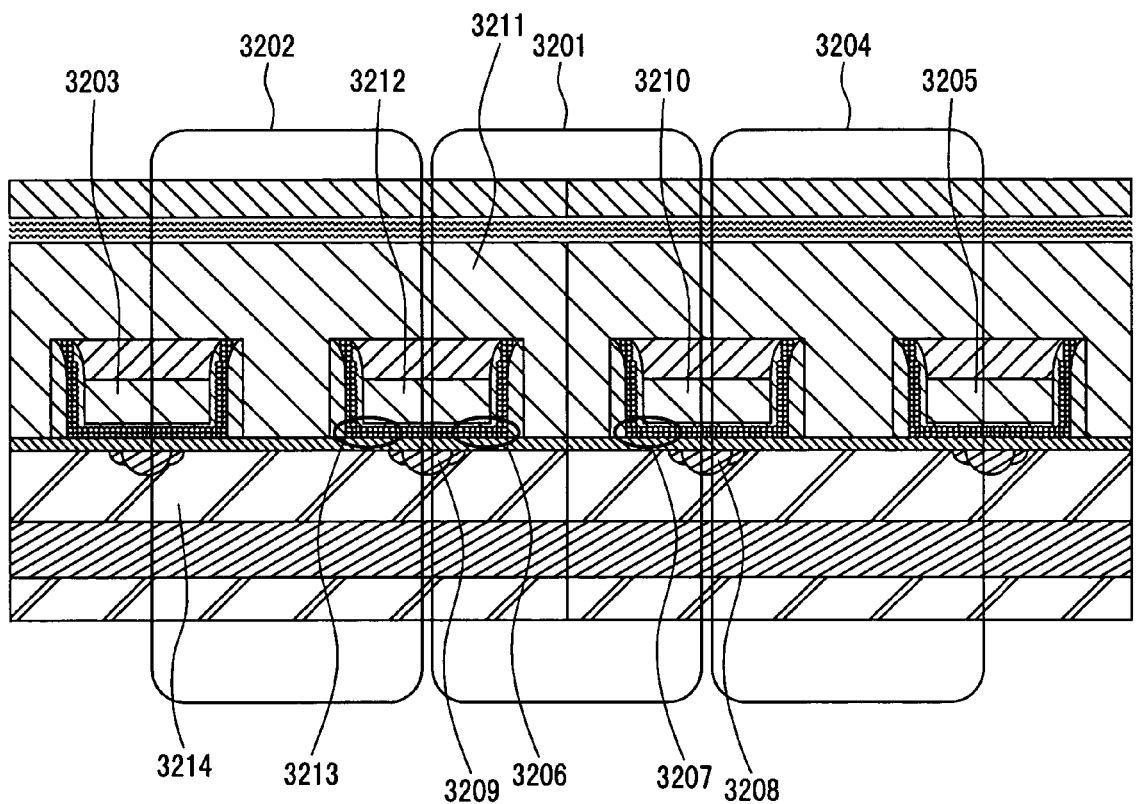
FIG. 49 is a cross-sectional view of an arrangement of the plurality of semiconductor memory elements according to Embodiment 4.

Referring to FIG. 49, a description will be given next to the operation of the semiconductor memory element according to the present embodiment. Since the semiconductor memory element according to the present embodiment operates in cooperation with adjacent elements, three adjacent semiconductor memory elements are shown in FIG. 49.

The description will be given first to the writing of information by taking, as an example, the case where information is written in a semiconductor memory element 3201. To prevent the destruction of information in the adjacent memory elements, 0 V or a negative voltage is applied to the assist gate electrode 3203 of the memory element 3202 adjacent to the memory element 3201 and to the assist gate electrode 3205 of the adjacent memory element 3204. At this time, the adjacent elements 3202 and 3204 are electrically disconnected by these assist gates 3203 and 3205, whereby the destruction of information is prevented. The writing of information is performed by independently injecting charges into charge storage regions 3206 and 3207 composed of a plurality of silicon grains. In the case of injecting charges in the charge storage region 3206, 0 V and 5 V are applied to a drain region 3208 and to a source region 3209, respectively, while 7 V is applied to the assist gate 3210. Irrespective of the number of electrons stored in the charge storage region 3207, the channel under the assist gate 3210 is brought into the low-resistance state. The control gate electrode 3211 is set to 1. 5 V, while the assist gate electrode 3212 is set to 14 V. At this time, the channel under each of the assist gate electrodes 3210 and 3212 is in the low-resistance state, while the channel under the control gate electrode 3211 is in the high-resistance state. Accordingly, a voltage drop between the source 3209 and the drain 3208 occurs at a connecting portion between the channel underlying the control gate electrode 3211 and the channel underlying the assist gate 3212. As a result, an electric field concentrates on the portion so that hot electrons are generated only in the portion. The hot electrons generated are accelerated by an electric field resulting from the assist gate 3212 and injected into the charge storage region 3206. Since hot electrons are barely generated in the channel underlying the assist gate 3210, the injection of electrons barely occurs in the charge storage region 3207. In the case of injecting charges in the charge storage region 3207, 0 V and 5 V are applied to the source region 3209 and to the drain region 3208, respectively, while 7 V is similarly applied to the assist gate 3212. Irrespective of the number of electrons stored in the charge storage region 3206, the channel under the assist gate 3212 is brought into the low-resistance state. The control gate electrode 3211 is set to 1. 5 V, while the assist gate electrode 3210 is set to 14 V. At this time, the channel under each of the assist gate electrodes 3210 and 3212 is in the low-resistance state, while the channel under the control gate electrode 3211 is in the high-resistance state. Accordingly, a voltage drop between the source 3209 and the drain 3208 occurs at a connecting portion between the channel underlying the control gate electrode 3211 and the channel underlying the assist gate 3210. As a result, an electric field concentrates on the portion so that hot electrons are generated only in the portion. The hot electrons generated are accelerated by an electric field resulting from the assist gate 3210 and stored in the charge storage region 3207. Since the method allows high-efficiency generation of hot electrons in the same manner as in Embodiments 1, 2, and 3, power consumed by the write operation can be reduced so that a high-speed write operation is performed. By controlling the total number of electrons injected into each of the charge storage regions 3206 and 3207 by using 4 or more levels, hexadecimal or higher-order, i.e., 4 or more bits of information corresponding to 16 values, i.e., 4 bits can be stored in one element so that bit cost is reduced in the same manner as in Embodiments 1, 2, and 3.

A description will be given to the erasing of information.

An erase operation is performed by erasing information stored in the charge storage regions underlying the assist gate therefrom. If the assist gate 3212 is taken as an example, it follows that the information stored in the charge storage regions 3206 and 3213 is erased simultaneously therefrom. First, 0 V and −20 V are applied to the p-type well 3214 and to the assist gate 3212, respectively. At this time, electrons stored in the charge storage regions 3206 and 3213 are extracted therefrom into the substrate by the F-N tunneling effect caused by an electric field resulting from the assist gate 3212 so that the erasing of the information is performed. It is also possible to extract the stored electrons into the assist gate, not into the substrate, by applying a positive voltage, e.g., +20 V to the assist gate electrode. In this case, an advantage of a simpler peripheral circuit structure is offered since a high negative voltage is not used for the operation.

A description will be given next to the reading of information. The description will be given first to the case of reading information stored in the charge storage region 3206 therefrom. To prevent the destruction of information in the adjacent memory elements, a 0 V or a negative voltage is applied to each of the assist gate electrode 3203 of the adjacent memory element 3202 and the assist gate electrode 3205 of the adjacent memory element 3204 in the same manner as in the write operation, thereby electrically disconnecting the adjacent memory elements. Then, 0V and 3.0 V are applied to the source 3209 and to the control gate 3211, respectively. Subsequently, 7 V is applied to the assist gate 3210 to bring the channel under the assist gate 3210 into a low-resistive state through strong inversion irrespective of the number of electrons stored in the charge storage region 3207, thereby enabling the reading of only the information stored in the charge storage region 3206. After 1 V is applied to the drain 3208, a voltage pulse is applied to the assist gate 3212 and a current or voltage in the drain 3208 is monitored, whereby the information stored in the charge storage region 3206 is read therefrom. In the case of reading information stored in the charge storage region 3207 therefrom, 0 V or a negative voltage is applied to each of the assist gate electrode 3203 of the adjacent memory element 3202 and the assist gate electrode 3205 of the adjacent memory element 3204, thereby electrically disconnecting these adjacent memory elements. Then, 7 V is applied to the assist gate 3212 to bring the channel under the assist gate 3212 into a low-resistance state irrespective of the number of electrons stored in the charge storage region 3206, thereby enabling the reading of only the information stored in the charge storage region 3207. After 1 V is applied to the source 3209, a voltage pulse is applied to the assist gate 3210 and a current or voltage in the source 3209 is monitored, whereby the information stored in the charge storage region 3207 is read therefrom.

A description will be given next to a semiconductor memory device in which a plurality of the semiconductor memory elements are arranged.

Figure 50:
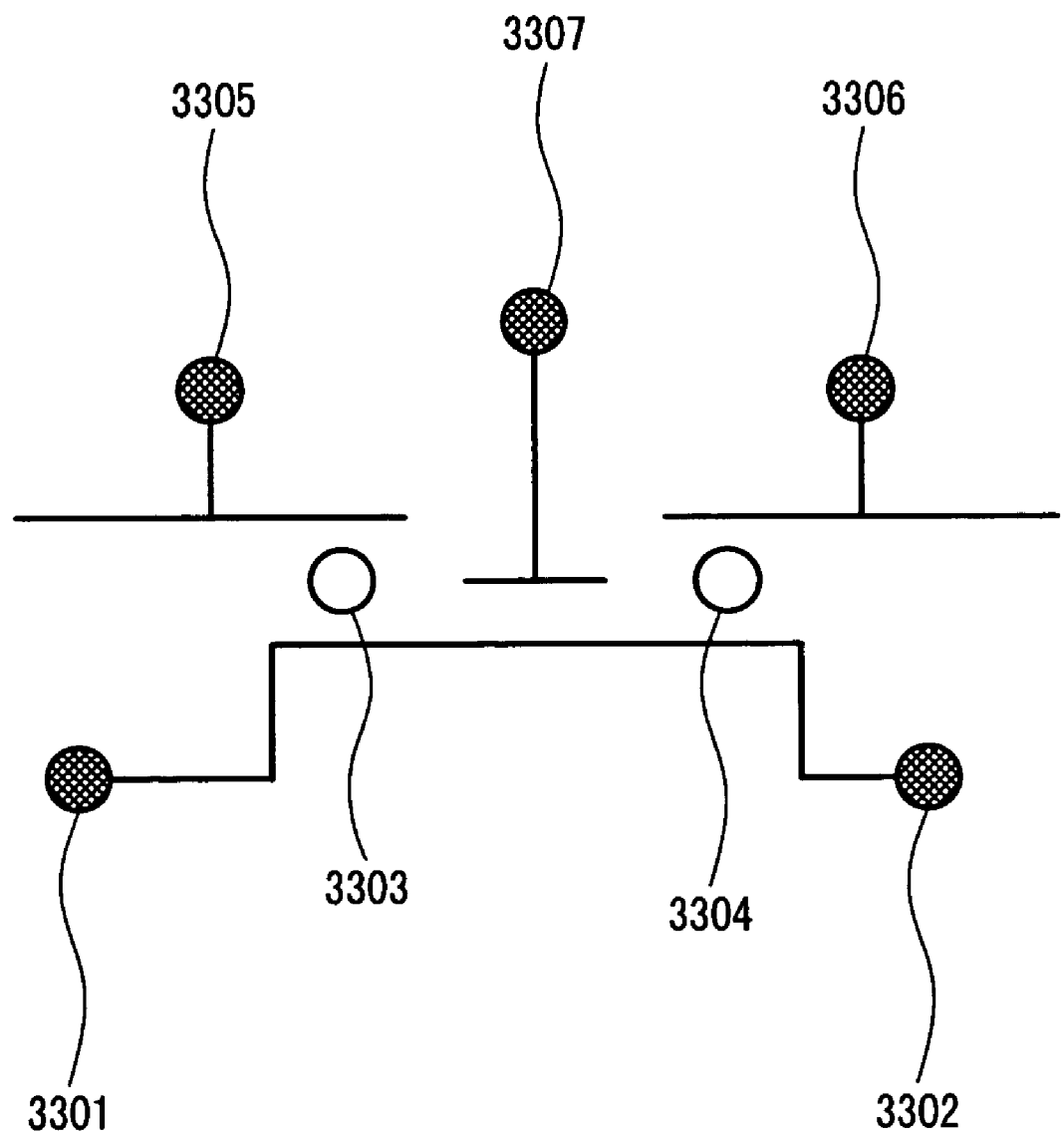
FIG. 50 is a representation on a circuit diagram which corresponds to the semiconductor memory element according to Embodiment 4.

FIG. 50 is a representation on a circuit diagram which corresponds to a single memory element according to the present embodiment. A source 3301 and a drain 3302 correspond to 3209 and 3208 in FIG. 49, respectively, while charge storage regions 3303 and 3304 correspond to 3206 and 3207 in FIG. 49. Assist gates 3305 and 3306 correspond to 3212 and 3210 in FIG. 49, while a control gate electrode 3307 corresponds to 3211 in FIG. 49.

Figure 51:
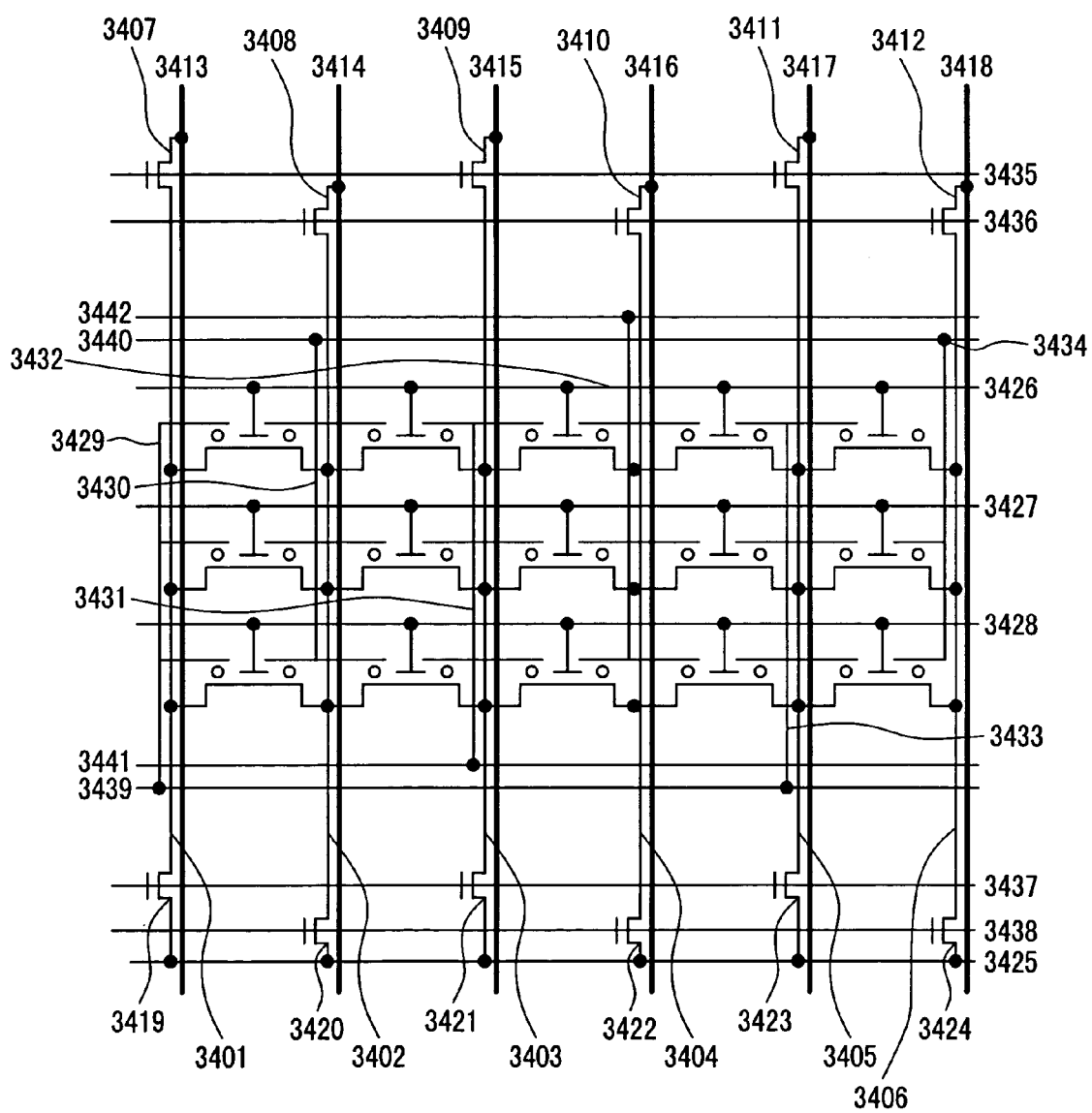
FIG. 51 shows equivalent circuit of a semiconductor memory device according to Embodiment 4.
Figure 52:
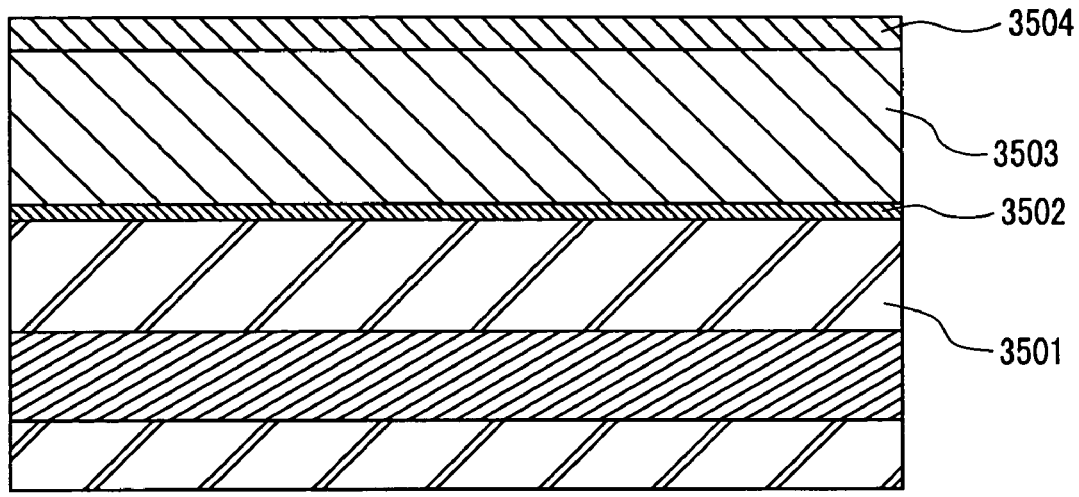
FIG. 52 is a cross-sectional view in a plane parallel with word lines for illustrating the process of fabricating the semiconductor memory device according to Embodiment 4.
Figure 53:
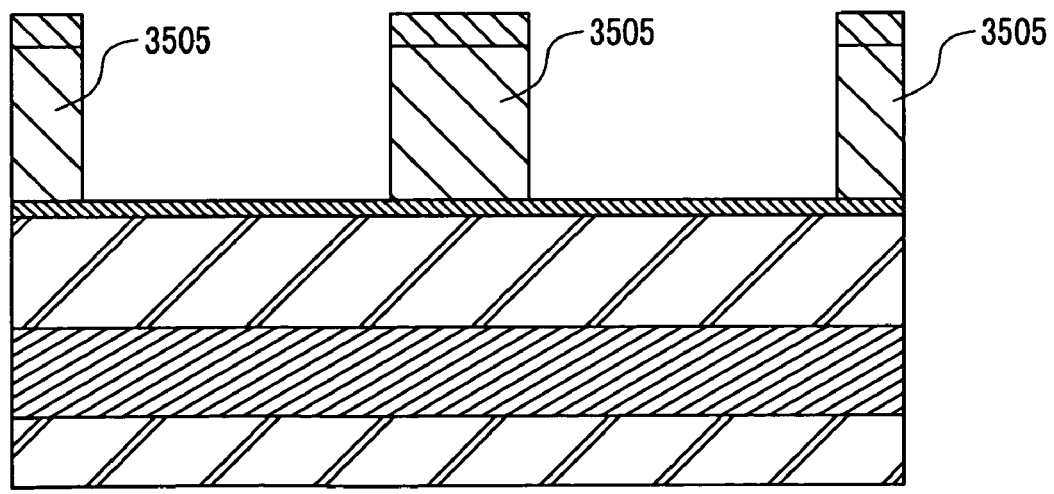
FIG. 53 is a cross-sectional view in a plane parallel with the word lines for illustrating the process of fabricating the semiconductor memory device according to Embodiment 4.
Figure 54:
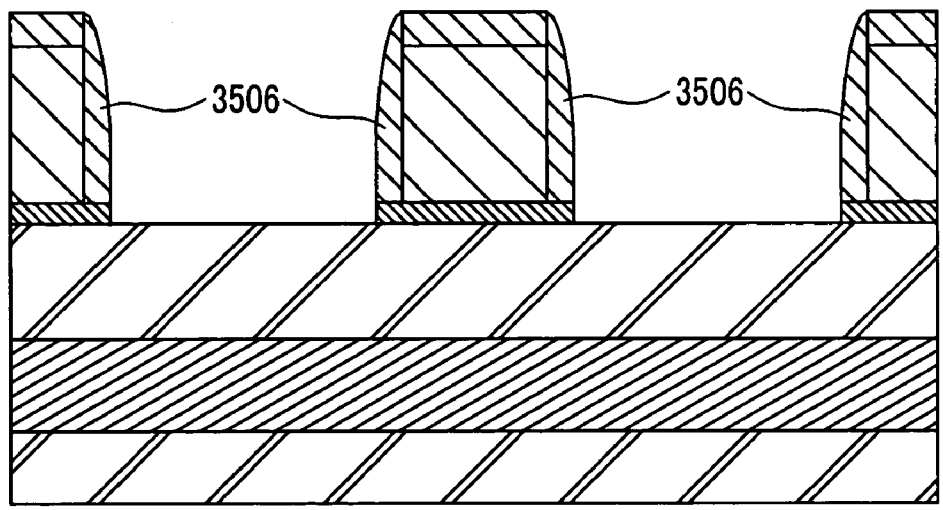
FIG. 54 is a cross-sectional view in a plane parallel with the word lines for illustrating the process of fabricating the semiconductor memory device according to Embodiment 4.
Figure 55:
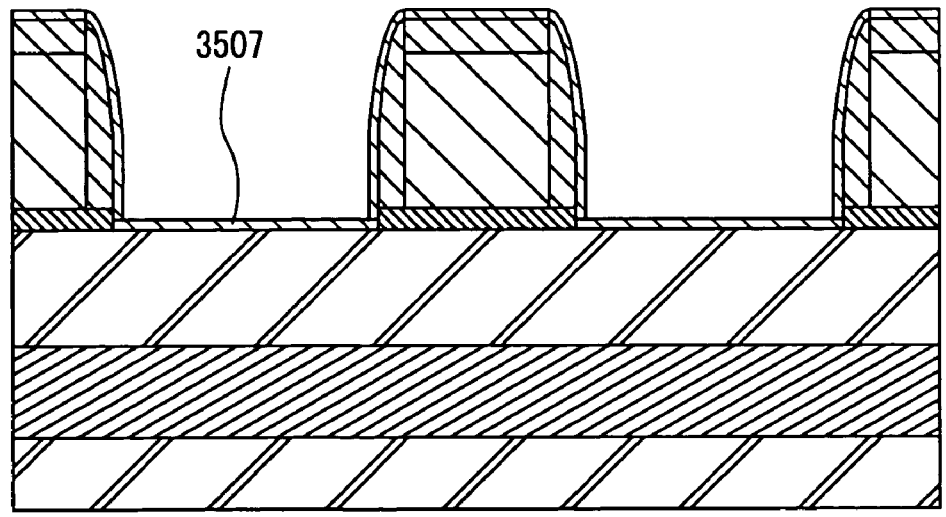
FIG. 55 is a cross-sectional view in a plane parallel with the word lines for illustrating the process of fabricating the semiconductor memory device according to Embodiment 4.
Figure 56:
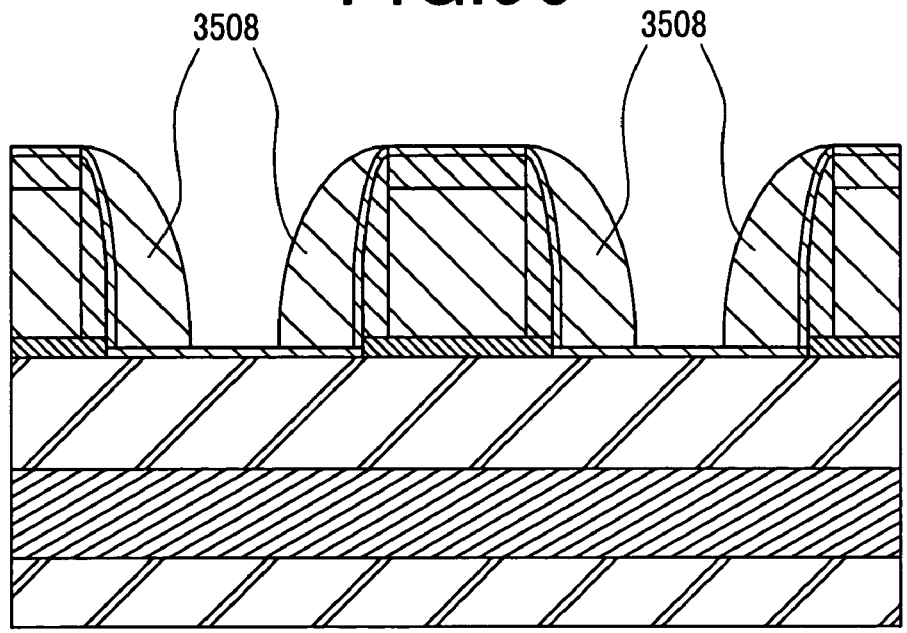
FIG. 56 is a cross-sectional view in a plane parallel with the word lines for illustrating the process of fabricating the semiconductor memory device according to Embodiment 4.
Figure 57:
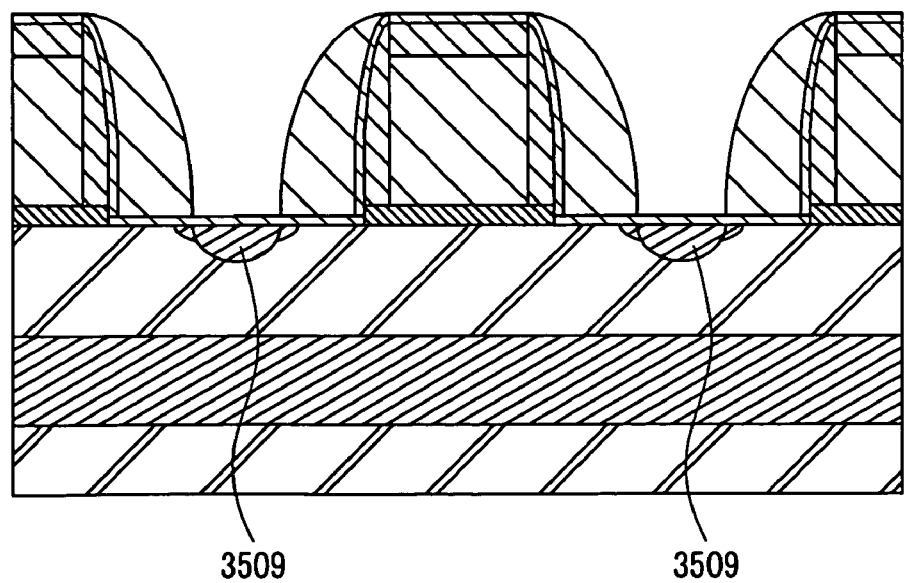
FIG. 57 is a cross-sectional view in a plane parallel with the word lines for illustrating the process of fabricating the semiconductor memory device according to Embodiment 4.
Figure 58:
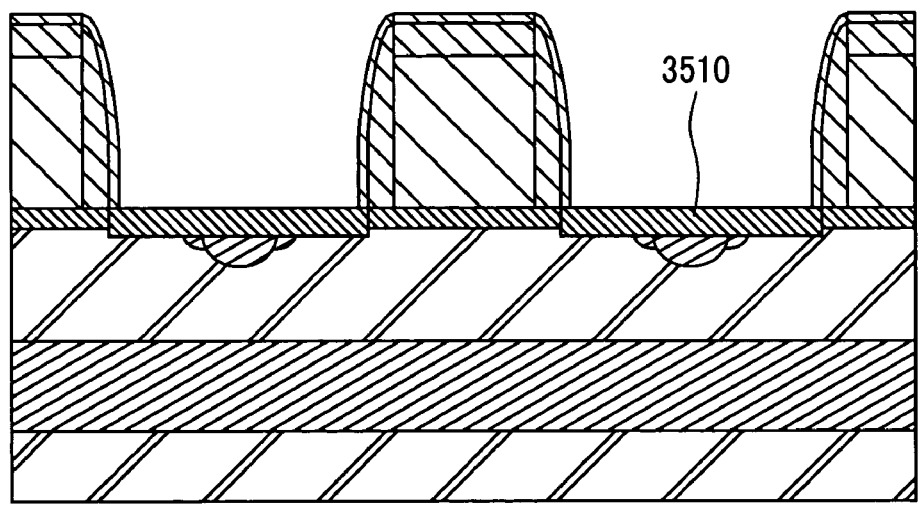
FIG. 58 is a cross-sectional view in a plane parallel with the word lines for illustrating the process of fabricating the semiconductor memory device according to Embodiment 4.
Figure 59:
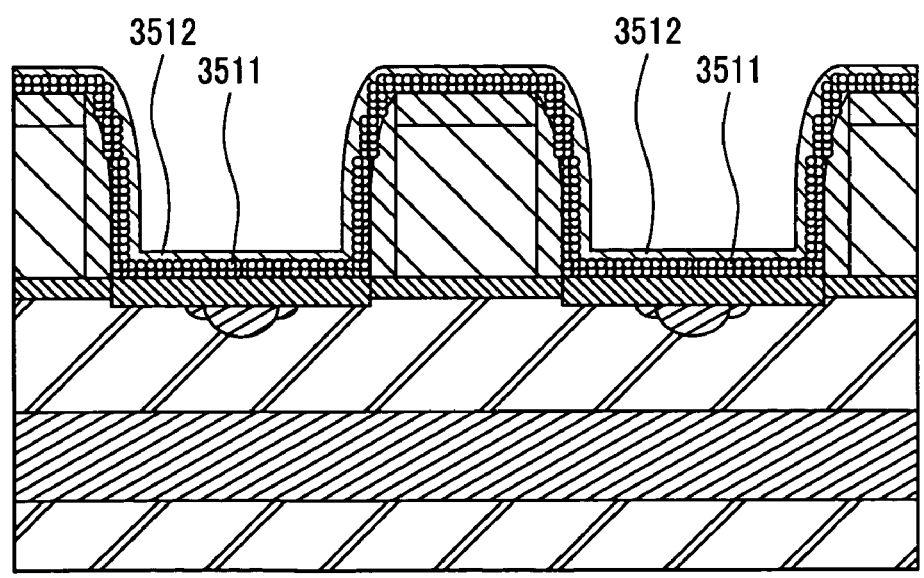
FIG. 59 is a cross-sectional view in a plane parallel with the word lines for illustrating the process of fabricating the semiconductor memory device according to Embodiment 4.
Figure 60:
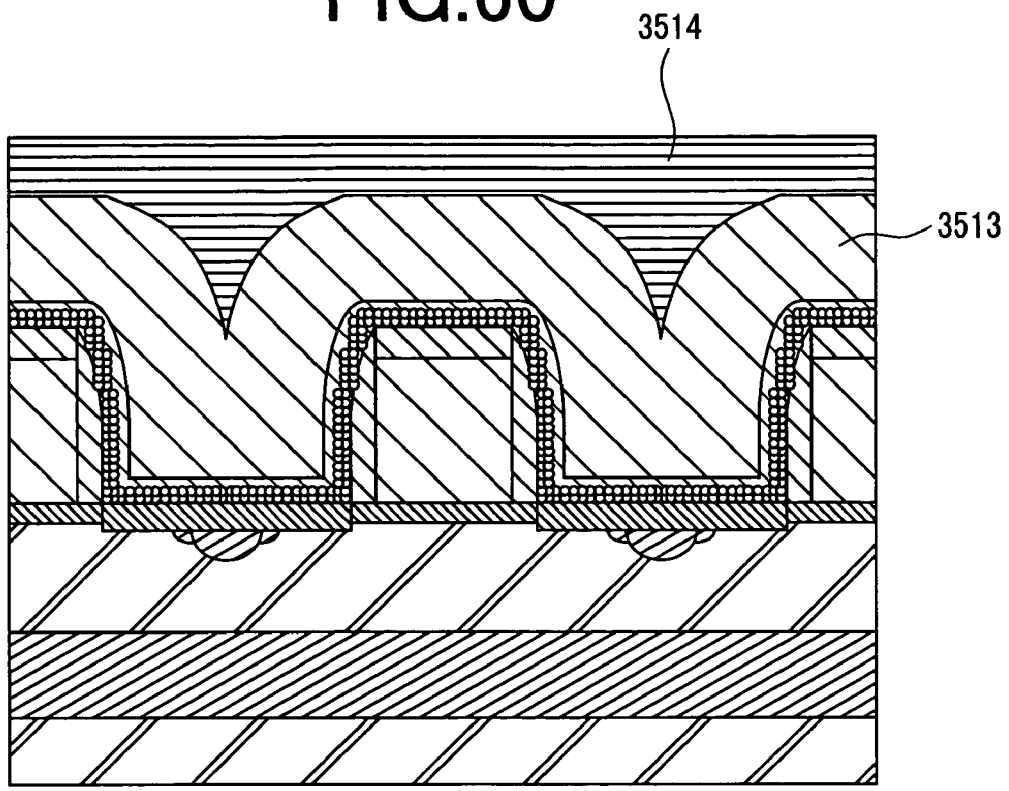
FIG. 60 is a cross-sectional view in a plane parallel with the word lines for illustrating the process of fabricating the semiconductor memory device according to Embodiment 4.
Figure 61:
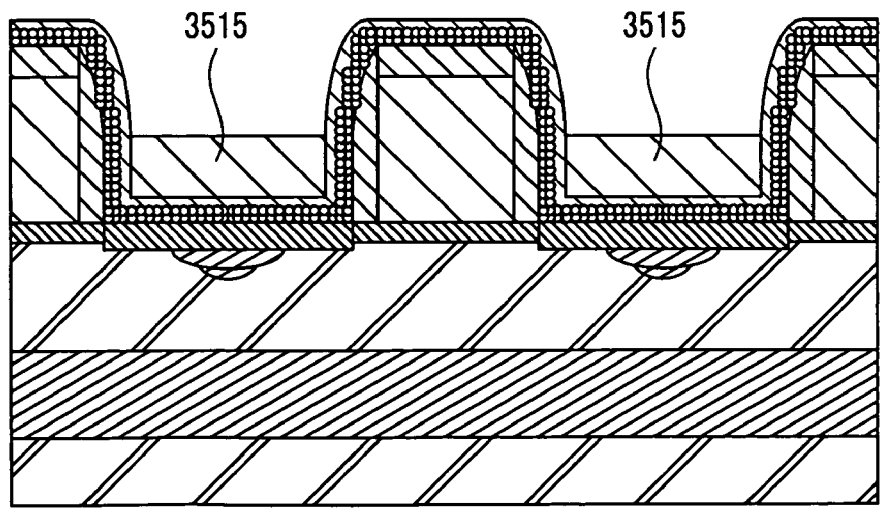
FIG. 61 is a cross-sectional view in a plane parallel with the word lines for illustrating the process of fabricating the semiconductor memory device according to Embodiment 4.
Figure 62:
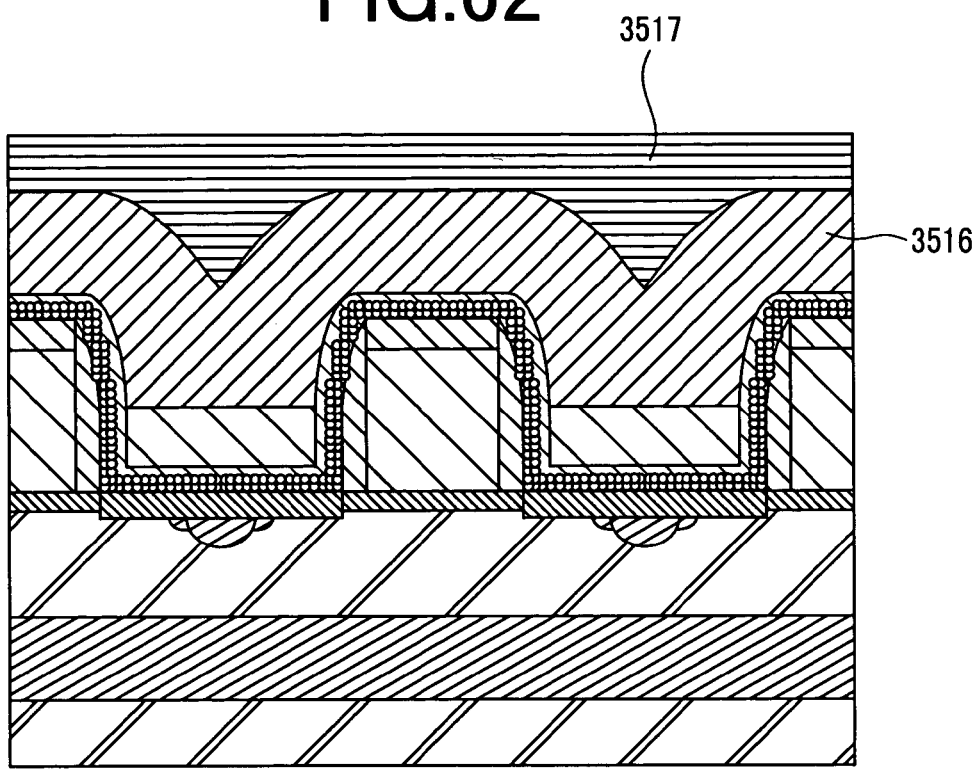
FIG. 62 is a cross-sectional view in a plane parallel with the word lines for illustrating the process of fabricating the semiconductor memory device according to Embodiment 4.
Figure 63:
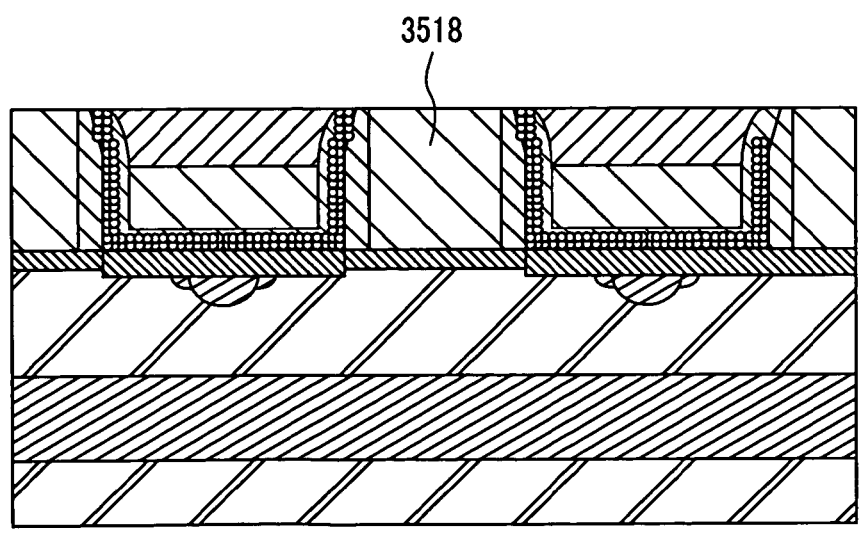
FIG. 63 is a cross-sectional view in a plane parallel with the word lines for illustrating the process of fabricating the semiconductor memory device according to Embodiment 4.
Figure 64:
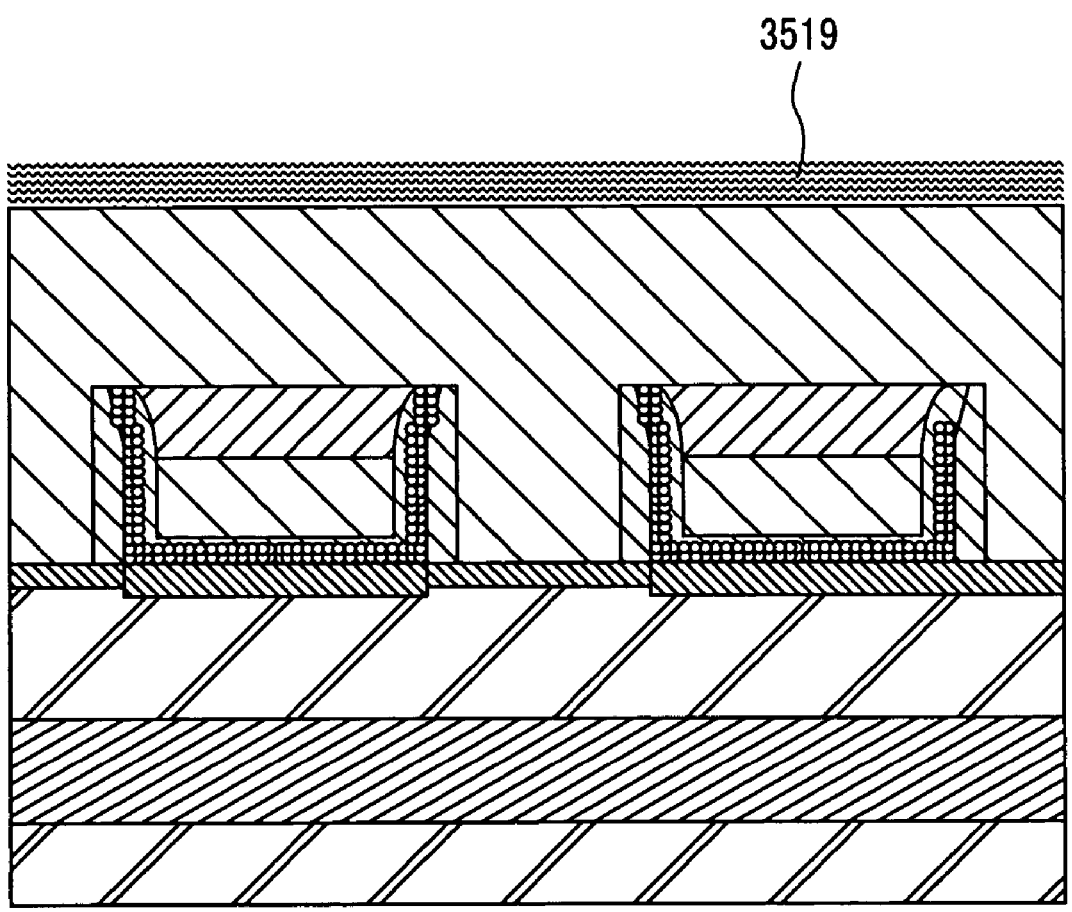
FIG. 64 is a cross-sectional view in a plane parallel with the word lines for illustrating the process of fabricating the semiconductor memory device according to Embodiment 4.

FIG. 51 is an equivalent circuit diagram of a semiconductor memory device in which a plurality of the semiconductor memory elements according to the present embodiment are arranged. Although the semiconductor memory device is actually composed of numerous memory elements, the equivalent circuit of the memory device shown herein is composed of 5×3 memory elements for purposes of illustration. Local bit lines 3401, 3402, 3403, 3404, 3405, and 3406 provide connections between the respective source regions or drain regions of the plurality of semiconductor memory elements at the respective diffusions thereof. Global bit lines 3413, 3414, 3415, 3416, 3417, and 3418 extending in directions parallel with the local bit lines are connected to these local bit lines via respective select transistors 3407, 3408, 3409, 3410, 3411, and 3412, respectively. A source line 3425 extending in a direction perpendicular to the local bit lines is also connected to the local bit lines via select transistors 3419, 3420, 3421, 3422, 3423, and 3424. Word lines 3426, 3427, and 3428 provide connections between the respective control gates of the memory elements in directions orthogonal to the local bit lines. Assist gate lines 3429, 3430, 3431, 3432, 3433, and 3434 provide connections between the respective assist gates of the memory elements in directions parallel with the local bit lines. A first select line 3435 provides connections between the respective gate electrodes of the select transistors connecting the odd-numbered local bit lines indicated by the select transistors 3407, 3409, and 3411 to the corresponding global bit lines in a direction orthogonal to the local bit lines. A second select line 3436 provides connections between the respective gate electrodes of the select transistors connecting the even-numbered local bit lines indicated by the select transistors 3408, 3410, and 3412 to the corresponding global bit lines in a direction orthogonal to the local bit lines. A third select line 3437 provides connections between the respective gate electrodes of the select transistors connecting the odd-numbered local bit lines indicated by the select transistors 3419, 3421, and 3423 to the source line in a direction orthogonal to the local bit lines connected thereto. A fourth select line 3438 provides connections between the respective gate electrodes of the select transistors connecting the individual even-numbered local bit lines indicated by the select transistors 3420, 3422, and 3424 to the source line in a direction orthogonal to the local bit lines connected thereto. The n-th (where n is a multiple of 4) assist gate lines denoted by 3429 and 3433 are tied with the line 3439. Likewise, the (n+1)-th assist gate lines denoted by 3330 and 3434 are tied with the line 3440, the (n+2)-th assist gate line denoted by 3431 is tied with the line 3441, and the (n+3)-th assist gate line denoted by 3432 is tied with the line 3442.

A fabrication process according to the present embodiment will be described with reference to FIGS. 52 to 64. After a triple well is formed in a silicon substrate by ion implantation, B ions are implanted into a p-type well 3501. A gate dioxide film 3502 for the control gates is formed by oxidizing the substrate surface, followed by a polysilicon thin film 3503 doped with phosphorus and a silicon dioxide thin film 3504 deposited thereon. The silicon dioxide thin film and the polysilicon thin film are processed by photolithography and dry etching to form the control gates 3505. Then, a silicon dioxide thin film is deposited and etched back to form sidewall structures 3506. For the determination of an etching end point, a silicon dioxide thin film 3507 and a polysilicon thin film doped with phosphorus are deposited successively and etched back, whereby sidewall structures 3508 composed of polysilicon are formed. By using the sidewall structures 3508 as a mask, arsenic ions are implanted into the substrate from directions vertical to the substrate and from directions tilted at 60 degrees with respect to the substrate so that diffusions 3509 are formed. Thereafter, dry etching of silicon is performed under conditions which exhibit a high selectivity to silicon dioxide, thereby removing the polysilicon sidewalls 3508. After a cleaning process using hydrogen fluoride, an oxide film 3510 is formed by thermal oxidation. Subsequently, extremely fine silicon grains 3511, a silicon dioxide thin film 3512, and a polysilicon thin film 3513 are deposited. After a planarizing film 3514 composed of a photoresist, spin-on glass, or the like is coated, dry etching is performed under conditions under which the planarizing film 3514 and polysilicon are etched at equal speeds, thereby forming assist gate electrodes 3515. Then, a silicon nitride thin film 3516 is deposited and a planarizing film 3517 composed of a photoresist, spin-on glass, or the like is coated again for planarization. Thereafter, an etch-back process is performed by dry etching to expose a polysilicon 3518 forming the control gates. Then, a polysilicon thin film is deposited and the control gates are connected between the individual adjacent memory elements. Subsequently, a tungsten silicide 3519 is deposited and control gate electrodes are formed through a combined process of photolithography and dry etching. Thereafter, an interconnecting step is performed.

Figure 65:
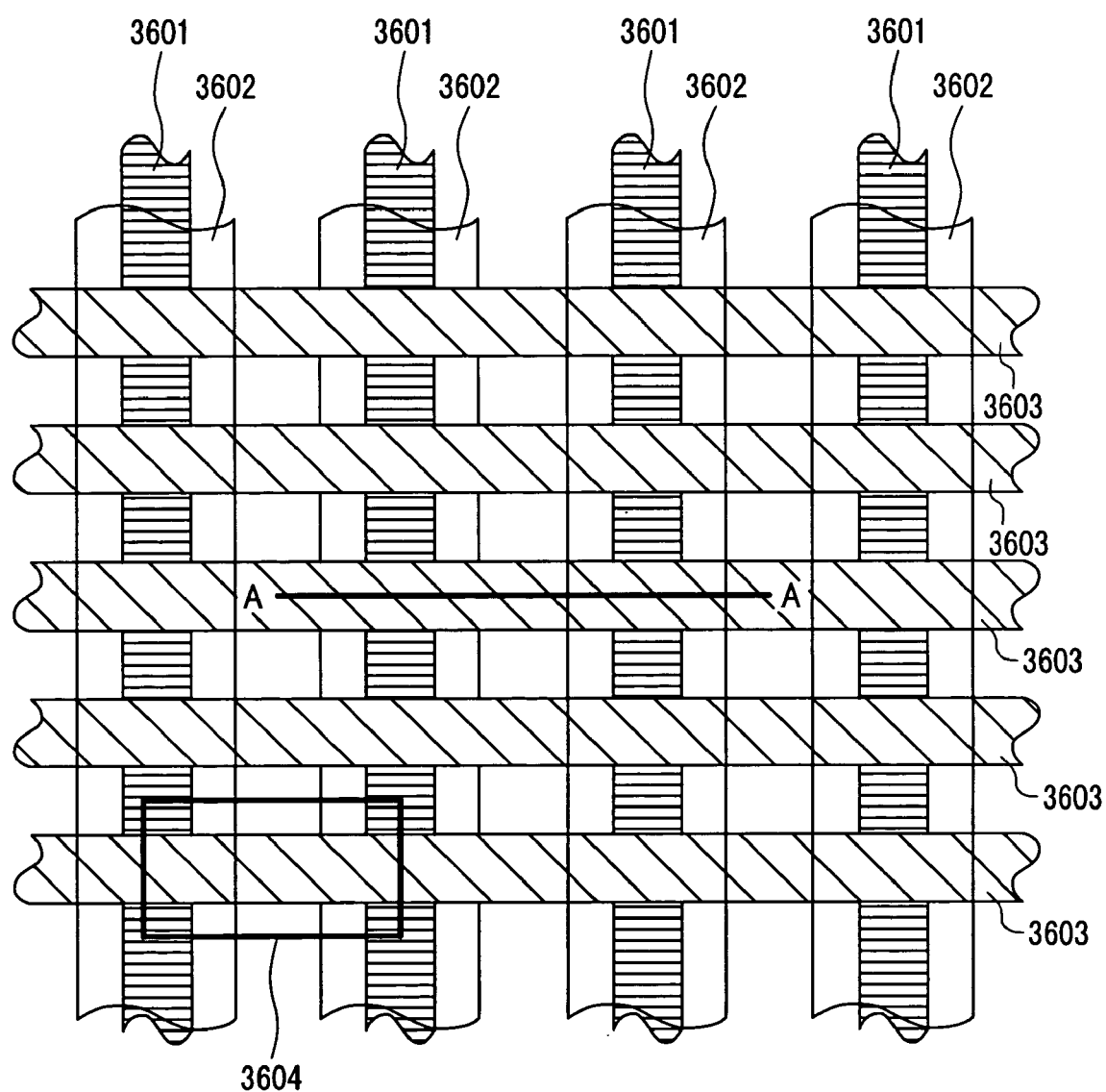
FIG. 65 is a plan view of the semiconductor memory device according to Embodiment 4.

FIG. 65 is a plan view of the semiconductor device according to the present embodiment. Assist gate lines 3602 composed of polysilicon extend in parallel and overlapping relation with local bit lines 3601 composed of the diffusions. Word lines 3603 composed of polysilicon extend in directions orthogonal to the local bit lines 3601 and the assist gate lines 3602. A cross-sectional view taken along the line A—A in FIG. 65 corresponds to FIG. 48. A minimum unit is a structure denoted by 3604 and, if a minimum feature size is F, the area thereof becomes $6F^2$ or less.

Figure 66:
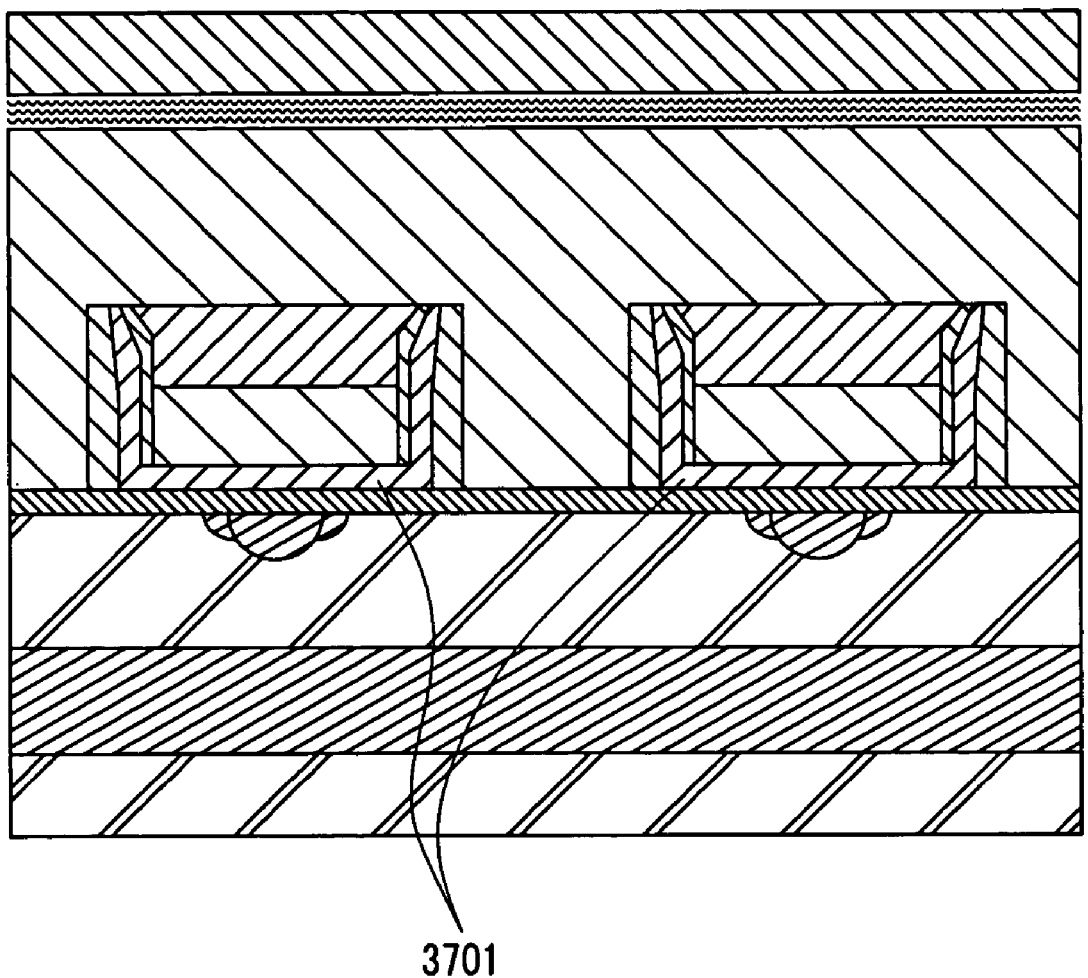
FIG. 66 is a cross-sectional view of the semiconductor memory element according to Embodiment 4 in which charge storage regions are composed of silicon nitride.
Figure 67:
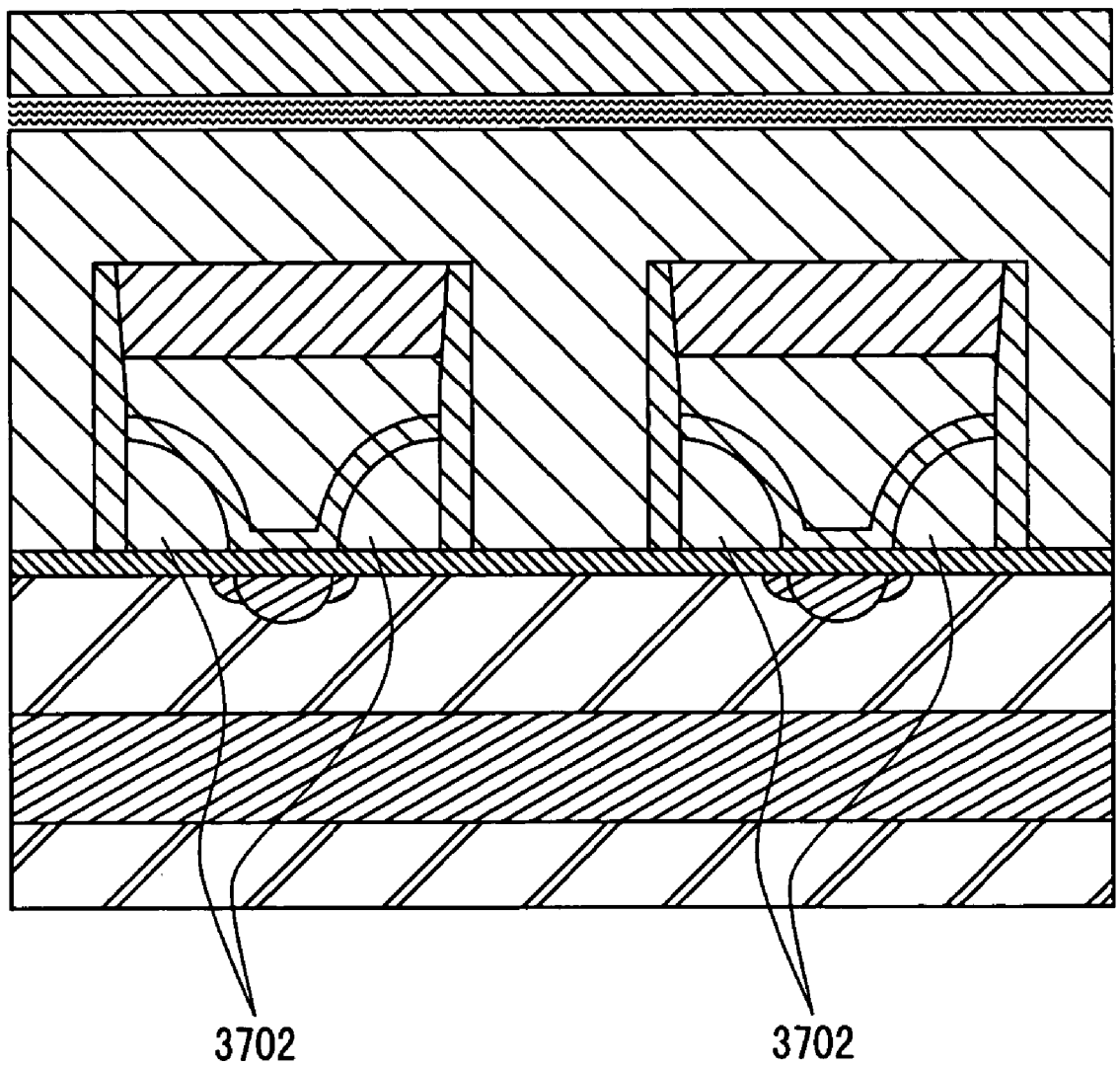
FIG. 67 is a cross-sectional view of the semiconductor memory element according to Embodiment 4 in which the charge storage regions are composed of polysilicon.

The multi-bit technology which enables storage of binary or higher-order information in each of the cells of the memory elements and characterizes the present embodiment is realized by dispersively storing charges in spatially divided regions such as the insulated silicon grains. Therefore, the technology can also be realized if the charge storage regions are composed of a silicon nitride film 3701 having charge trap sites therein, as shown in FIG. 66. Since the use of the silicon nitride film achieves a reduction in the film thickness of the charge storage region, it has advantages of reduced fabrication steps using photolithography and the like over the use of the plurality of silicon grains. Instead of the silicon nitride film, it is also possible to use a silicon oxynitride film similarly capable of trapping charges. The same effects are also achievable by using floating gates 3702 composed of polysilicon, as shown in FIG. 67. In the case of using the floating gates composed of polysilicon, it is possible to provide intensified capacitive coupling between the floating gates, an assist gate electrode, and a control gate electrode so that the advantages of lower-voltage write, read, and erase operations are offered.

The present invention provides a semiconductor memory element capable of storing 4 bits in one element and therefore suitable for larger-capacity storage. The present invention also provides a semiconductor memory device capable of performing a high-speed write operation by reducing a leakage current in each of elements without reducing a recording density. The present invention also provides a method for implementing a large-capacity memory device by using such an element.

What is claimed is:
1. A semiconductor memory element comprising:
   a well region having a first conductivity type and formed in a principal surface of a semiconductor substrate;
   source and drain regions each having a second conductivity type and formed in said well region to have a specified distance therebetween;
   first and second gates and first and second charge storage regions formed, via a first insulating film, on a portion of the principal surface of said semiconductor substrate between said source and drain regions; and
   a third gate formed over said first and second charge storage regions via a second insulating film, said first and second charge storage regions being provided between said first and second gates,
   wherein each of said first and second charge storage regions has a layer composed of stacked semiconductor nano-crystals.

2. The semiconductor memory element of claim 1, wherein said nano-crystals are silicon nano-crystals.

3. The semiconductor memory element of claim 2, wherein said nano-crystals are insulated from each other.

4. The semiconductor memory element of claim 3 wherein said nano-crystals are oxidized.

5. The semiconductor memory element of claim 3, wherein said nano-crystals are nitrided.

6. The semiconductor memory element of claim 1, wherein said nano-crystals are insulated from each other.

7. The semiconductor memory element of claim 6, wherein said nano-crystals are oxidized.

8. The semiconductor memory element of claim 6, wherein said nano-crystals are nitrided.

9. A semiconductor memory element comprising:
a well region having a first conductivity type and formed in a principal surface of a semiconductor substrate;
source and drain regions each having a second conductivity type and formed in said well region to have a specified distance therebetween;
first and second gates and first and second charge storage regions formed, via a first insulating film, on a portion of the principal surface of said semiconductor substrate between said source and drain regions; and
a third gate formed over said first and second a charge storage regions via a second insulating film, said first and second charge storage regions being provided between said first and second gates,
wherein each of said first and second charge storage regions has a respective floating gate composed of polysilicon.

* * * * *